(12) United States Patent
Takizawa

(10) Patent No.: US 9,755,160 B2
(45) Date of Patent: Sep. 5, 2017

(54) THIN FILM TRANSISTOR

(71) Applicant: FUJIFILM Corporation, Tokyo (JP)

(72) Inventor: Hiroo Takizawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/236,914

(22) Filed: Aug. 15, 2016

(65) Prior Publication Data

US 2016/0351824 A1    Dec. 1, 2016

Related U.S. Application Data

(63) Continuation of application No. PCT/JP2015/055704, filed on Feb. 26, 2015.

(30) Foreign Application Priority Data

Mar. 7, 2014  (JP) .................. 2014-045168

(51) Int. Cl.
    *H01L 51/00*  (2006.01)
    *H01L 51/05*  (2006.01)
    (Continued)

(52) U.S. Cl.
    CPC ...... *H01L 51/0071* (2013.01); *H01L 51/0035* (2013.01); *H01L 51/0094* (2013.01); *H01L 51/052* (2013.01); *H01L 51/0516* (2013.01); *H01L 29/786* (2013.01); *H01L 51/0073* (2013.01); *H01L 51/0074* (2013.01);
    (Continued)

(58) Field of Classification Search
    CPC ............. H01L 51/0035; H01L 51/0071; H01L 51/0094; H01L 51/0516; H01L 51/052
    See application file for complete search history.

(56) References Cited

U.S. PATENT DOCUMENTS

| 2008/0111128 A1* | 5/2008 | Hahn ................. H01L 51/052 257/40 |
| 2012/0161110 A1 | 6/2012 | Wu et al. |
| 2015/0188063 A1* | 7/2015 | Takeya ............. H01L 51/0554 257/40 |

FOREIGN PATENT DOCUMENTS

| EP | 2259289 A1 | 12/2010 |
| JP | 2006-303465 A | 11/2006 |

(Continued)

OTHER PUBLICATIONS

English translation of JP2012119423A (Original document filed as IDS).*

(Continued)

*Primary Examiner* — Christine Enad
(74) *Attorney, Agent, or Firm* — Studebaker & Brackett PC

(57) ABSTRACT

Provided is a thin film transistor including a gate electrode, a semiconductor layer, a gate insulating layer provided between the gate electrode and the semiconductor layer and formed of an organic polymer compound, and a source electrode and a drain electrode provided in contact with the semiconductor layer and connected via the semiconductor layer, on a substrate, in which the content of metals selected from Mg, Ca, Ba, Al, Sn, Pb, Cr, Mn, Fe, Ni, Cu, Zn, and Ag in the gate insulating layer is 10 ppb to 1 ppm in terms of total amount, or the content of non-metal ionic materials selected from halogen ions, sulfate ions, nitrate ions, and phosphate ions is 1 ppm to 100 ppm in terms of total amount.

9 Claims, 1 Drawing Sheet

(51) Int. Cl.
  *H01L 29/786* (2006.01)
  *H01L 51/10* (2006.01)
(52) U.S. Cl.
  CPC ...... *H01L 51/0545* (2013.01); *H01L 51/0558* (2013.01); *H01L 51/105* (2013.01); *H01L 2251/301* (2013.01)

(56) References Cited

FOREIGN PATENT DOCUMENTS

| JP | 2012-119423 A | 6/2012 |
| WO | 2007/023612 A1 | 3/2007 |
| WO | 2014/034392 A1 | 3/2014 |

OTHER PUBLICATIONS

International Search Report of PCT/JP2015/055704 mailed May 19, 2015.
Written Opinion of PCT/JP2015/055704 mailed May 19, 2015.
The extended European search report issued by the European Patent Office on Feb. 22, 2017, which corresponds to European Patent Application No. 15758615.7 - 1552 and is related to U.S. Appl. No. 15/236,914.
Peng Gao et al.; "Benzo[1,2-b:4,5-b']bis[b]benzothiophene as solution processible organic semiconductor for field-effect transistors"; Chemical Communication; 2008; pp. 1548-1550.

\* cited by examiner

THIN FILM TRANSISTOR

CROSS-REFERENCE TO RELATED APPLICATIONS

This application is a Continuation of PCT International Application No. PCT/JP2015/055704 filed on Feb. 26, 2015, which claims priority under 35 U.S.C. §119 (a) to Japanese Patent Application No. 2014-045168 filed on Mar. 7, 2014. The above application is hereby expressly incorporated by reference, in its entirety, into the present application.

BACKGROUND OF THE INVENTION

1. Field of the Invention

The present invention relates to a thin film transistor.

2. Description of the Related Art

Most of display units such as a liquid crystal display, an organic EL display, and an electrophoretic type display are provided with a thin film transistor (hereinafter, also referred to as "TFT") as a display switching device therein. The TFT has a structure including a gate electrode, a semiconductor layer, and a gate insulating layer provided between the gate electrode and the semiconductor layer on a substrate, and is also provided with a source electrode and a drain electrode in contact with the semiconductor layer. The TFT is driven by applying a voltage to the gate electrode. A driving principle of the FET is to control an amount of carriers consisting of electrons or holes in a semiconductor by applying a voltage to the gate electrode and thereby control an electric current flowing between the source electrode and the drain electrode.

An inorganic semiconductor such as amorphous or polycrystalline thin film silicon has been conventionally used as a semiconductor for TFTs. In the case where a semiconductor layer of TFTs is formed of an inorganic semiconductor, a vacuum process and a high temperature process at 300° C. or higher are required and therefore there is a limitation on improvement of productivity.

To cope with this, TFTs using an organic semiconductor also have recently become popular. Because an organic semiconductor layer can be formed into a film by a method such as an ink jet method, a spin coating method, or a flexographic printing method, a film forming process can be performed at a lower temperature, at high speed with efficiency, and at low cost.

Most of TFTs using an organic semiconductor in the semiconductor layer use silicon oxide obtained by thermal oxidation of silicon as a gate insulating layer. In the case of using a silicon oxide film, a silicon oxide film surface is typically treated with hexamethyldisilazane (HMDS), octadecyltrichlorosilane (OTS), or the like to render the surface water-repellent, in order to allow the carrier conducting performance of an organic semiconductor to be formed on the silicon oxide film to be sufficiently exhibited. Since hydroxyl groups of the silicon oxide film surface are quenched and further, the surface energy of the gate insulating film is lowered to improve crystallinity of the semiconductor by such a surface treatment, the carrier mobility is improved. However, there is a case where HMDS and OTS aggregate or polymerize on the surface of the gate insulating film. If that is the case, it becomes difficult for the semiconductor to grow into a crystal, and therefore sufficient carrier mobility is not obtained.

Further, a TFT where the gate insulating film is formed of an organic polymer compound is also known. For example, JP2006-303465A discloses a TFT where a gate insulating layer is formed of a cured product formed by using a resin and a crosslinking agent. JP2006-303465A discloses that it is desirable to prevent contamination of an organic semiconductor layer by reducing the content of an alkali metal in the gate insulating layer and additionally that an amount of sodium is preferably set to 20 ppm or less.

SUMMARY OF THE INVENTION

An object of the present invention is to provide a thin film transistor which achieves both of excellent carrier mobility and having an excellent current amplification factor, is thus capable of more rapidly and securely performing a switching operation, and also has a low threshold voltage to thereby reduce power consumption of the transistor.

The present inventors have conducted extensive studies in view of the above problems. As a result, it has been found that an excellent current amplification factor (On/Off ratio) is exhibited, a threshold voltage, which usually shows a positive correlation with a current amplification factor, is unexpectedly kept low, and carrier mobility is also improved in a thin film transistor containing an organic polymer compound in a gate insulating layer, when an amount of specific metals or specific non-metal ionic materials contained in the gate insulating layer is set to be within a specific range. The present invention has been completed based on these findings.

The above object has been achieved by the following means.

[1] A thin film transistor comprising a gate electrode, a semiconductor layer, a gate insulating layer provided between the gate electrode and the semiconductor layer and formed of an organic polymer compound, and a source electrode and a drain electrode provided in contact with the semiconductor layer and connected via the semiconductor layer, on a substrate, in which the content of metals selected from Mg, Ca, Ba, Al, Sn, Pb, Cr, Mn, Fe, Ni, Cu. Zn, and Ag in the gate insulating layer is 10 ppb to 1 ppm in terms of total amount, or the content of non-metal ionic materials selected from halogen ions, sulfate ions, nitrate ions, and phosphate ions is 1 ppm to 100 ppm in terms of total amount.

[2] The thin film transistor according to [1], in which the content of metals selected from Mg, Ca, Ba, Al, Sn, Pb, Cr, Mn, Fe, Ni, Cu, Zn, and Ag in the gate insulating layer is 10 ppb to 1 ppm in terms of total amount, and the content of non-metal ionic materials selected from halogen ions, sulfate ions, nitrate ions, and phosphate ions is 1 ppm to 100 ppm in terms of total amount.

[3] The thin film transistor according to [1] or [2], in which the content of metals selected from Mg, Ca, Al, Cr, Fe, and Zn in the gate insulating layer is 10 ppb to 1 ppm in terms of total amount.

[4] The thin film transistor according to any one of [1] to [3], in which the content of non-metal ionic materials selected from chlorine ions, sulfate ions, nitrate ions, and phosphate ions in the gate insulating layer is 1 ppm to 100 ppm in terms of total amount.

[5] The thin film transistor according to any one of [1] to [4], in which the content of non-metal ionic materials selected from chlorine ions and sulfate ions in the gate insulating layer is 1 ppm to 100 ppm in terms of total amount.

[6] The thin film transistor according to any one of [1] to [5], in which the organic polymer compound is an organic polymer compound selected from polyvinylphenol, a novolak resin, polystyrene, poly(meth)acrylate, an epoxy resin, an epoxy(meth)acrylate resin, polyvinyl alcohol, a fluororesin, polycycloolefin, polysilsesquioxane, polysiloxane, polyester, polyether sulfone, polyether ketone, and polyimide.

[7] The thin film transistor according to any one of [1] to [6], in which the semiconductor layer includes an organic semiconductor.

[8] The thin film transistor according to [7], in which the organic semiconductor is represented by any one of the following General Formulae (C) to (T).

General Formula (C)
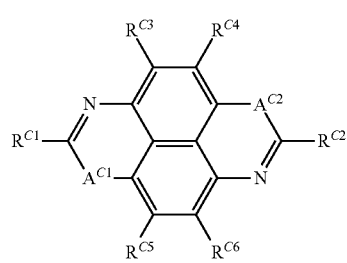

General Formula (D)
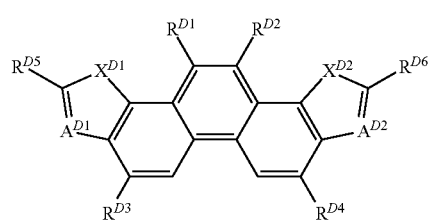

General Formula (E)
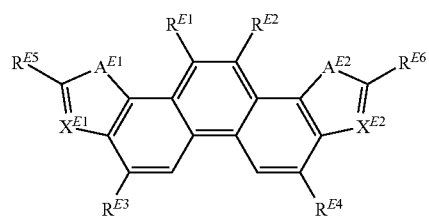

General Formula (F)
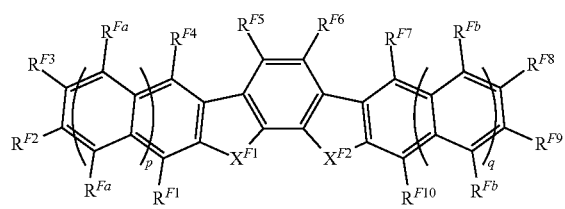

General Formula (G)
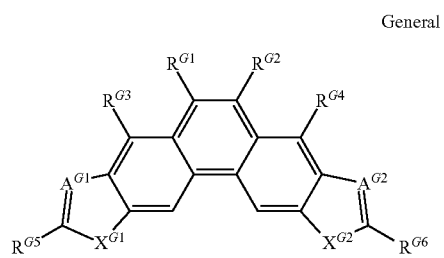

General Formula (H)
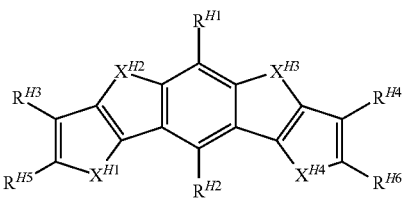

General Formula (J)
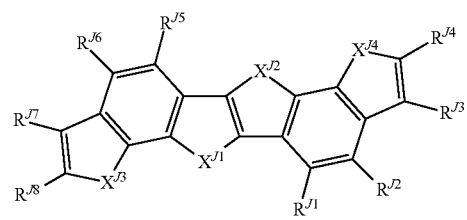

General Formula (K)
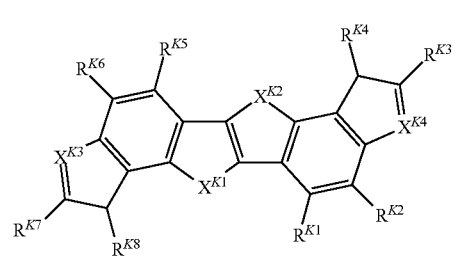

General Formula (L)
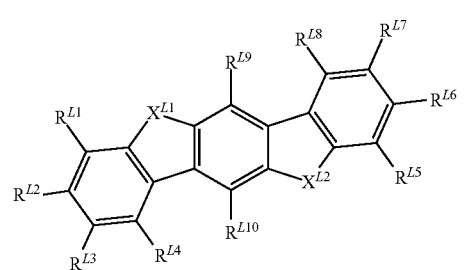

General Formula (M)
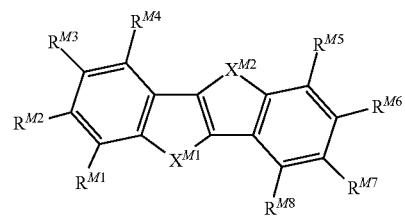

General Formula (N)
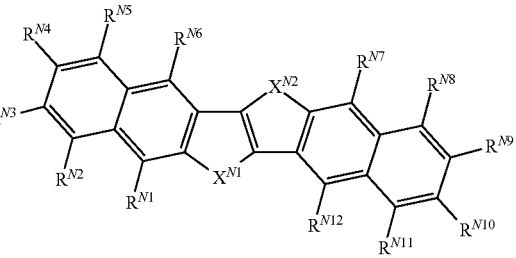

-continued

General Formula (P)

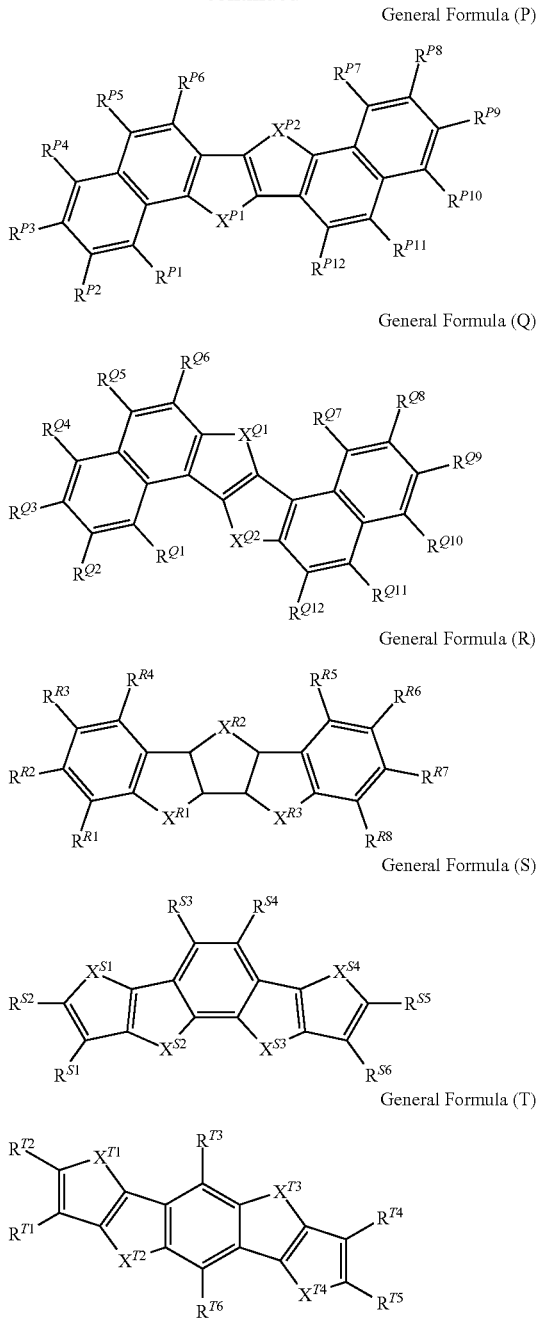

General Formula (Q)

General Formula (R)

General Formula (S)

General Formula (T)

In General Formula (C), $A^{C1}$ and $A^{C2}$ represent an oxygen atom, a sulfur atom, or a selenium atom. $R^{C1}$ to $R^{C2}$ represent a hydrogen atom or a substituent, and at least one of $R^{C1}$, $R^{C2}$, $R^{C3}$, $R^{C4}$, $R^{C5}$, or $R^{C6}$ is a substituent represented by the following General Formula (W).

In General Formula (D), $X^{D1}$ and $X^{D2}$ represent $NR^{D9}$, an oxygen atom, or a sulfur atom. $A^{D1}$ represents $CR^{D7}$ or a nitrogen atom, $A^{D2}$ represents $CR^{D8}$ or a nitrogen atom, and $R^{D9}$ represents a hydrogen atom, an alkyl group, an alkenyl group, an alkynyl group, or an acyl group. $R^{D1}$ to $R^{D8}$ represent a hydrogen atom or a substituent, and at least one of $R^{D1}$, $R^{D2}$, $R^{D3}$, $R^{D4}$, $R^{D5}$, $R^{D6}$, $R^{D7}$, or $R^{D8}$ is a substituent represented by the following General Formula (W).

In General Formula (E), $X^{E1}$ and $X^{E2}$ represent an oxygen atom, a sulfur atom, or $NR^{E7}$. $A^{E1}$ and $A^{E2}$ represent $CR^{E8}$ or a nitrogen atom. $R^{E1}$ to $R^{E8}$ represent a hydrogen atom or a substituent, and at least one of $R^{E1}$, $R^{E2}$, $R^{E3}$, $R^{E4}$, $R^{E5}$, $R^{E6}$, $R^{E7}$, or $R^{E8}$ is a substituent represented by the following General Formula (W).

In General Formula (F), $X^{F1}$ and $X^{F2}$ represent an oxygen atom, a sulfur atom, or a selenium atom. $R^{F1}$ to $R^{F10}$, $R^{Fa}$ and $R^{Fb}$ represent a hydrogen atom or a substituent, and at least one of $R^{F1}$ to $R^{F10}$, $R^{Fa}$, or $R^{Fb}$ is a substituent represented by General Formula (W). p and q represent an integer of 0 to 2.

In General Formula (G), $X^{G1}$ and $X^{G2}$ represent $NR^{G9}$, an oxygen atom, or a sulfur atom. $A^{G1}$ represents $CR^{G7}$ or a nitrogen atom, and $A^{G2}$ represents $CR^{G8}$ or a nitrogen atom. $R^{G9}$ represents a hydrogen atom, an alkyl group, an alkenyl group, an alkynyl group, an acyl group, an aryl group, or a heteroaryl group. $R^{G1}$ to $R^{G8}$ represent a hydrogen atom or a substituent, and at least one of $R^{G1}$, $R^{G2}$, $R^{G3}$, $R^{G4}$, $R^{G5}$, $R^{G6}$, $R^{G7}$, or $R^{G8}$ is a substituent represented by the following General Formula (W).

In General Formula (H), $X^{H1}$ to $X^{H4}$ represent $NR^{H7}$, an oxygen atom, or a sulfur atom, and $R^{H7}$ represents a hydrogen atom, an alkyl group, an alkenyl group, an alkynyl group, an acyl group, an aryl group, or a heteroaryl group. $R^{H1}$ to $R^{H6}$ represent a hydrogen atom or a substituent, and at least one of $R^{H1}$, $R^{H2}$, $R^{H3}$, $R^{H4}$, $R^{H5}$, or $R^{H6}$ is a substituent represented by the following General Formula (W).

In General Formula (J), $X^{J1}$ and $X^{J2}$ represent an oxygen atom, a sulfur atom, a selenium atom, or $NR^{J9}$. $X^{J3}$ and $X^{J4}$ represent an oxygen atom, a sulfur atom, or a selenium atom. $R^{J1}$ to $R^{J9}$ represent a hydrogen atom or a substituent, and at least one of $R^{J1}$, $R^{J2}$, $R^{J3}$, $R^{J4}$, $R^{J5}$, $R^{J6}$, $R^{J7}$, $R^{J8}$, or $R^{J9}$ is a substituent represented by the following General Formula (W).

In General Formula (K), $X^{K1}$ and $X^{K2}$ represent an oxygen atom, a sulfur atom or $NR^{K9}$. $X^{K3}$ and $X^{K4}$ represent an oxygen atom, a sulfur atom, or a selenium atom. $R^{K1}$ to $R^{K9}$ represent a hydrogen atom or a substituent, and at least one of $R^{K1}$, $R^{K2}$, $R^{K3}$, $R^{K4}$, $R^{K5}$, $R^{K6}$, $R^{K7}$, $R^{K8}$, or $R^{K9}$ is a substituent represented by the following General Formula (W).

In General Formula (L), $X^{L1}$ and $X^{L2}$ represent an oxygen atom, a sulfur atom, or $NR^{L11}$. $R^{L1}$ to $R^{L11}$ represent a hydrogen atom or a substituent, and at least one of $R^{L1}$, $R^{L2}$, $R^{L3}$, $R^{L4}$, $R^{L5}$, $R^{L6}$, $R^{L7}$, $R^{L8}$, $R^{L9}$, $R^{L10}$, or $R^{L11}$ is a substituent represented by the following General Formula (W).

In General Formula (M), $X^{M1}$ and $X^{M2}$ represent an oxygen atom, a sulfur atom, a selenium atom, or $NR^{M9}$. $R^{M1}$ to $R^{M9}$ represent a hydrogen atom or a substituent, and at least one of $R^{M1}$, $R^{M2}$, $R^{M3}$, $R^{M4}$, $R^{M5}$, $R^{M6}$, $R^{M7}$, $R^{M8}$, or $R^{M9}$ is a substituent represented by the following General Formula (W).

In General Formula (N), $X^{N1}$ and $X^{N2}$ represent an oxygen atom, a sulfur atom, a selenium atom, or $NR^{N13}$. $R^{N1}$ to $R^{13}$ represent a hydrogen atom or a substituent, and at least one of $R^{N1}$, $R^{N2}$, $R^{N3}$, $R^{N4}$, $R^{N5}$, $R^{N6}$, $R^{N7}$, $R^{N8}$, $R^{N9}$, $R^{N10}$, $R^{N11}$, $R^{N12}$, or $R^{N13}$ is a substituent represented by the following General Formula (W).

In General Formula (P), $X^{P1}$ and $X^{P2}$ represent an oxygen atom, a sulfur atom, a selenium atom, or $NR^{P13}$. $R^{P1}$ to $R^{P13}$ represent a hydrogen atom or a substituent, and at least one of $R^{P1}$, $R^{P2}$, $R^{P3}$, $R^{P4}$, $R^{P5}$, $R^{P6}$, $R^{P7}$, $R^{P8}$, $R^{P9}$, $R^{P10}$, $R^{P11}$, $R^{P12}$, or $R^{P13}$ is a substituent represented by the following General Formula (W).

In General Formula (Q), $X^{Q1}$ and $X^{Q2}$ represent an oxygen atom, a sulfur atom, a selenium atom, or $NR^{Q13}$. $R^{Q1}$ to $R^{Q13}$ represent a hydrogen atom or a substituent, and at least one of $R^{Q1}$, $R^{Q2}$, $R^{Q3}$, $R^{Q4}$, $R^{Q5}$, $R^{Q6}$, $R^{Q7}$, $R^{Q8}$, $R^{Q9}$, $R^{Q10}$, $R^{Q11}$, $R^{Q12}$, or $R^{Q13}$ is a substituent represented by the following General Formula (W).

In General Formula (R), $X^{R1}$, $X^{R2}$, and $X^{R3}$ represent an oxygen atom, a sulfur atom, a selenium atom, or $NR^{R9}$. $R^{R1}$ to $R^{R9}$ represent a hydrogen atom or a substituent, and at least one of $R^{R1}$, $R^{R2}$, $R^{R3}$, $R^{R4}$, $R^{R5}$, $R^{R6}$, $R^{R7}$, $R^{R8}$, or $R^{R9}$ is a substituent represented by the following General Formula (W).

In General Formula (S), $X^{S1}$, $X^{S2}$, $X^{S3}$, and $X^{S4}$ represent an oxygen atom, a sulfur atom, a selenium atom, or $NR^{S7}$. $R^{S1}$ to $R^{S7}$ represent a hydrogen atom or a substituent, and at least one of $R^{S1}$, $R^{S2}$, $R^{S3}$, $R^{S4}$, $R^{S5}$, $R^{S6}$, or $R^{S7}$ is a substituent represented by the following General Formula (W).

In General Formula (T), $X^{T1}$, $X^{T2}$, $X^{T3}$, and $X^{T4}$ represent an oxygen atom, a sulfur atom, a selenium atom, or $NR^{T7}$. $R^{T1}$ to $R^{T7}$ represent a hydrogen atom or a substituent, and at least one of $R^{T1}$, $R^{T2}$, $R^{T3}$, $R^{T4}$, $R^{T5}$, $R^{T6}$, or $R^{T7}$ is a substituent represented by the following General Formula (W).

$$-L-R^w \qquad \text{General Formula (W):}$$

In General Formula (W), L represents a divalent linking group represented by any one of the following General Formulae (L-1) to (L-25) or a divalent linking group in which two or more divalent linking groups represented by any one of the following General Formulae (L-1) to (L-25) are bonded to each other.

$R^w$ represents a substituted or unsubstituted alkyl group, a cyano group, a vinyl group, an ethynyl group, an oxyethylene group, an oligooxyethylene group in which the number v of repeats of oxyethylene units is 2 or more, a siloxane group, an oligosiloxane group in which the number of silicon atoms is 2 or more, or a substituted or unsubstituted trialkylsilyl group.

(L-1)

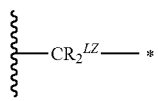

(L-2)

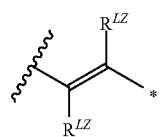

(L-3)

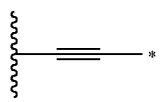

(L-4)

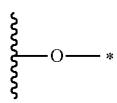

(L-5)

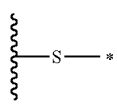

(L-6)

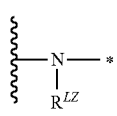

-continued (L-7)

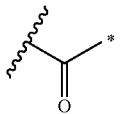

(L-8)

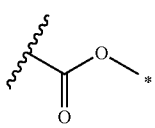

(L-9)

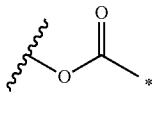

(L-10)

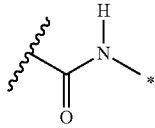

(L-11)

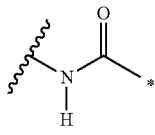

(L-12)

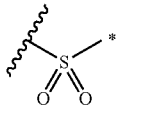

(L-13)

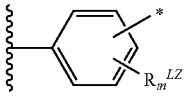

(L-14)

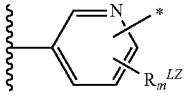

(L-15)

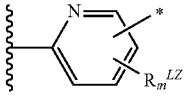

(L-16)

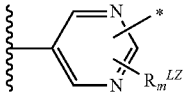

(L-17)

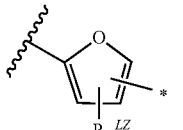

(L-18)

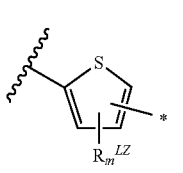

-continued

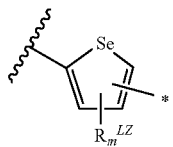
(L-19)

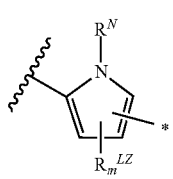
(L-20)

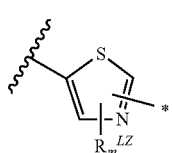
(L-21)

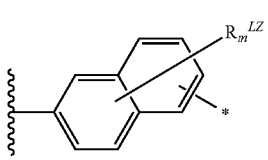
(L-22)

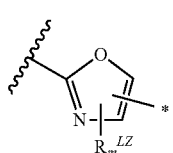
(L-23)

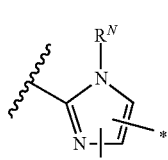
(L-24)

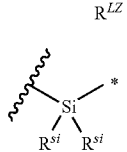
(L-25)

In General Formulae (L-1) to (L-25), the wavy line portion indicates a position of bonding to any one of the rings forming each skeleton represented by the above-described General Formulae (C) to (T). * indicates a position of connecting with $R^w$ or a position of bonding to the wavy line portion of General Formulae (L-1) to (L-25).

m in General Formula (L-13) represents 4, m in General Formulae (L-14) and (L-15) represents 3, m in General Formulae (L-16) to (L-20) represents 2, and m in General Formula (L-22) represents 6.

$R^{LZ}$'s in General Formulae (L-1), (L-2), (L-6), (L-13) to (L-19), and (L-21) to (L-24) each independently represent a hydrogen atom or a substituent.

$R^N$ represents a hydrogen atom or a substituent, and $R^{si}$'s each independently represent a hydrogen atom, an alkyl group, an alkenyl group, or an alkynyl group.

[9] The thin film transistor according to [8], in which the organic semiconductor is represented by any one of General Formulae (C), (F), (J), and (L).

In the description of the present invention, when a substituent or linking group or the like represented by a specific symbol (hereinafter, referred to as a substituent or the like) is present in plural number, or when defining a plurality of substituents or the like simultaneously or alternatively, this means that each substituent or the like may be the same or different from each other. This also applies to the rule of the number of substituents or the like. Further, in the case where there is a repetition of a plurality of partial structures represented by the same expression in the formula, each partial structure or repeating unit may be the same or different. In addition, unless otherwise specified, when a plurality of substituents or the like are close (especially adjacent), this means that they may be connected or fused to each other to form a ring.

The expression of a compound (including a polymer) in the description of the present invention is intended to encompass a relevant compound itself, as well as salts thereof and ions thereof. Furthermore, it is meant to encompass those structures which are partially modified within a range exhibiting the desired effect.

In the description of the present invention, when a substituent (the same for a linking group) is denoted without specifying whether being substituted or unsubstituted, this refers to that the group may further have a substituent within the range not impairing the desired effect. The same definition applies to a compound which is denoted without specifying whether being substituted or unsubstituted.

The terms "ppm" and "ppb" in this specification are based on mass.

The numerical range expressed by using "to" in this specification means a range including numerical values shown before and after "to" as the lower limit and the upper limit.

The thin film transistor of the present invention exhibits excellent carrier mobility and an increased current amplification factor, is thus capable of more rapidly and more securely performing a switching operation, and also has a low threshold voltage to thereby reduce power consumption of the transistor.

These and other features and advantages of the present invention will become more apparent from the following detailed description, with appropriate reference to the accompanying drawings.

DESCRIPTION OF THE PREFERRED EMBODIMENTS

Figure 1A:
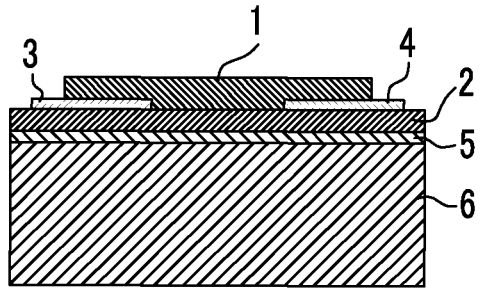
FIGS. 1A to 1D are diagrams schematically showing a preferred form of a thin film transistor of the present invention.

Hereinafter, the present invention will be described in detail.

[Thin Film Transistor]

The form of a thin film transistor of the present invention (hereinafter, simply referred to as "TFT of the present invention") will be described hereinafter.

The TFT of the present invention has a gate electrode, a semiconductor layer, a gate insulating layer provided between the gate electrode and the semiconductor layer, and a source electrode and a drain electrode provided in contact with the semiconductor layer and connected via the semiconductor layer, on a substrate. When a voltage is applied to the gate electrode, the flow path (channel) of an electric current is formed at the interface between the semiconductor layer between the source electrode and the drain electrode and an adjacent layer. That is, an electric current flowing between the source electrode and the drain electrode is controlled according to an input voltage applied to the gate electrode.

The preferred form of the TFT of the present invention will be described with reference to the drawings. The TFT shown in each drawing is a schematic diagram for facilitating the understanding of the present invention, and there is a case where, in the drawings, sizes of individual members, relative magnitude relationship between individual members, or the like has been changed in terms of magnitude for the convenience of explanation, thus not showing actual relationship between individual members. Further, the TFT is not limited to the shape and outer shape shown in these drawings, except for the particulars defined in the present invention. For example, in FIGS. 1A and 1B, the gate electrode is not necessarily required to completely cover the substrate, and a gate electrode in the form provided at the central portion of the substrate is also preferred as a form of the TFT of the present invention.

FIGS. 1A to 1D are each a longitudinal sectional view schematically showing representative preferred forms of the TFT of the present invention. Referring to FIGS. 1A to 1D, 1 denotes a semiconductor layer, 2 denotes a gate insulating layer, 3 denotes a source electrode, 4 denotes a drain electrode, 5 denotes a gate electrode, and 6 denotes a substrate.

Figure 1B:
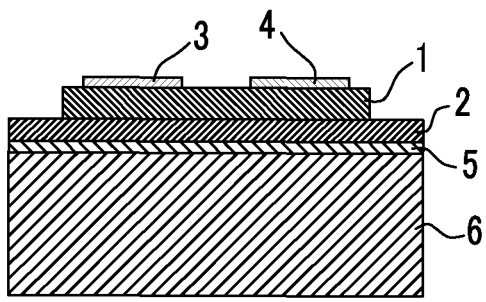
Figure 1C:
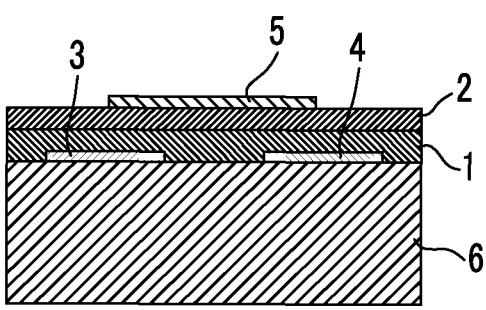
Figure 1D:
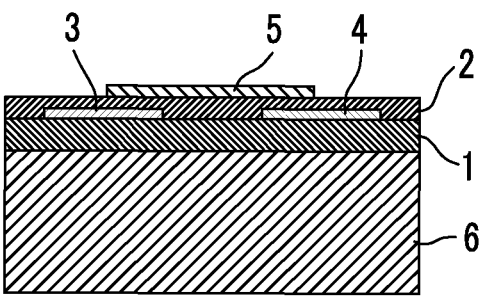

Further, FIG. 1A shows a bottom gate-bottom contact type TFT, FIG. 1B shows a bottom gate-top contact type TFT, FIG. 1C shows a top gate-bottom contact type TFT, and FIG. 1D shows a top gate-top contact type TFT. The TFT of the present invention encompasses all of the above-described four forms. Although not shown, there may be a case where an overcoat layer is formed on the top of each TFT in the drawings (opposite side with respect to the substrate 6).

Hereinafter, the constitution and materials of the TFT of the present invention will be described in more detail.

[Substrate]

The substrate may be one capable of supporting a TFT and a display panel or the like fabricated thereon. The substrate is not particularly limited as long as it has insulating properties on the surface thereof, is sheet-like, and is of a flat surface.

The material used for the substrate may be an inorganic material. Examples of the substrate made of an inorganic material include various glass substrates such as soda-lime glass and quartz glass, various glass substrates having an insulating film formed on the surface thereof, a quartz substrate having an insulating film formed on the surface thereof, a silicon substrate having an insulating film formed on the surface thereof, a sapphire substrate, a metal substrate made of various alloys and various metals such as stainless steel, aluminum, or nickel, metal foil, and paper.

In the case where the substrate is formed of a conductive or semi-conductive material such as stainless sheet, aluminum foil, copper foil, or silicon wafer, the substrate is typically used by coating or laminating an insulating polymer material, metal oxide, or the like on the surface thereof.

Further, the material used for the substrate may be an organic material. The substrate made of an organic material may be, for example, a plastic substrate (also referred to as a plastic film or a plastic sheet) having flexibility and constituted of an organic polymer which is exemplified by polymethylmethacrylate (polymethacrylic acid methyl, PMMA), polyvinyl alcohol (PVA), polyvinylphenol (PVP), polyether sulfone (PES), polyimide, polyamide, polyacetal, polycarbonate (PC), polyethylene terephthalate (PET), polyethylene naphthalate (PEN), polyethyl ether ketone, polyolefin, and polycycloolefin. A further example thereof may be a substrate formed of mica.

Use of such a flexible plastic substrate or the like allows for mounting or integration of a TFT into a display device or electronic device having, for example, a curved shape.

The organic material forming the substrate is preferably a material having a high glass transition point, and preferably a material having a glass transition point of 40° C. or higher, from the viewpoint of poor softening during lamination of other layers or during heating. Moreover, a material having a small linear expansion coefficient is preferred from the viewpoint of hardly undergoing a dimensional change due to heat treatment during manufacture and exhibiting excellent stability of transistor performance. For example, the substrate material is preferably a material having a linear expansion coefficient of $25 \times 10^{-5}$ cm/cm·° C. or less, and more preferably a material having $10 \times 10^{-5}$ cm/cm·° C. or less.

Further, the organic material constituting the substrate is preferably a material having resistance to a solvent used at the time of TFT manufacturing, and is also preferably a material having excellent adhesiveness with a gate insulating layer and an electrode.

Furthermore, it is also preferred to use a plastic substrate made of an organic polymer having high gas barrier properties.

It is also preferred that at least one surface of the substrate is provided with a dense silicon oxide film or the like, or is vapor-deposited or laminated with an inorganic material.

The substrate may be, for example, a conductive substrate (a substrate made of a metal such as gold or aluminum, a substrate made of highly oriented graphite, a stainless steel substrate, or the like), in addition to the above-described materials.

The substrate may have functional films such as a buffer layer for improving adhesiveness and flatness, and a barrier film for improving gas barrier properties. Further, a surface treatment layer such as an easily adhesive layer may be formed on the surface of the substrate. In addition, the substrate may be subjected to surface treatment such as corona treatment, plasma treatment, or UV/ozone treatment.

The thickness of the substrate is preferably 10 mm or less, more preferably 2 mm or less, and particularly preferably 1 mm or less. Further, on the other hand, the thickness of the substrate is preferably 0.01 mm or more, and more preferably 0.05 mm or more. Particularly, in the case of a plastic substrate, the thickness thereof is preferably about 0.05 mm to 0.1 mm. In the case of a substrate made of an inorganic material, the thickness thereof is preferably about 0.1 mm to 10 mm.

[Gate Electrode]

The gate electrode that can be used is a conventionally known electrode which is used as a gate electrode of TFTs. The conductive material constituting the gate electrode (also referred to as an electrode material) is not particularly limited. Examples of the electrode material include a metal such as platinum, gold, silver, aluminum, chromium, nickel, copper, molybdenum, titanium, magnesium, calcium, barium, sodium, palladium, iron, or manganese; a conductive metal oxide such as $INO_2$, $SnO_2$, indium tin oxide (ITO), fluorine-doped tin oxide (FTO), aluminum-doped zinc oxide (AZO), or gallium-doped zinc oxide (GZO); a conductive polymer such as polyaniline, polypyrrole, polythiophene, polyacetylene, or poly(3,4-ethylenedioxythiophene)/polystyrene sulfonic acid (PEDOT/PSS); the above-described conductive polymer to which a dopant, for example an acid such as hydrochloric acid, sulfuric acid, or sulfonic acid, a Lewis acid such as $PF_6$, $AsF_5$, or $FeCl_3$, a halogen atom such as iodine, or a metal atom such as sodium or potassium has been added, and a conductive composite material in which carbon black, graphite powder, metal fine particles, or the like has been dispersed. These materials may be used singly or as a combination of two or more kinds in any combination and in any ratio.

Further, the gate electrode may be a single layer made of the above-described conductive material or may be a structure where two or more layers are laminated.

There is no limitation on the method of forming a gate electrode. An example thereof is a method of patterning a film, which has been formed by physical vapor deposition such as a vacuum vapor deposition method (PVD), a chemical vapor deposition method (CVD method), a sputtering method, a printing method (coating method), a transfer method, a sol-gel method, a plating method, or the like, into a desired shape, as necessary.

In the coating method, a solution, paste or dispersion of the above-described materials is prepared and coated, followed by drying, calcination, photocuring or aging to form a film, or an electrode may be formed directly.

An ink jet printing, screen printing, (inversion) offset printing, letterpress printing, intaglio printing, planographic printing, thermal transfer printing, or microcontact printing method is capable of performing desired patterning, and is preferred from the viewpoints of process simplification, cost reduction, and high speed.

Even in the case of employing a spin coating method, a die coating method, a microgravure coating method, or a dip coating method, patterning may be performed by such a method in combination with the following photolithographic method or the like.

The photolithographic method may be, for example, a method of combining patterning of a photoresist with etching such as wet etching using an etching liquid or dry etching using reactive plasma, a lift-off method, or the like.

The other patterning method may also be a method of irradiating the above-described materials with energy rays such as laser light or an electron beam, followed by polishing, or modifying conductivity of a material.

Further, the patterning method also includes, for example a method of transferring a gate electrode composition printed on a support other than a substrate into an underlayer of the substrate or the like.

The thickness of the gate electrode is arbitrary, but it is preferably 1 nm or more, and particularly preferably 10 nm or more. On the other hand, the thickness of the gate electrode is preferably 500 nm or less, and particularly preferably 200 nm or less.

[Gate Insulating Layer]

The gate insulating layer of the TFT of the present invention is formed of an organic polymer compound having insulating properties. The organic polymer compound is not particularly limited as long as it has insulating properties. Preferred is an organic polymer compound capable of forming a thin film, for example, a thin film having a thickness of 1 μm or less.

The organic polymer compounds may be used singly or in combination of two or more thereof.

In the gate insulating layer constituting the TFT of the present invention, the content of metals selected from Mg, Ca, Ba, Al, Sn, Pb, Cr, Mn, Fe, Ni, Cu, Zn, and Ag (hereinafter, these metals are collectively referred to as "specific metals") is 10 ppb to 1 ppm in terms of total amount, or the content of non-metal ionic materials selected from halogen ions, sulfate ions, nitrate ions, and phosphate ions (hereinafter, these ions are collectively referred to as "specific non-metal ionic materials") is 1 ppm to 100 ppm in terms of total amount. More preferably, in the gate insulating layer, the content of metals selected from specific metals is 10 ppb to 1 ppm in terms of total amount, and the content of non-metal ionic materials selected from specific non-metal ionic materials is 1 ppm to 100 ppm in terms of total amount. The above-described specific metals also encompass those present in the form of ions, in addition to metals per se.

The TFT of the present invention is hardly susceptible to the formation of a leak path (conduction path) because the content of specific metals or specific non-metal ionic materials in the gate insulating layer is inhibited to fall within a specific range. For this reason, the TFT of the present invention exhibits a high current amplification factor due to excellent insulating properties of the gate insulating layer. Further surprisingly, a current amplification factor becomes higher in the case of containing specific metals or specific non-metal ionic materials in an amount defined in the present invention (that is, in the case of containing materials capable of contributing to the formation of a leakage path to a certain extent), as compared to the case where the content of specific metals or specific non-metal ionic materials in the gate insulating layer is lower than the content defined in the present invention (that is, as compared to the case where the amount of materials capable of contributing to the formation of a leakage path is to be smaller). Furthermore, the TFT of the present invention has a low threshold voltage. Usually, there is a positive correlation between the insulating properties of a gate insulating layer and the threshold voltage of a TFT. That is, if insulating properties of a gate insulating layer are high, a threshold voltage also increases. However, the TFT of the present invention exhibits a threshold voltage which is kept low while maintaining high insulating properties of the gate insulating layer, by specifying the content of specific metals or specific non-metal ionic materials in the gate insulating layer to fall within the specific range defined in the present invention. In other words, according to the present invention, provided is a TFT which is capable of more reliably performing a switching operation with lower power consumption. Furthermore, the TFT of the present invention can also enhance carrier mobility by specifying the content of specific metals or specific non-metal ionic materials in the gate insulating layer to fall within the specific range defined in the present invention. Incidentally, complex performance improvement as described above are not observed even when adjusting the amount of alkali metals in the gate insulating layer.

In the TFT of the present invention, the content of metals selected from specific metals in the gate insulating layer is preferably 10 ppb to 500 ppb, more preferably 10 ppb to 200 ppb, still more preferably 12 ppb to 100 ppb, and even more preferably 14 ppb to 70 ppb in terms of total amount. Further, the content of non-metal ionic materials selected from specific non-metal ionic materials in the gate insulating layer is preferably 2 ppm to 70 ppm, more preferably 3 ppm to 50 ppm, and still more preferably 5 ppm to 40 ppm. The amount of specific metals or specific non-metal ionic materials in the gate insulating layer can be adjusted by subjecting a material used for the manufacturing of the gate insulating layer to cleaning treatment, purification treatment, or the like.

In the TFT of the present invention, the content of metals selected from Mg, Ca, Al, Cr, Fe, and Zn in the gate insulating layer is preferably 10 ppb to 1 ppm, more preferably 10 ppb to 500 ppb, still more preferably 10 ppb to 200 ppb, even more preferably 12 ppb to 100 ppb, and further preferably 13 ppb to 70 ppb in terms of total amount.

Further, in the TFT of the present invention, the content of non-metal ionic materials selected from chlorine ions, sulfate ions, nitrate ions, and phosphate ions in the gate insulating layer is preferably 2 ppm to 70 ppm, more preferably 3 ppm to 50 ppm, and still more preferably 5 ppm to 40 ppm in terms of total amount. Furthermore, in the TFT of the present invention, the content of non-metal ionic materials selected from chlorine ions and sulfate ions in the gate insulating layer is preferably 2 ppm to 70 ppm, more preferably 3 ppm to 50 ppm, and still more preferably 5 ppm to 40 ppm in terms of total amount.

A preferred example of the organic polymer compound used in the gate insulating layer of the TFT of the present invention may be, for example, one or two or more selected from polyvinylphenol, a novolak resin, polystyrene, poly(meth)acrylate, an epoxy resin, an epoxy(meth)acrylate resin, polyvinyl alcohol, a fluororesin, polycycloolefin, polysilsesquioxane, polysiloxane, polyester, polyether sulfone, polyether ketone, and polyimide.

The poly(meth)acrylate is preferably polyalkyl methacrylate, and more preferably polymethyl methacrylate. Examples of the fluororesin include polyvinylidene fluoride, polytetrafluoroethylene, and a cyclic fluoroalkyl polymer typified by CYTOP. The polysiloxane is preferably dialkylpolysiloxane, and more preferably polydimethylsiloxane.

The organic polymer compound used in the gate insulating layer of the TFT of the present invention is more preferably one or two or more selected from polyvinylphenol, polystyrene, poly(meth)acrylate, epoxy(meth)acrylate, a fluororesin, polycycloolefin, polysilsesquioxane, and polysiloxane, and still more preferably one or two or more selected from polyvinylphenol, polysilsesquioxane, and a fluororesin.

The above-exemplified organic polymer compounds may be in the form of a copolymer in which a structural component of the above-exemplified organic polymer compounds (polymers) serves as a constitutional unit. Further, the above-exemplified organic polymer compounds also encompass a form having a desired substituent. The organic polymer compound may also be used in combination with a compound having a reactive substituent such as an alkoxysilyl group, a vinyl group, an acryloyloxy group, an epoxy group, or a methylol group.

In the case of forming a gate insulating layer using an organic polymer compound, it is also preferred that the organic polymer compound is crosslinked and cured for the purpose of increasing solvent resistance and insulation resistance of the gate insulating layer. In other words, the above-exemplified organic polymer compound to be contained in the gate insulating layer also encompasses a form having a crosslinked structure. The crosslinking is preferably carried out by generating acid or radicals using light, heat, or both thereof.

In the case where radicals are generated to introduce a crosslinked structure into a polymer compound, for example, a thermal polymerization initiator (H1) and a photopolymerization initiator (H2) described in paragraphs "0182" to "0186" of JP2013-214649A (the content of which is preferably incorporated herein by reference), a photoradical generator described in paragraphs "0046" to "0051" of JP2011-186069A (the content of which is preferably incorporated herein by reference), and a photoradical polymerization initiator described in paragraphs "0042" to "0056" of JP2010-285518A (the content of which is preferably incorporated herein by reference) can be preferably used as a radical generator which generates radicals by light or heat.

Further, in the case where radicals are generated to introduce a crosslinked structure into a polymer compound, it is preferred to use a "compound (G) having a number average molecular weight (Mn) of 140 to 5,000, containing a crosslinkable functional group, and containing no fluorine atom" described in paragraphs "0167" to "0177" of JP2013-214649A, the content of which is preferably incorporated herein by reference.

In the case where an acid is generated to introduce a crosslinked structure into a polymer compound, for example, a photocation polymerization initiator described in paragraphs "0033" and "0034" of JP2010-285518A (the content of which is preferably incorporated herein by reference), and an acid generator, in particular a sulfonium salt or an iodonium salt described in paragraphs "0120" to "0136" of JP2012-163946A (the content of which is preferably incorporated herein by reference) can be preferably used as a photoacid generator which generates an acid by light. Further, for example, a thermal cationic polymerization initiator, in particular an onium salt described in paragraphs "0035" to "0038" of JP2010-285518A (the content of which is preferably incorporated herein by reference), and a catalyst, in particular sulfonic acids and sulfonic acid amine salt described in paragraphs "0034" and "0035" of JP2005-354012A (the content of which is preferably incorporated herein by reference) can be preferably used as a thermal acid generator (catalyst) which generates an acid by heat.

Further, in the case where an acid is generated to introduce a crosslinked structure into a polymer compound, it is preferred to use a crosslinking agent, in particular a bifunctional or higher functional epoxy compound and an oxetane compound, described in paragraphs "0032" and "0033" of JP2005-354012A (the content of which is preferably incorporated herein by reference), a crosslinking agent, in particular a compound characterized by having two or more crosslinking groups, with at least one of the crosslinking groups being a methylol group or an NH group, described in paragraphs "0046" to "0062" of JP2006-303465A (the content of which is preferably incorporated herein by reference), and a compound having two or more hydroxymethyl groups or alkoxymethyl groups in the molecule, described in paragraphs "0137" to "0145" of JP2012-163946A, the content of which is preferably incorporated herein by reference.

The method of forming the gate insulating layer using an organic polymer compound may be, for example, a method of coating and curing an organic polymer compound. The coating method is not particularly limited, and includes the above-described printing methods. Among them, preferred is a wet coating method such as a microgravure coating method, a dip coating method, a screen coating printing method, a die coating method, or a spin coating method.

The gate insulating layer may be provided by using a method of combining any one of a lift-off method, a sol-gel method, an electrodeposition method, and a shadow mask method with a patterning method if necessary, in addition to the above-described methods.

The gate insulating layer may be subjected to surface treatment such as corona treatment, plasma treatment, or UV/ozone treatment, and in the case of performing surface treatment, it is preferred for such a treatment not to increase surface roughness. Preferably, arithmetic mean roughness Ra or root mean square roughness $R_{MS}$ of the gate insulating layer surface is 0.5 nm or less.

In the TFT of the present invention, the gate insulating layer may contain an inorganic insulating material within a range satisfying the requirements of the present invention.

[Self-Assembled Monolayer (SAM)]

The self-assembled monolayer may be formed on the gate insulating layer.

The compound forming the self-assembled monolayer is not particularly limited as long as it is a compound that self-assembles. For example, one or more compounds represented by the following Formula 1S can be used as the compound that self-assembles.

  Formula 1S:

In Formula 1S, $R^{1S}$ represents any one of an alkyl group, an alkenyl group, an alkynyl group, an aryl group, an alkoxy group, an aryloxy group, or a heterocyclic group (thienyl, pyrrolyl, pyridyl, fluorenyl, or the like).

$X^S$ represents an adsorptive or reactive substituent, specifically any one of a —$SiX^4X^5X^6$ group (in which $X^4$ represents a halide group or an alkoxy group, and $X^5$ and $X^6$ each independently represent a halide group, an alkoxy group, an alkyl group, or an aryl group. $X^4$, $X^5$, and $X^6$ are preferably the same from one another, respectively, and more preferably a chloro group, a methoxy group, or an ethoxy group), a phosphonic acid group (—$PO_3H_2$), a phosphinic acid group (—$PRO_2H$ in which R is an alkyl group), a phosphoric acid group, a phosphorous acid group, an amino group, a halide group, a carboxy group, a sulfonic acid group, a boric acid group (—$B(OH)_2$), a hydroxy group, a thiol group, an ethynyl group, a vinyl group, a nitro group, or a cyano group.

$R^{1S}$ is preferably not branched, and for example, a linear normal alkyl (n-alkyl) group, a ter-phenyl group in which three phenyl groups are arranged in series, and a structure in which n-alkyl groups are disposed on both sides of the phenyl group's para-position are preferred. Further, the alkyl chain may have an ether bond therein, or may have a carbon-carbon double bond or triple bond therein.

An adsorptive or reactive substituent $X^S$ interacts with, adsorbs, or reacts with the corresponding reactive site (for example, —OH group) of the gate insulating layer surface to form a bond, whereby the self-assembled monolayer is formed on the gate insulating layer. It is preferred that, with respect to the compound represented by the above-described Formula 1 S, the main skeleton is linear and the molecular length is aligned, since molecules are more densely packed to thereby impart a smoother and low surface-energy surface to the self-assembled monolayer.

Particularly preferred specific examples of the compound represented by Formula 1S include alkyl trichlorosilane compounds such as methyltrichlorosilane, ethyltrichlorosilane, butyltrichlorosilane, octyltrichlorosilane, decyltrichlorosilane, octadecyltrichlorosilane, and phenethyltrichlorosilane, alkyltrialkoxysilane compounds such as methyltrimethoxysilane, ethyltrimethoxysilane, butyltrimethoxysilane, octyltrimethoxysilane, decyltrimethoxysilane, and octadecyltrimethoxysilane, alkylphosphonic acid, alkylcarboxylic acid, arylphosphonic acid, an alkyl boric acid group, an aryl boric acid group, an alkyl thiol group, and an aryl thiol group.

The self-assembled monolayer can be formed by using a method of vapor-depositing the above-described compound on a gate insulating layer under vacuum, a method of immersing a gate insulating layer in a solution of the above-described compound, a Langmuir-Blodgett method, or the like. Further, for example, the self-assembled monolayer can be formed by treatment of a gate insulating layer with a solution in which 1 mass % to 10 mass % of an alkylchlorosilane compound or an alkylalkoxysilane compound is dissolved in an organic solvent. In the present invention, the method of forming a self-assembled monolayer is not limited thereto.

Examples of a preferred method for obtaining a more dense self-assembled monolayer include methods described in Langmuir 19, 1159 (2003) and J. Phys. Chem. B 110, 21101 (2006).

Specifically, the self-assembled monolayer can be formed by immersing a gate insulation layer in a highly volatile dry solvent having the above-described compound dispersed therein to form a film, taking out the gate insulating layer from the solvent, and if necessary, performing a reacting step of the above-described compound with the gate insulating layer such as by annealing, followed by washing with a dry solvent and then drying.

The dry solvent is not particularly limited, but for example, chloroform, trichlorethylene, anisole, diethyl ether, hexane, and toluene may be used alone or in combination thereof.

Further, it is preferred to dry the film in a dry atmosphere or by spraying of a dry gas. The dry gas to be used is preferably an inert gas such as nitrogen. By using such a method of producing a self-assembled monolayer, a dense and aggregation- or defect-free self-assembled monolayer is formed, whereby the surface roughness of the self-assembled monolayer can be inhibited to be 0.3 nm or less.

[Semiconductor Layer]

<Organic Semiconductor Layer>

The organic semiconductor layer is a layer exhibiting semiconductivity and capable of accumulating carriers.

The organic semiconductor layer may be a layer containing an organic semiconductor.

The organic semiconductor is not particularly limited, and examples thereof include an organic polymer and derivatives thereof, a low molecular weight compound, and the like.

The term "low molecular weight compound" as used herein refers to a compound other than an organic polymer and derivatives thereof. In other words, this term refers to a compound having no repeating unit. The molecular weight of the low molecular weight compound is not particularly limited as long as the low molecular weight compound is such a compound. The molecular weight of the low molecular weight compound is preferably 300 to 2,000, and more preferably 400 to 1,000.

The low molecular weight compound includes a fused polycyclic aromatic compound. Examples thereof include acenes such as naphthacene, pentacene (2,3,6,7-dibenzoanthracene), hexacene, heptacene, dibenzopentacene, and tetrabenzopentacene, anthradithiophene, pyrene, benzopyrene, dibenzopyrene, chrysene, perylene, coronene, Terrylene, ovalene, quaterrylene, circumanthracene, and derivatives in which a part of carbon atoms thereof is substituted with atoms such as N, S, and O, or derivatives in which at least one hydrogen atom bonded to the above-described carbon atoms is substituted with a functional group such as a carbonyl group (dioxaanthanthrene compounds including peri-xanthenoxanthene and derivatives thereof, triphenodioxazine, triphenodithiazine, hexacene-6,15-quinone, and the like), as well as derivatives in which the above-described hydrogen atom is substituted with another functional group.

Further examples of the low molecular weight compound include metal phthalocyanines typified by copper phthalocyanine; tetrathiapentalene and derivatives thereof; naphthalenetetracarboxylic acid diimides such as naphthalene-1,4, 5,8-tetracarboxylic acid diimide, N,N'-bis(4-trifluoromethylbenzyl)naphthalene-1,4,5,8-tetracarboxylic acid diimide, N,N'-bis(1H,1H-perfluorooctyl), N,N'-bis(1H,1H-perfluorobutyl), N,N'-dioctylnaphthalene-1,4,5,8-tetracarboxylic acid diimide derivatives, and naphthalene-2,3,6,7-tetracarboxylic acid diimide; fused ring tetracarboxylic acid diimides such as anthracene tetracarboxylic acid diimides, for example anthracene-2,3,6,7-tetracarboxylic acid diimide; fullerenes such as C60, C70, C76, C78, and C84, and derivatives thereof; carbon nanotubes such as SWNT; and pigments such as a merocyanine pigment and a hemicyanine pigment, and derivatives thereof.

Further examples of the low molecular weight compound include polyanthracene, triphenylene, and quinacridone.

Further examples of the low molecular weight compound include 4,4'-biphenyldithiole (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl) thiophene, 4,4'-diisocyanophenyl, benzidine(biphenyl-4-4'-diamine), tetracyanoquinodimethane (TCNQ), tetrathiafulvalene (TTF) and derivatives thereof, charge-transfer complexes typified by a tetrathiafulvalene (TTF)-TCNQ complex, a bisethylcnetetrathiafulvalene (BEDTTTF)-perchloric acid complex, a BEDTTTF-iodine complex, and a TCNQ-iodine complex, biphenyl-4,4'-dicarboxylic acid, 1,4-di(4-thiophenylacetylenyl)-2-ethylbenzene, 1,4-di(4-isocyanophenylacetylenyl)-2-ethylbenzene, 1,4-di(4-thiophenylethynyl)-2-ethylbenzene, 2,2''-dihydroxy-1,1': 4',1''-terphenyl, 4,4'-biphenyldiethanal, 4,4'-biphenyldiol, 4,4'-biphenyldiisocyanate, 1,4-diacetylenylbenzene, diethylbiphenyl-4,4'-dicarboxylate, benzo[1,2-c;3,4-c';5,6-c'']tris[1,2]dithiol-1,4,7-trithione, α-sexithiophene, tetrathiatetracene, tetraselenotetracene, tetratellurotetracene, poly(3-alkylthiophene), poly(3-thiophene-β-ethane sulfonic acid), poly(N-alkylpyrrole), poly(3-alkylpyrrole), poly(3,4-dialkylpyrrole), poly(2,2'-thienylpyrrole), and poly(dibenzothiophene sulfide).

The organic semiconductor is preferably a low molecular weight compound, and inter alia, a fused polycyclic aromatic compound is preferred. The fused polycyclic aromatic compound has a high effect of improving carrier mobility and durability, and also exhibits an excellent lowering effect of a threshold voltage.

The fused polycyclic aromatic compound is preferably an acene represented by any one of Formulae (A1) to (A4) and a compound represented by any one of the following General Formulae (C) to (T), and more preferably a compound represented by any one of the following General Formulae (C) to (T).

The acene preferred as the fused polycyclic aromatic compound is an acene represented by the following Formula (A1) or (A2).

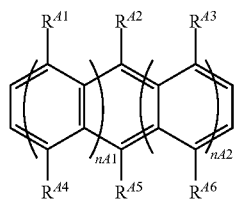

General Formula (A1)

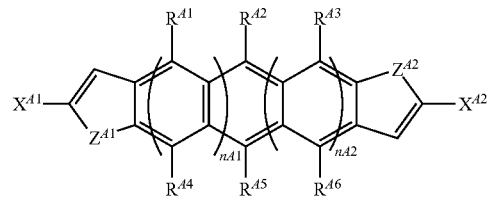

General Formula (A2)

In the formula, $R^{A1}$ to $R^{A6}$, $X^{A1}$, and $X^{A2}$ represent a hydrogen atom or a substituent.

$Z^{A1}$ and $Z^{A2}$ represent S, O, Se, or Te.

$n^{A1}$ and $n^{A2}$ represent an integer of 0 to 3, provided that there is no case where $n^{A1}$ and $n^{A2}$ are 0 at the same time.

The substituents each represented by $R^{A1}$ to $R^{A6}$, $X^{A1}$, and $X^{A2}$ are not particularly limited, but examples thereof include an alkyl group (for example, methyl, ethyl, propyl, isopropyl, tert-butyl, pentyl, tert-pentyl, hexyl, octyl, tert-octyl, dodecyl, tridecyl, tetradecyl, pentadecyl, or the like), a cycloalkyl group (for example, cyclopentyl, cyclohexyl, or the like), an alkenyl group (for example, vinyl, allyl, 1-propenyl, 2-butenyl, 1,3-butadienyl, 2-pentenyl, isopropenyl, or the like), an alkynyl group (for example, ethynyl, propargyl, or the like), an aromatic hydrocarbon group (also referred to as an aromatic carbocyclic group, an aryl group or the like, for example, phenyl, p-chlorophenyl, mesityl, tolyl, xylyl, naphthyl, anthryl, azulenyl, acenaphthenyl, fluorenyl, phenanthryl, indenyl, pyrenyl, biphenylyl, or the like), an aromatic heterocyclic group (also referred to as a heteroaryl group, for example, a pyridyl group, a pyrimidinyl group, a furyl group, a pyrrolyl group, an imidazolyl group, a benzimidazolyl group, a pyrazolyl group, a pyrazinyl group, a triazolyl group (for example, a 1,2,4-triazol-1-yl group, a 1,2,3-triazol-1-yl group, or the like), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (representing a group in which one of carbon atoms constituting the carboline ring of a carbolinyl group is substituted with a nitrogen atom), a quinoxalinyl group, a pyridazinyl group, a triazinyl group, a quinazolinyl group, a phthalazinyl group, or the like), a heterocyclic group (also referred to as a heteroaryl ring group or the like, for example, a pyrrolidyl group, an imidazolidyl group, a morpholyl group, an oxazolidyl group, or the like), an alkoxy group (for example, methoxy, ethoxy, propyloxy, pentyloxy, hexyloxy, octyloxy, dodecyloxy or the like), a cycloalkoxy group (for example, cyclopentyloxy, cyclohexyloxy, or the like), an aryloxy group (for example, phenoxy, naphthyloxy, or the like), an alkylthio group (for example, methylthio, ethylthio, propylthio, pentylthio, hexylthio, octylthio, dodecylthio, or the like), a cycloalkylthio group (for example, cyclopentylthio, cyclohexylthio, or the like), an arylthio group (for example, phenylthio, naphthylthio, or the like), an alkoxycarbonyl group (for example, methyloxycarbonyl, ethyloxycarbonyl, butyloxycarbonyl, octyloxycarbonyl, dodecyloxycarbonyl, or the like), an aryloxycarbonyl group (for example, phenyloxycarbonyl, naphthyloxycarbonyl, or the like), a sulfamoyl group (for example, aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, 2-pyridylaminosulfonyl, or the like), an acyl group (for example, acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, pyridylcarbonyl, or the like), an acyloxy group (for example, acetyloxy, ethylcarbonyloxy, butylcarbonyloxy, octylcarbonyloxy, dodecylcarbonyloxy, phenylcarbonyloxy, or the like), an amide group (for example, methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, naphthylcarbonylamino, or the like), a carbamoyl group (for example, aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, 2-pyridylaminocarbonyl, or the like), a ureido group (for example, methylureido, ethylureido, pentylureido, cyclohexylureido, octylureido, dodecylureido, phenylureido, naphthylureido, 2-pyridylaminoureido, or the like), a sulfinyl group (for example, methylsulfinyl, ethylsulfinyl, butylsulfinyl, cyclohexylsulfinyl, 2-ethylhexylsulfinyl, dodecylsulfinyl, phenylsulfinyl, naphthylsulfinyl, 2-pyridylsulfinyl, or the like), an alkylsulfonyl group (for example, methylsulfonyl, ethylsulfonyl, butylsulfonyl, cyclohexylsulfonyl, 2-ethylhexylsulfonyl, dodecylsulfonyl, or the like), an arylsulfonyl group (phenylsulfonyl, naphthylsulfonyl, 2-pyridylsulfonyl, or the like), an amino group (for example, amino, ethylamino, dimethylamino, butylamino, cyclopentylamino, 2-ethylhexylamino, dodecylamino, anilino, naphthylamino, 2-pyridylamino, or the like), a halogen atom (for example, a fluorine atom, a chlorine atom, a bromine atom, or the like), a fluorinated hydrocarbon group (for example, fluoromethyl, trifluoromethyl, pentafluoroethyl, pentafluorophenyl, or the like), a cyano group, a nitro group, a hydroxy group, a mercapto group, a silyl group (for example, trimethylsilyl, triisopropylsilyl, triphenylsilyl, phenyldiethyl silyl, or the like), and a group represented by the following General Formula (SG1) (provided that $X^4$ is Ge or Sn).

These substituents may further have plural substituents. Examples of such plural substituents include the above-described substituents represented by $R^{41}$ to $R^{46}$.

Among the above-described acenes, more preferred are acenes represented by the following Formula (A3) or (A4).

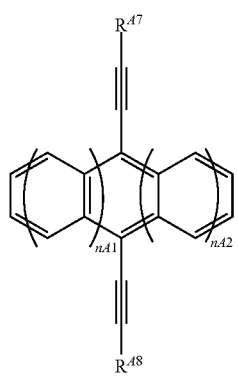

General Formula (A3)

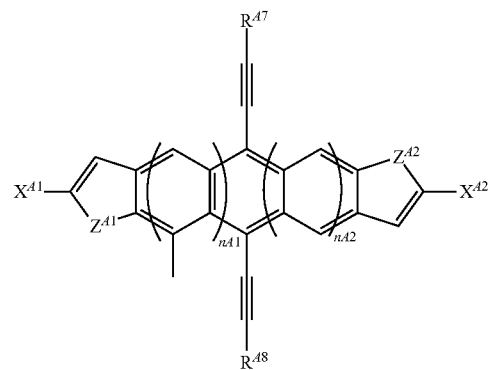

General Formula (A4)

In the formulae. $R^{47}$, $R^{48}$, $X^{41}$, and $X^{42}$ represent a hydrogen atom or a substituent. $R^{47}$, $R^{48}$, $X^{41}$, and $X^{42}$ may be the same or different. The substituents represented by $R^{47}$ and $R^{48}$ are preferably those enumerated above as the substituents which can be employed as $R^{41}$ to $R^{46}$ of Formulae (A1) and (A2).

$Z^{41}$ and $Z^{42}$ represent S, O, Se, or Te.

$n^{41}$ and $n^{42}$ represent an integer of 0 to 3, provided that there is no case where $n^{41}$ and $n^{42}$ are 0 at the same time.

In Formula (A3) or (A4), $R^{47}$ and $R^{48}$ are preferably those represented by the following Formula (SG1).

General Formula (SG1)

In the formula, $R^{49}$ to $R^{411}$ represent a substituent. $X^4$ represents Si, Ge, or Sn. The substituents represented by $R^{49}$ to $R^{411}$ are preferably those listed above as the substituent which can be employed as $R^{41}$ to $R^{46}$ of Formulae (A1) and (A2).

Specific examples of the acene or acene derivatives represented by Formulae (A1) to (A4) are shown below, but the present invention is not limited thereto.

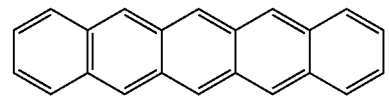

Compound A1

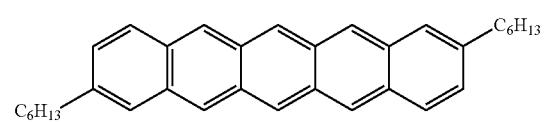

Compound A2

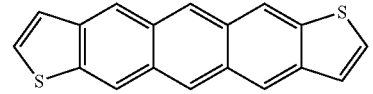

Compound A3

Compound A4
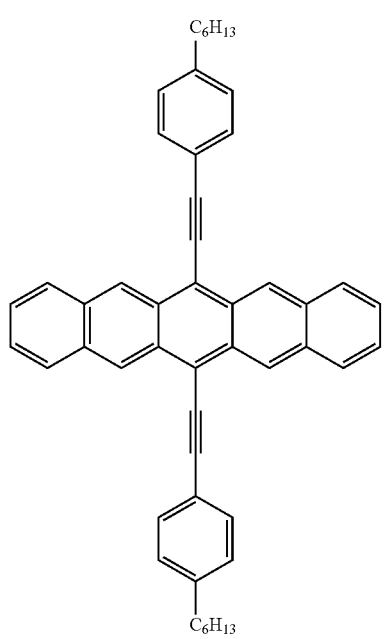
Compound A5
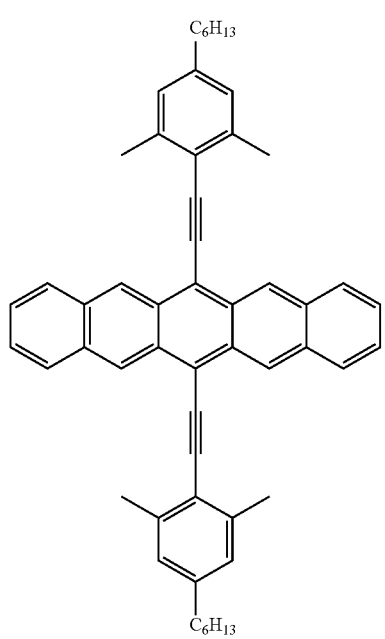
Compound A6
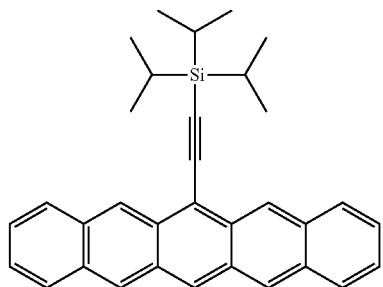
Compound A7
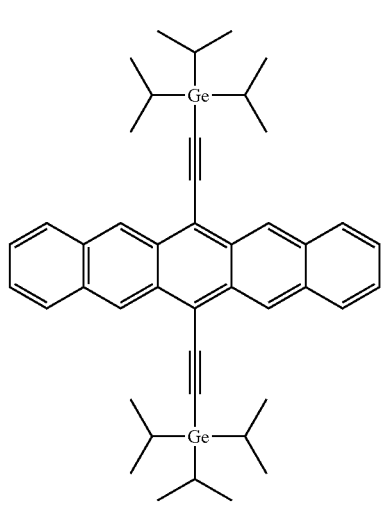
Compound A8
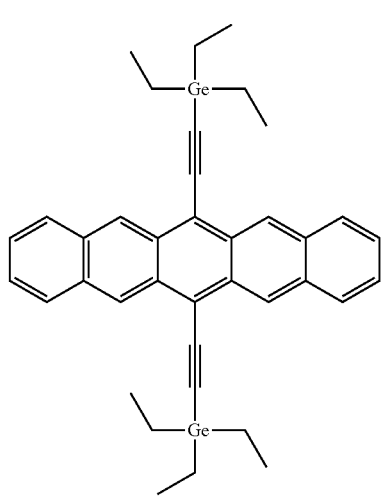

Compound A9
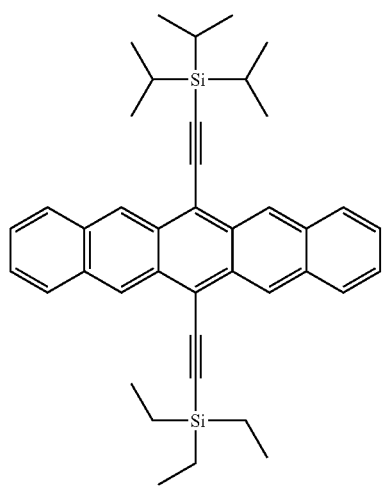
Compound A12
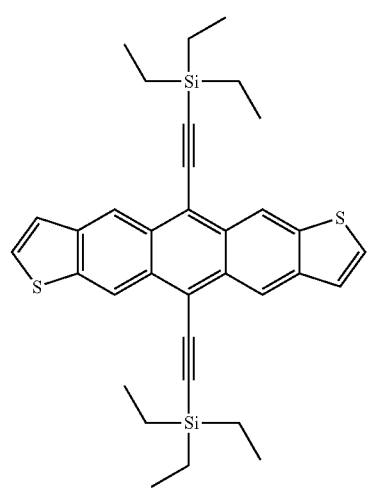
Compound A10
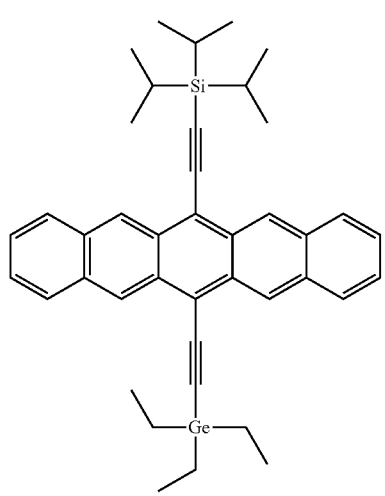
Compound A13
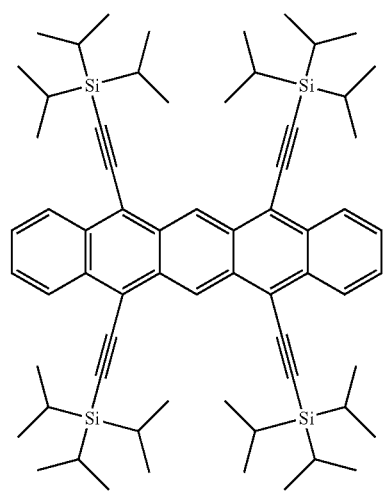
Compound A11
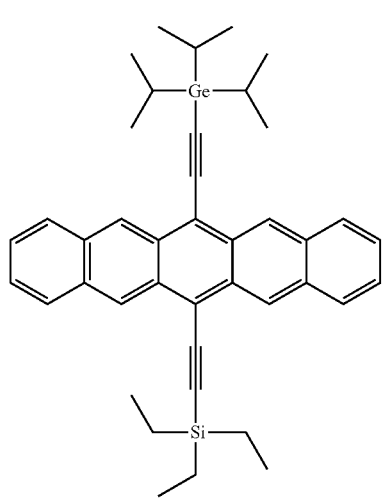
Compound A14
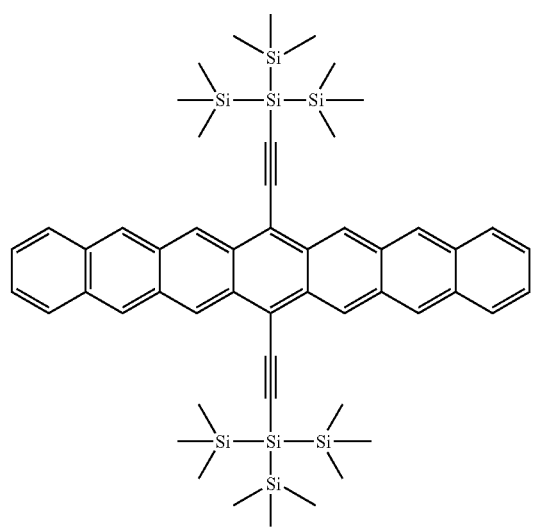

Compound A15
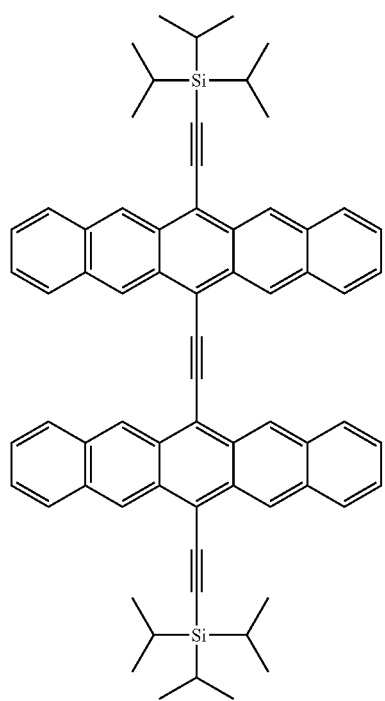
Compound A16
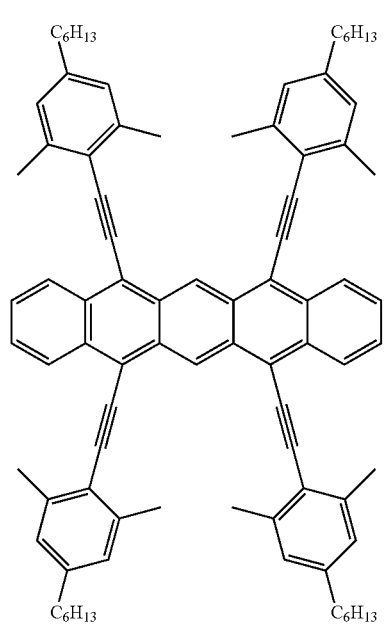
Compound A17
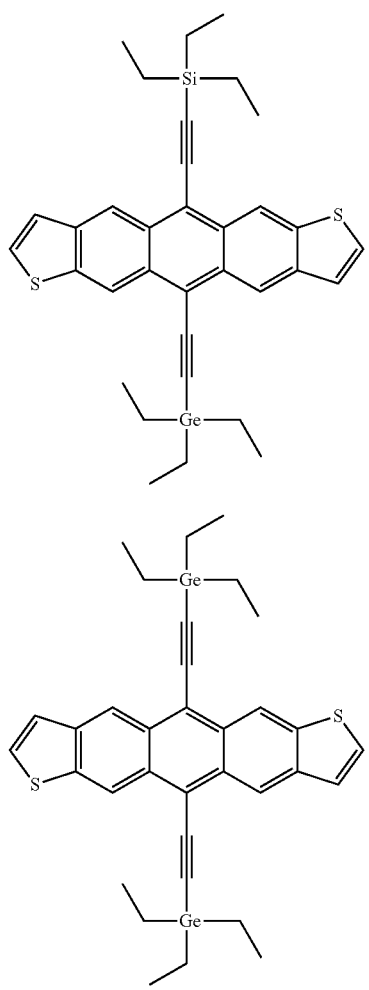
Compound A18
Compound A19
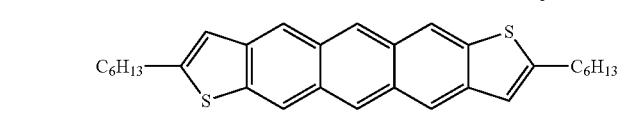
Compound A20
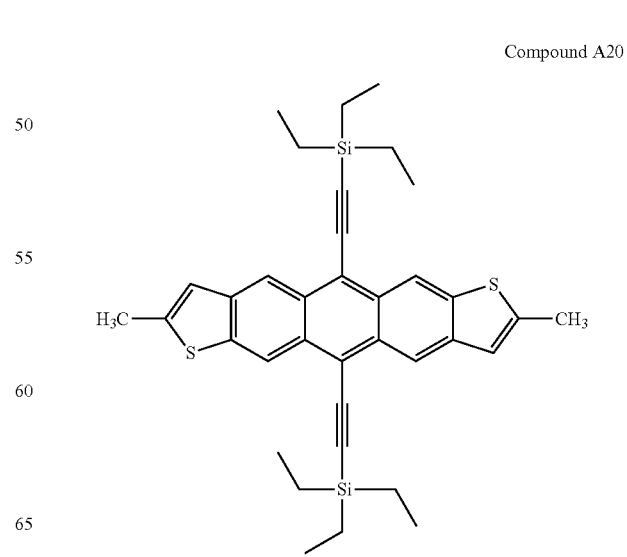

Compound 21
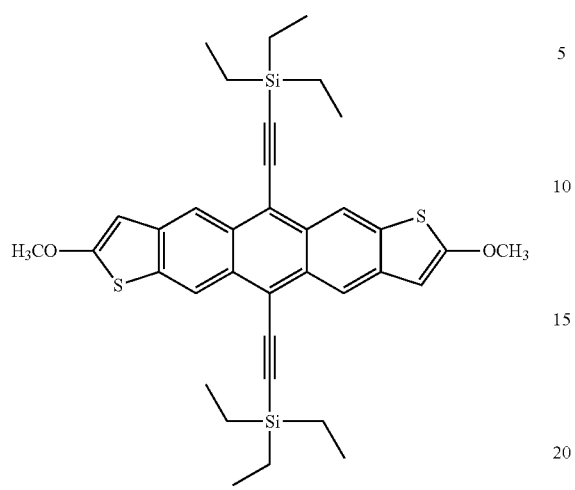
Compound A22
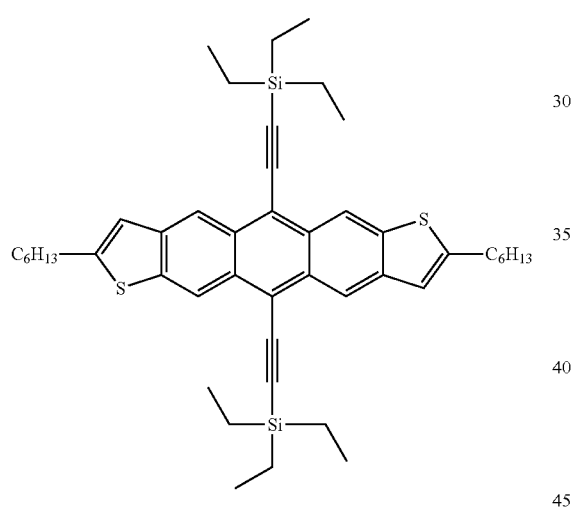
Compound A23
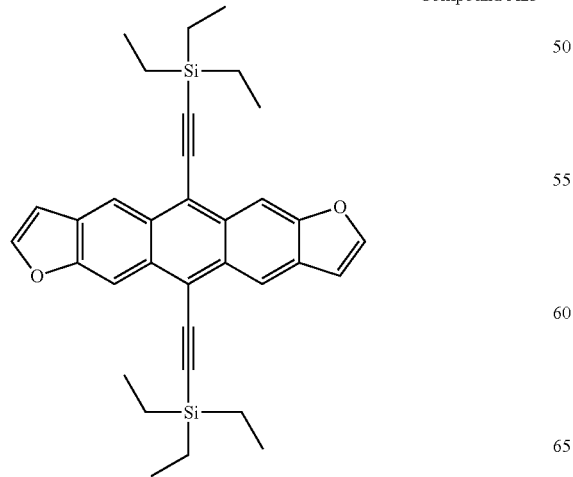
Compound A24
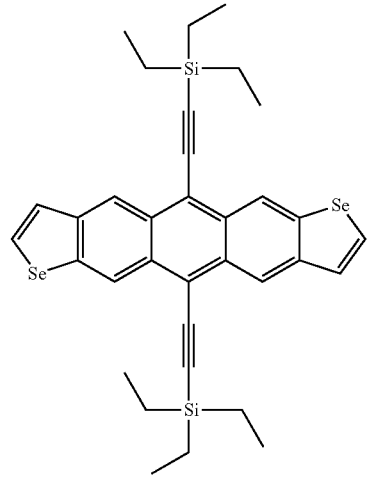
Compound A25
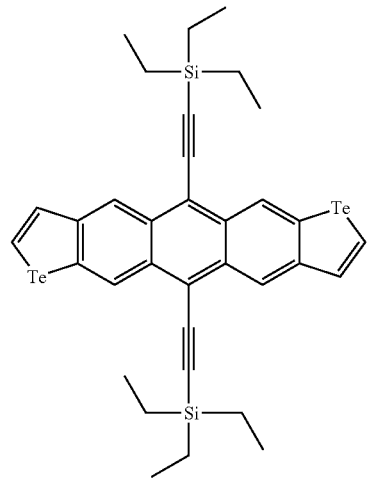
Compound A26
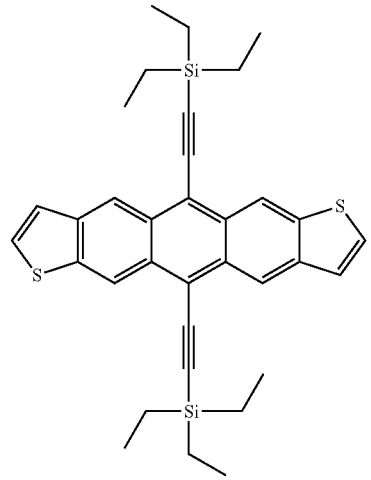

Compound A27
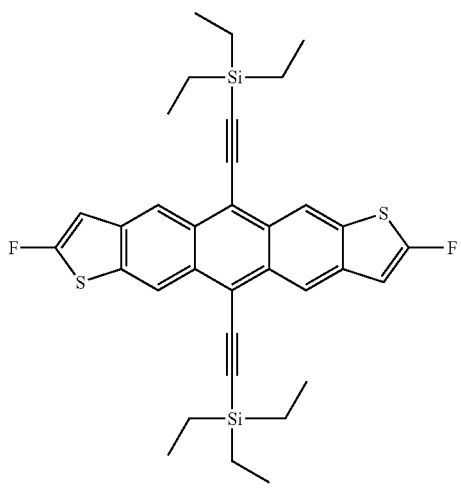
Compounds represented by the following General Formulae (C) to (T) are also preferred as the fused polycyclic aromatic compound.
General Formula (C)
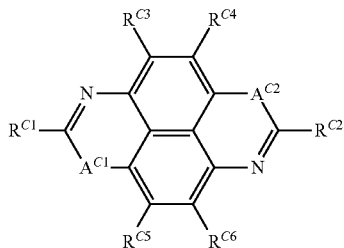
General Formula (D)
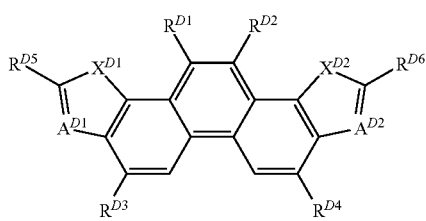
General Formula (E)
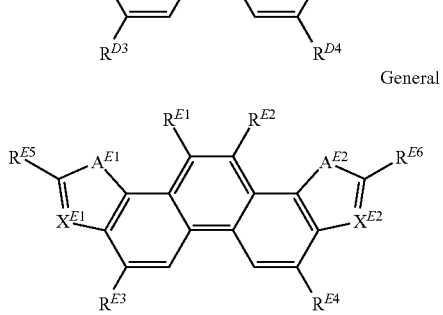
General Formula (F)
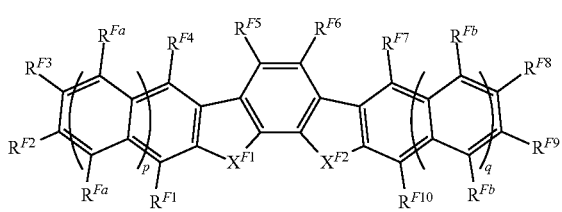
General Formula (G)
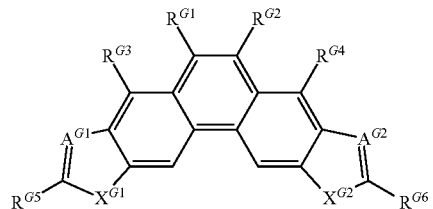
General Formula (H)
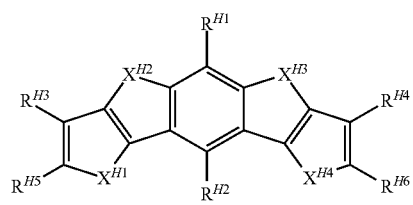
General Formula (J)
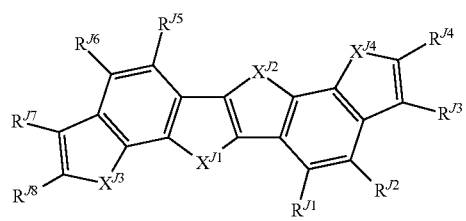
General Formula (K)
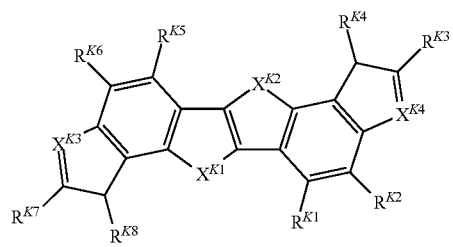
General Formula (L)
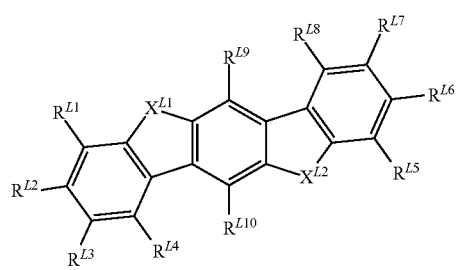
General Formula (M)
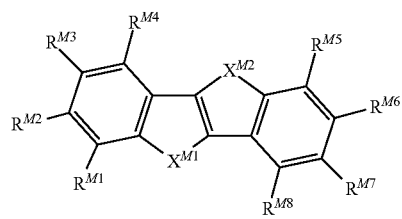

-continued

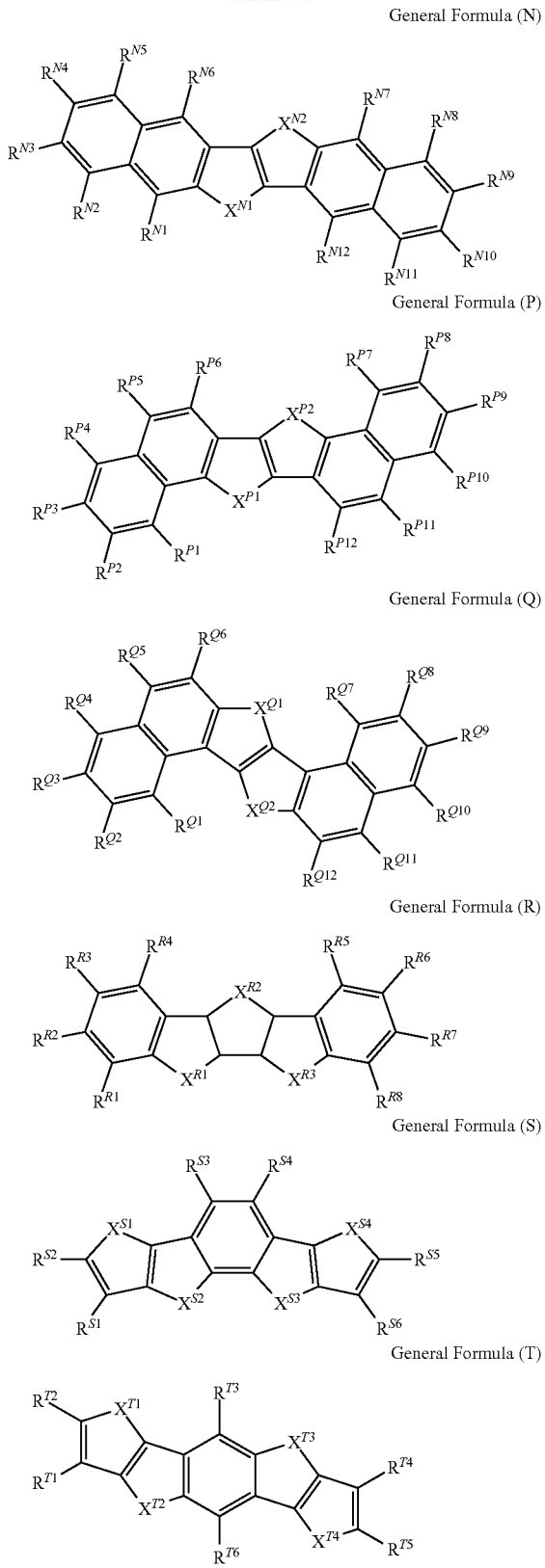

General Formula (N)

General Formula (P)

General Formula (Q)

General Formula (R)

General Formula (S)

General Formula (T)

In General Formula (C), $A^{C1}$ and $A^{C2}$ represent an oxygen atom, a sulfur atom, or a selenium atom. Both of $A^{C1}$ and $A^{C2}$ preferably represent an oxygen atom or a sulfur atom, and more preferably a sulfur atom. $R^{C1}$ to $R^{C6}$ represent a hydrogen atom or a substituent. At least one of $R^{C1}$, $R^{C2}$, $R^{C3}$, $R^{C4}$, $R^{C5}$, or $R^{C6}$ is a substituent represented by the following General Formula (W).

In General Formula (D), $X^{D1}$ and $X^{D2}$ represent $NR^{D9}$, an oxygen atom, or a sulfur atom. $A^{D1}$ represents $CR^{D7}$ or an N atom, $A^{D2}$ represents $CR^{D8}$ or an N atom, and $R^{D9}$ represents a hydrogen atom, an alkyl group, an alkenyl group, an alkynyl group, or an acyl group. $R^{D1}$ to $R^{D8}$ represent a hydrogen atom or a substituent, and at least one of $R^{D1}$, $R^{D2}$, $R^{D3}$, $R^{D4}$, $R^{D5}$, $R^{D6}$, $R^{D7}$, or $R^{D8}$ is a substituent represented by the following General Formula (W).

In General Formula (E), $X^{E1}$ and $X^{E2}$ represent an oxygen atom, a sulfur atom, or $NR^{E7}$. $A^{E1}$ and $A^{E2}$ represent $CR^{E8}$ or a nitrogen atom. $R^{E1}$ to $R^{E8}$ represent a hydrogen atom or a substituent. At least one of $R^{E1}$, $R^{E2}$, $R^{E3}$, $R^{E4}$, $R^{E5}$, $R^{E6}$, $R^{E7}$, or $R^{E8}$ is a substituent represented by the following General Formula (W).

In General Formula (F), $X^{F1}$ and $X^{F2}$ represent an oxygen atom, a sulfur atom, or a selenium atom. $X^{F1}$ and $X^{F2}$ preferably represent an oxygen atom or a sulfur atom, and more preferably represent a sulfur atom. $R^{F1}$ to $R^{F10}$, $R^{Fa}$, and $R^{Fb}$ represent a hydrogen atom or a substituent. At least one of $R^{F1}$ to $R^{F10}$, $R^{Fa}$, or $R^{Fb}$ is a substituent represented by General Formula (W). p and q represent an integer of 0 to 2.

In General Formula (G), $X^{G1}$ and $X^{G2}$ represent $NR^{G9}$, an oxygen atom, or a sulfur atom. $A^{G1}$ represents $CR^{G7}$ or an N atom. $A^{G2}$ represents $CR^{G8}$ or an N atom. $R^{G9}$ represents a hydrogen atom, an alkyl group, an alkenyl group, an alkynyl group, an acyl group, an aryl group, or a heteroaryl group. $R^{G1}$ to $R^{G8}$ represent a hydrogen atom or a substituent. At least one of $R^{G1}$, $R^{G2}$, $R^{G3}$, $R^{G4}$, $R^{G5}$, $R^{G6}$, $R^{G7}$, or $R^{G8}$ is a substituent represented by the following General Formula (W).

In General Formula (H), $X^{H1}$ to $X^{H4}$ represent $NR^{H7}$, an oxygen atom, or a sulfur atom. $X^{H1}$ to $X^{H4}$ preferably represent a sulfur atom. $R^{H7}$ represents a hydrogen atom, an alkyl group, an alkenyl group, an alkynyl group, an acyl group, an aryl group, or a heteroaryl group. $R^{H1}$ to $R^{H6}$ represent a hydrogen atom or a substituent. At least one of $R^{H1}$, $R^{H2}$, $R^{H3}$, $R^{H4}$, $R^{H5}$, or $R^{H6}$ is a substituent represented by the following General Formula (W).

In General Formula (J), $X^{J1}$ and $X^{J2}$ represent an oxygen atom, a sulfur atom, a selenium atom, or $NR^{J9}$. $X^{J3}$ and $X^{J4}$ represent an oxygen atom, a sulfur atom, or a selenium atom. $X^{J1}$, $X^{J2}$, $X^{J3}$, and $X^{J4}$ preferably represent a sulfur atom. $R^{J1}$ to $R^{J9}$ represent a hydrogen atom or a substituent. At least one of $R^{J1}$, $R^{J2}$, $R^{J3}$, $R^{J4}$, $R^{J5}$, $R^{J6}$, $R^{J7}$, $R^{J8}$, or $R^{J9}$ is a substituent represented by the following General Formula (W).

In General Formula (K), $X^{K1}$ and $X^{K2}$ represent an oxygen atom, a sulfur atom, a selenium atom, or $NR^{K9}$. $X^{K3}$ and $X^{K4}$ represent an oxygen atom, a sulfur atom, or a selenium atom. $X^{K1}$, $X^{K2}$, $X^{K3}$, and $X^{K4}$ preferably represent a sulfur atom. $R^{K1}$ to $R^{K9}$ represent a hydrogen atom or a substituent. At least one of $R^{K1}$, $R^{K2}$, $R^{K3}$, $R^{K4}$, $R^{K5}$, $R^{K6}$, $R^{K7}$, $R^{K8}$, or $R^{K9}$ is a substituent represented by the following General Formula (W).

In General Formula (L), $X^{L1}$ and $X^{L2}$ represent an oxygen atom, a sulfur atom, or $NR^{L11}$. $X^{L1}$ and $X^{L2}$ preferably represent an oxygen atom or a sulfur atom. $R^{L1}$ to $R^{L11}$ represent a hydrogen atom or a substituent, and at least one of $R^{L1}$, $R^{L2}$, $R^{L3}$, $R^{L4}$, $R^{L5}$, $R^{L6}$, $R^{L7}$, $R^{L8}$, $R^{L9}$, $R^{L10}$, or $R^{L11}$ is a substituent represented by the following General Formula (W).

In General Formula (M), $X^{M1}$ and $X^{M2}$ represent an oxygen atom, a sulfur atom, a selenium atom, or $NR^{M9}$. $X^{M1}$ and $X^{M2}$ preferably represent a sulfur atom. $R^{M1}$ to $R^{M9}$ represent a hydrogen atom or a substituent. At least one of $R^{M1}$, $R^{M2}$, $R^{M3}$, $R^{M4}$, $R^{M5}$, $R^{M6}$, $R^{M7}$, $R^{M8}$, or $R^{M9}$ is a substituent represented by the following General Formula (W).

In General Formula (N), $X^{N1}$ and $X^{N2}$ represent an oxygen atom, a sulfur atom, a selenium atom, or $NR^{N13}$. $X^{N1}$ and $X^{N2}$ preferably represent a sulfur atom. $R^{N1}$ to $R^{N13}$ represent a hydrogen atom or a substituent. At least one of $R^{N1}$, $R^{N2}$, $R^{N3}$, $R^{N4}$, $R^{N5}$, $R^{N6}$, $R^{N7}$, $R^{N8}$, $R^{N9}$, $R^{N10}$, $R^{N11}$, $R^{N12}$, or $R^{N13}$ is a substituent represented by the following General Formula (W).

In General Formula (P), $X^{P1}$ and $X^{P2}$ represent an oxygen atom, a sulfur atom, a selenium atom, or $NR^{P13}$. $X^{P1}$ and $X^{P2}$ preferably represent a sulfur atom. $R^{P1}$ to $R^{P13}$ represent a hydrogen atom or a substituent. At least one of $R^{P1}$, $R^{P2}$, $R^{P3}$, $R^{P4}$, $R^{P5}$, $R^{P6}$, $R^{P7}$, $R^{P8}$, $R^{P9}$, $R^{P10}$, $R^{P11}$, $R^{P12}$, or $R^{P13}$ is a substituent represented by the following General Formula (W).

In General Formula (Q), $X^{Q1}$ and $X^{Q2}$ represent an oxygen atom, a sulfur atom, a selenium atom, or $NR^{Q13}$. $X^{Q1}$ and $X^{Q2}$ preferably represent a sulfur atom. $R^{Q1}$ to $R^{Q13}$; represent a hydrogen atom or a substituent. At least one of $R^{Q1}$, $R^{Q2}$, $R^{Q3}$, $R^{Q4}$, $R^{Q5}$, $R^{Q6}$, $R^{Q7}$, $R^{Q8}$, $R^{Q9}$, $R^{Q10}$, $R^{Q11}$, $R^{Q12}$, or $R^{Q13}$ is a substituent represented by the following General Formula (W).

In General Formula (R), $X^{R1}$, $X^{R2}$, and $X^{R3}$ represent an oxygen atom, a sulfur atom, a selenium atom, or $NR^{R9}$. $X^{R1}$, $R^{X2}$, and $X^{R3}$ preferably represent a sulfur atom. $R^{R1}$ to $R^{R9}$ represent a hydrogen atom or a substituent. At least one of $R^{R1}$, $R^{R2}$, $R^{R3}$, $R^{R4}$, $R^{R5}$, $R^{R6}$, $R^{R7}$, $R^{R8}$, or $R^{R9}$ is a substituent represented by the following General Formula (W).

In General Formula (S), $X^{S1}$, $X^{S2}$, $X^{S3}$, and $X^{S4}$ represent an oxygen atom, a sulfur atom, a selenium atom, or $NR^{S7}$. $X^{S1}$, $X^{S2}$, $X^{S3}$, and $X^{S4}$ preferably represent a sulfur atom. $R^{S1}$ to $R^{S7}$ represent a hydrogen atom or a substituent. At least one of $R^{S1}$, $R^{S2}$, $R^{S3}$, $R^{S4}$, $R^{S5}$, $R^{S6}$, or $R^{S7}$ is a substituent represented by the following General Formula (W).

In General Formula (T), $X^{T1}$, $X^{T2}$, $X^{T3}$, and $X^{T4}$ represent an oxygen atom, a sulfur atom, a selenium atom, or $NR^{T7}$. $X^{T1}$, $X^{T2}$, $X^{T3}$, and $X^{T4}$ preferably represent a sulfur atom. $R^{T1}$ to $R^{T7}$ represent a hydrogen atom or a substituent. At least one of $R^{T1}$, $R^{T2}$, $R^{T3}$, $R^{T4}$, $R^{T5}$, $R^{T6}$, or $R^{T7}$ is a substituent represented by the following General Formula (W).

In the above-described General Formulae (C) to (T), $R^{C1}$ to $R^{C6}$, $R^{D1}$ to $R^{D8}$, $R^{E1}$ to $R^{E8}$, $R^{F1}$ to $R^{F10}$, $R^{Fa}$ and $R^{Fb}$, $R^{G1}$ to $R^{G8}$, $R^{H1}$ to $R^{H6}$, $R^{J1}$ to $R^{J9}$, $R^{K1}$ to $R^{K9}$, $R^{L1}$ to $R^{L11}$, $R^{M1}$ to $R^{M9}$, $R^{N1}$ to $R^{N13}$, $R^{P1}$ to $R^{P13}$, $R^{Q1}$ to $R^{Q13}$, $R^{R1}$ to $R^{R9}$, $R^{S1}$ to $R^{S7}$, and $R^{T1}$ to $R^{T7}$ (hereinafter referred to as substituents $R^C$ to $R^T$), each of which represents a hydrogen atom or a substituent, will be described below.

Examples of the substituent that can be taken by substituents $R^C$ to $R^T$ include a halogen atom, an alkyl group (an alkyl group having 1 to 40 carbon atoms, such as methyl, ethyl, propyl, butyl, pentyl, hexyl, heptyl, octyl, nonyl, decyl, undecyl, dodecyl, tridecyl, tetradecyl, and pentadecyl, but including 2,6-dimethyloctyl, 2-decyltetradecyl, 2-hexyldodecyl, 2-ethyloctyl, 2-butyldecyl, 1-octylnonyl, 2-octyltetradecyl, 2-ethylhexyl, cycloalkyl, bicycloalkyl, tricycloalkyl, and the like), an alkenyl group (including 1-pentenyl, a cycloalkenyl, a bicycloalkenyl, and the like), an alkynyl group (including 1-pentynyl, trimethylsilylethynyl, triethylsilylethynyl, tri-i-propylsilylethynyl, 2-p-propylphenylethynyl, and the like), an aryl group (including an aryl group having 6 to 20 carbon atoms, such as phenyl, naphthyl, p-pentylphenyl, 3,4-dipentylphenyl, p-heptoxyphenyl, and 3,4-diheptoxyphenyl), a heterocyclic group (which may be referred to as a hetero ring group, and including 2-hexylfuranyl, and the like), a cyano group, a hydroxy group, a nitro group, an acyl group (including hexanoyl, benzoyl, and the like), an alkoxy group (including butoxy and the like), an aryloxy group, a silyloxy group, a heterocyclic oxy group, an acyloxy group, a carbamoyloxy group, an amino group (including an anilino group), an acylamino group, an aminocarbonylamino group (including a ureido group), an alkoxy- and aryloxycarbonylamino group, an alkyl- and arylsulfonylamino group, a mercapto group, an alkyl- and arylthio group (including methylthio, octylthio, and the like), a heterocyclic thio group, a sulfamoyl group, a sulfo group, an alkyl- and arylsulfinyl group, alkyl- and an arylsulfonyl group, an alkyl- and aryloxycarbonyl group, a carbamoyl group, aryl and heterocyclic azo group, an imido group, a phosphino group, a phosphinyl group, a phosphinyloxy group, a phosphinylamino group, a phosphono group, a silyl group (ditrimethylsiloxymethylbutoxy group, or the like), a hydrazino group, a ureido group, a boronic acid group ($-B(OH)_2$), a phosphato group ($-OPO(OH)_2$), a sulfato group ($-OSO_3H$), and other known substituents.

These substituents may further have the above-described substituents.

Among these, the substituent that can be taken by substituents $R^C$ to $R^T$ is preferably an alkyl group, an aryl group, an alkenyl group, an alkynyl group, a heterocyclic group, an alkoxy group, an alkylthio group, or a group represented by General Formula (W) to be described hereinafter, more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, or a group represented by General Formula (W) to be described hereinafter, particularly preferably a group represented by General Formula (W) to be described hereinafter.

The alkyl group, alkenyl group, alkynyl group, acyl group, and aryl group of $R^{D9}$, $R^{G9}$, and $R^{H7}$ have the same definitions as the alkyl group, alkenyl group, alkynyl group, acyl group, and aryl group described in the substituents that can be taken by substituents $R^C$ to $R^T$, respectively.

Further, the heteroaryl group has the same definition as the heteroaryl group described for the substituents of $R^{41}$ to $R^{46}$.

The group represented by General Formula (W): -L-$R^w$ will be described.

In General Formula (W), L represents a divalent linking group represented by any one of the following General Formulae (L-1) to (L-25), or a divalent linking group in which two or more (preferably two to ten, more preferably two to six, and still more preferably two or three) divalent linking groups represented by any one of the following General Formulae (L-1) to (L-25) are bonded to each other. $R^w$ represents a substituted or unsubstituted alkyl group, a cyano group, a vinyl group, an ethynyl group, an oxyethylene group, an oligooxyethylene group in which the number v of repeats of oxyethylene units is 2 or more, a siloxane group, an oligosiloxane group in which the number of silicon atoms is 2 or more, or a substituted or unsubstituted trialkylsilyl group.

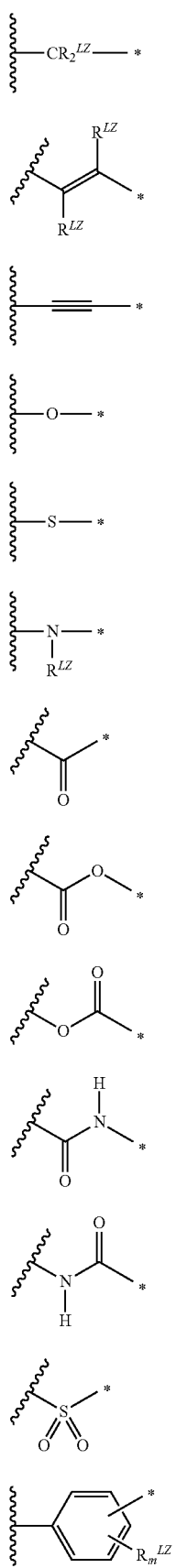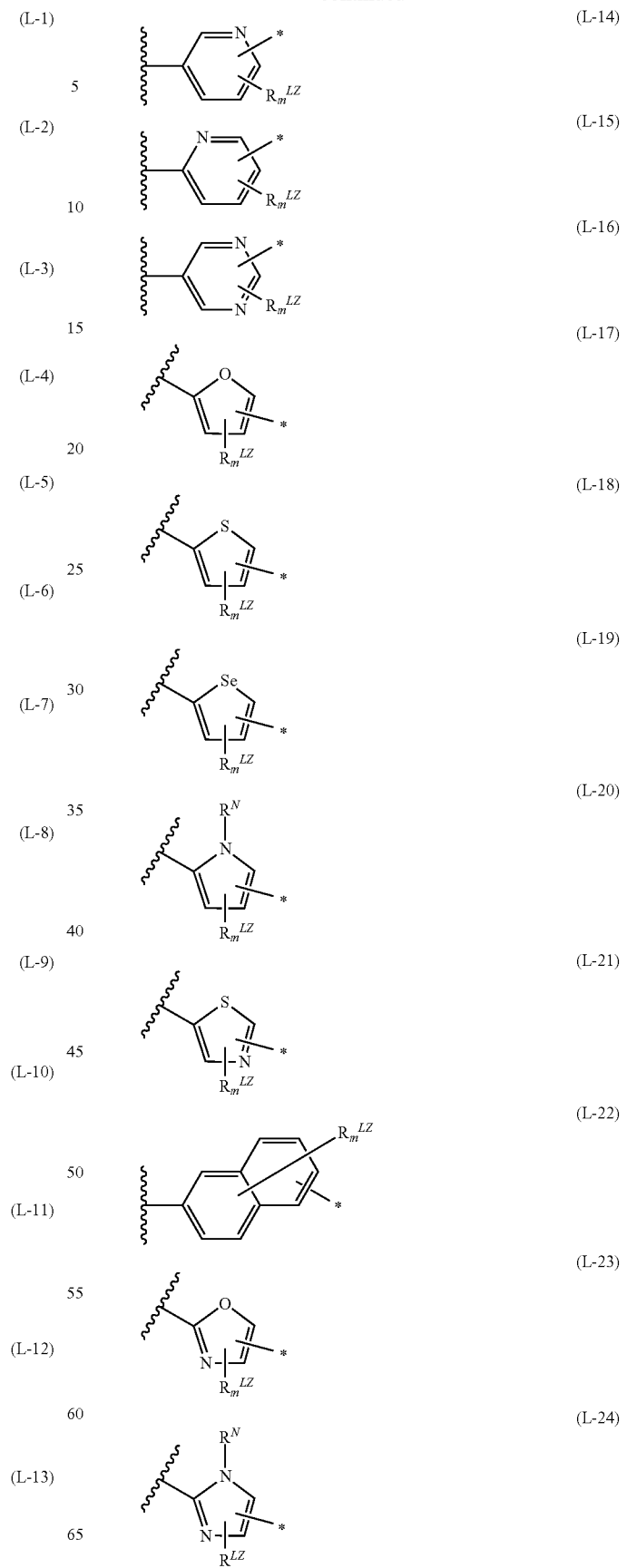

(L-25)

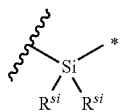

(L-20A)

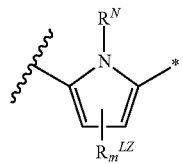

(L-21A)

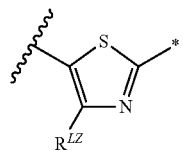

(L-23A)

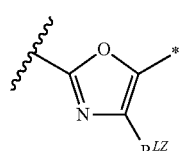

(L-24A)

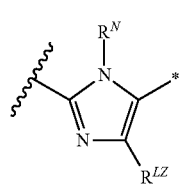

In General Formulae (L-1) to (L-25), the wavy line portion indicates a position of bonding to any one of the rings forming each skeleton represented by the above-described General Formulae (C) to (T). In the present specification, in the case where L represents a divalent linking group in which two or more divalent linking groups represented by any one of General Formulae (L-1) to (L-25) are bonded to each other, a wavy line portion may indicate a position of bonding to any one of the rings forming each skeleton represented by the above-described General Formulae (C) to (T) and a position of bonding to any one of divalent linking groups represented by General Formulae (L-1) to (L-25).

* indicates a position of connecting to $R^w$ or a position of bonding to the wavy line portion of General Formulae (L-1) to (L-25).

m in General Formula (L-13) represents 4, m in General Formulae (L-14) and (L-15) represents 3, m in General Formulae (L-16) to (L-20) represents 2, and m in General Formula (L-22) represents 6.

$R^{LZ}$'s in General Formulae (L-1), (L-2), (L-6) and (L-13) to (L19), and (L-21) to (L-24) each independently represent a hydrogen atom or a substituent, and each of $R^{LZ}$'s in General Formula (L-1) and (L-2) may be bonded to $R^w$ adjacent to L to form a fused ring.

$R^N$ represents a hydrogen atom or a substituent, and $R^{si}$'s each independently represent a hydrogen atom, an alkyl group, an alkenyl group, or an alkynyl group.

Among them, the divalent linking group represented by General Formulae (L-17) to (L-21), (L-23), and (L-24) is more preferably a divalent linking group represented by the following General Formulae (L-17A) to (L-21A), (L-23A), and (L-24A).

(L-17A)

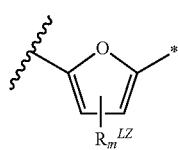

(L-18A)

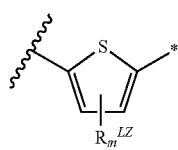

(L-19A)

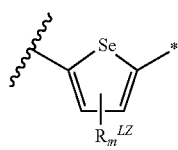

Here, in the case where a substituted or unsubstituted alkyl group, an oxyethylene group, an oligooxyethylene group in which the number v of repeats of oxyethylene units is 2 or more, a siloxane group, an oligosiloxane group in which the number of silicon atoms is 2 or more, or a substituted or unsubstituted trialkylsilyl group is present at the terminal of the substituent, it may be interpreted as —$R^w$ alone in General Formula (W), or may also be interpreted as -L-$R^w$ in General Formula (W).

In the present invention, in the case where a substituted or unsubstituted alkyl group having an N number of carbon atoms as the main chain is present at the terminal of the substituent, it is interpreted as -L-$R^w$ in General Formula (W) after containing a linking group as possible as from the terminal of the substituent and is not interpreted as —$R^w$ alone in General Formula (W). Specifically, it is interpreted as a substituent in which "one (L-1) corresponding to L in General Formula (W)" and "a substituted or unsubstituted alkyl group having an N–1 number of carbon atoms as the main chain corresponding to $R^w$ in General Formula (W)" are bonded to each other. For example, in the case where an n-octyl group which is an alkyl group having 8 carbon atoms is present at the terminal of the substituent, it is interpreted as a substituent in which one (L-1) in which two $R^{LZ}$'s are a hydrogen atom and an n-heptyl group having 7 carbon atoms are bonded to each other. Further, in the case where the substituent represented by General Formula (W) is an alkoxy group having 8 carbon atoms, it is interpreted as a substituent in which one linking group represented by General Formula (L-4), which is —O—, one linking group represented by (L-1) in which two $R^{LZ}$'s are a hydrogen atom, and an n-heptyl group having 7 carbon atoms are bonded to each other.

On the other hand, in the present invention, in the case where an oxyethylene group, an oligooxyethylene group in which the number v of repeats of oxyethylene units is 2 or more, a siloxane group, an oligosiloxane group in which the number of silicon atoms is 2 or more, or a substituted or unsubstituted trialkylsilyl group is present at the terminal of the substituent, it is interpreted as —$R^w$ alone in General Formula (W) after containing a linking group as possible as from the terminal of the substituent. For example, in the case where a —(OCH$_2$CH$_2$)—(OCH$_2$CH$_2$)—(OCH$_2$CH$_2$)—OCH$_3$ group is present at the terminal of the substituent, it is interpreted as a substituent of an oligooxyethylene group alone in which the number v of repeats of oxyethylene units is 3.

In the case where L forms a linking group to which divalent linking groups represented by any one of General Formulae (L-1) to (L-25) are bonded to each other, the number of bonding of the divalent linking groups represented by any one of General Formulae (L-1) to (L-25) is 2 to 4, and more preferably 2 or 3.

Examples of the substituent $R^{LZ}$ in General Formulae (L-1), (L-2), (L-6), and (L-13) to (L-24) include those exemplified as the substituents which can be taken by substituents $R^C$ to $R^T$ in General Formulae (C) to (T). Among them, the substituent $R^{LZ}$ in General Formula (L-6) is preferably an alkyl group, and in the case where the substituent $R^{LZ}$ in General Formula (L-6) is an alkyl group, the number of carbon atoms in the alkyl group is preferably 1 to 9, and from the viewpoint of chemical stability and carrier transportability, is more preferably 4 to 9 and still more preferably 5 to 9. In the case where the substituent $R^{LZ}$ in General Formula (L-6) is an alkyl group, the alkyl group is preferably a linear alkyl group from the viewpoint capable of enhancing the carrier mobility.

Examples of $R^N$ include those exemplified as the substituents which can be taken by substituents $R^C$ to $R^T$. Among them, $R^N$ is preferably a hydrogen atom or a methyl group.

$R^{si}$ is preferably an alkyl group. Although the alkyl group which can be taken by $R^{si}$ is not particularly limited, a preferred range of the alkyl group which can be taken by $R^{si}$ is the same as the preferred range of the alkyl group which can be taken by the silyl group in the case where $R^w$ is a silyl group. Although the alkenyl group which can be taken by $R^{si}$ is not particularly limited, it is preferably a substituted or unsubstituted alkenyl group, more preferably a branched alkenyl group, and the number of carbon atoms in the alkenyl group is preferably 2 to 3. Although the alkynyl group which can be taken by $R^{si}$ is not particularly limited, it is preferably a substituted or unsubstituted alkynyl group, more preferably a branched alkynyl group, and the number of carbon atoms in the alkynyl group is preferably 2 to 3.

L is preferably a divalent linking group represented by any one of General Formula (L-1) to (L-5), (L-13), (L-17), or (L-18), or a divalent linking group in which two or more divalent linking groups represented by any one of General Formula (L-1) to (L-5), (L-13), (L-17), or (L-18) are bonded to each other; more preferably a divalent linking group represented by any one of General Formula (L-1), (L-3), (L-13), or (L-18), or a divalent linking group in which two or more divalent linking groups represented by General Formula (L-1), (L-3), (L-13), or (L-18) are bonded to each other; and particularly preferably a divalent linking group represented by General Formula (L-1), (L-3), (L-13), or (L-18), or a divalent linking group in which a divalent linking group represented by any one of General Formula (L-3), (L-13), or (L-18) and a divalent linking group represented by General Formula (L-1) are bonded to each other. In the divalent linking group in which a divalent linking group represented by any one of General Formula (L-3), (L-13), or (L-18) and a divalent linking group represented by General Formula (L-1) are bonded to each other, the divalent linking group represented by General Formula (L-1) is preferably bonded to the $R^w$ side.

From the viewpoint of chemical stability and carrier transportability, particularly preferred is a divalent linking group containing a divalent linking group represented by General Formula (L-1); more particularly preferred is a divalent linking group represented by General Formula (L-1); still more particularly preferred is that L is a divalent linking group represented by General Formulae (L-18) and (L-1) and is bonded to $R^w$ via (L-1), and $R^w$ is a substituted or unsubstituted alkyl group; and even more particularly preferred is that L is a divalent linking group represented by General Formulae (L-18A) and (L-1) and is bonded to $R^w$ via (L-1), and $R^w$ is a substituted or unsubstituted alkyl group.

In General Formula (W), $R^w$ is preferably a substituted or unsubstituted alkyl group. In General Formula (W), in the case where L adjacent to $R^w$ is a divalent linking group represented by General Formula (L-1), $R^w$ is preferably a substituted or unsubstituted alkyl group, an oxyethylene group, an oligooxyethylene group in which the number v of repeats of oxyethylene units is 2 or more, a siloxane group, or an oligosiloxane group in which the number of silicon atoms is 2 or more, and more preferably a substituted or unsubstituted alkyl group.

In General Formula (W), in the case where L adjacent to $R^w$ is a divalent linking group represented by General Formulae (L-2) and (L-4) to (L-25), $R^w$ is more preferably a substituted or unsubstituted alkyl group.

In General Formula (W), in the case where L adjacent to $R^w$ is a divalent linking group represented by General Formula (L-3), $R^w$ is preferably a substituted or unsubstituted alkyl group, or a substituted or unsubstituted silyl group.

In the case where $R^w$ is a substituted or unsubstituted alkyl group, the number of carbon atoms in the alkyl group is preferably 4 to 17, and from the viewpoint of chemical stability and carrier transportability, is more preferably 6 to 14 and still more preferably 6 to 12. It is preferred that $R^w$ is a long-chain alkyl group falling within the above-specified range, particularly a long-chain linear alkyl group, from the viewpoint of enhancing linearity of the molecule and thus increasing carrier mobility.

In the case where $R^w$ represents an alkyl group, the alkyl group may be a linear alkyl group, a branched alkyl group, or a cyclic alkyl group, but it is preferably a linear alkyl group, from the viewpoint of enhancing linearity of the molecule and thus increasing carrier mobility.

Among them, the combination of $R^w$ and L in General Formula (W) is preferably a combination in which L in General Formulae (C) to (T) is a divalent linking group represented by General Formula (L-1), and $R^w$ is a linear alkyl group having 4 to 17 carbon atoms; or a combination in which L is a divalent linking group in which a divalent linking group represented by any one of General Formula (L-3), (L-13), or (L-18) and a divalent linking group represented by General Formula (L-1) are bonded to each other, and $R^w$ is a linear alkyl group, from the viewpoint of enhancing carrier mobility.

In the case where L is a divalent linking group represented by General Formula (L-1), and $R^w$ is a linear alkyl group having 4 to 17 carbon atoms, $R^w$ is more preferably a linear alkyl group having 6 to 14 carbon atoms from the viewpoint of enhancing carrier mobility, and particularly preferably a linear alkyl group having 6 to 12 carbon atoms.

In the case where L is a divalent linking group in which a divalent linking group represented by any one of General Formula (L-3), (L-13), or (L-18) and a divalent linking group represented by General Formula (L-1) are bonded to each other, and $R^w$ is a linear alkyl group, $R^w$ is more preferably a linear alkyl group having 4 to 17 carbon atoms, still more preferably a linear alkyl group having 6 to 14 carbon atoms from the viewpoint of chemical stability and carrier transportability, and particularly preferably a linear alkyl group having 6 to 12 carbon atoms from the viewpoint of enhancing carrier mobility.

On the other hand, $R^w$ is preferably a branched alkyl group from the viewpoint of enhancing solubility in an organic solvent.

In the case where $R^w$ is an alkyl group having a substituent, the substituent may be a halogen atom or the like, and is preferably a fluorine atom. Incidentally, in the case where $R^w$ is an alkyl group having a fluorine atom, hydrogen atoms of the alkyl group may be completely substituted with fluorine atoms to form a perfluoroalkyl group, provided that $R^w$ is preferably an unsubstituted alkyl group.

In the case where $R^w$ is an ethyleneoxy group or an oligoethyleneoxy group, the term "oligooxyethylene group" represented by $R^w$, as used herein, refers to a group represented by $-(OCH_2CH_2)_vOY$ (in which the number v of repeats of oxyethylene units represents an integer of 2 or more, and terminal Y represents a hydrogen atom or a substituent). In the case where Y at the terminal of the oligooxyethylene group is a hydrogen atom, $R^w$ becomes a hydroxy group. The number v of repeats of oxyethylene units is preferably 2 to 4, and more preferably 2 to 3. It is preferred that the terminal hydroxy group of the oligooxyethylene group is blocked, that is, Y represents a substituent. It this case, the hydroxy group is blocked with an alkyl group having 1 to 3 carbon atoms, that is, Y is preferably an alkyl group having 1 to 3 carbon atoms, more preferably a methyl group or an ethyl group, and particularly preferably a methyl group.

In the case where $R^w$ is a siloxane group or an oligosiloxane group, the number of repeats of siloxane units is preferably 2 to 4, and more preferably 2 to 3. In addition, it is preferred that a hydrogen atom or an alkyl group is bonded to Si atoms. In the case where an alkyl group is bonded to Si atoms, the number of carbon atoms in the alkyl group is preferably 1 to 3. For example, a methyl group or an ethyl group is preferably bonded to Si atoms. The same alkyl groups may be bonded to Si atoms, or different alkyl groups or hydrogen atoms may be bonded to Si atoms. Moreover, all of the siloxane units constituting the oligosiloxane group may be the same or different, but they are preferably the same.

In the case where L adjacent to $R^w$ is a divalent linking group represented by General Formula (L-3), $R^w$ is also preferably a substituted or unsubstituted silyl group. In the case where $R^w$ is a substituted or unsubstituted silyl group, inter alia, it is preferred that $R^w$ is a substituted silyl group. The substituent for the silyl group is not particularly limited, but it is preferably a substituted or unsubstituted alkyl group, and more preferably a branched alkyl group. In the case where $R^w$ is a trialkylsilyl group, the number of carbon atoms in the alkyl group bonded to Si atoms is preferably 1 to 3. For example, a methyl group, an ethyl group, or an isopropyl group is preferably bonded to Si atoms. The same or different alkyl groups may be bonded to Si atoms. In the case where $R^w$ is a trialkylsilyl group which further has a substituent on the alkyl group, such a substituent is not particularly limited.

In General Formula (W), the total number of carbon atoms contained in L and $R^w$ is preferably 5 to 18. If the total number of carbon atoms contained in L and $R^w$ is higher than or equal to the lower limit of the above-specified range, the carrier mobility is increased to thereby lower a driving voltage. If the total number of carbon atoms contained in L and $R^w$ is lower than or equal to the upper limit of the above-specified range, solubility in an organic solvent increases.

The total number of carbon atoms contained in L and $R^w$ is preferably 5 to 14, more preferably 6 to 14, particularly preferably 6 to 12, and more particularly preferably 8 to 12.

Among substituents $R^C$ to $R^T$ in each compound represented by General Formulae (C) to (T), the number of groups represented by General Formula (W) is preferably 1 to 4, more preferably 1 or 2, and particularly preferably 2, from the viewpoint of increasing carrier mobility and enhancing solubility in an organic solvent.

There is no particular limitation on the position of a group represented by General Formula (W), among substituents $R^C$ to $R^T$.

In the compound represented by General Formula (C), it is preferred that any one of $R^{c1}$, $R^{C2}$, $R^{C3}$, and $R^{C6}$ is a group represented by General Formula (W), and it is more preferred that both of $R^{C1}$ and $R^{C2}$ or both of $R^{C3}$ and $R^{C6}$ are a group represented by General Formula (W).

In the compound represented by General Formula (D), it is preferred that $R^{D6}$ is a group represented by General Formula (W), and it is more preferred that both of $R^{D5}$ and $R^{D6}$ are a group represented by General Formula (W).

In the compound represented by General Formula (E), it is preferred that $R^{E6}$ is a group represented by General Formula (W), and it is more preferred that both of $R^{E5}$ and $R^{E6}$ are a group represented by General Formula (W). Further, in the case where $R^{E5}$ and $R^{E6}$ are a substituent other than the group represented by General Formula (W), it is also preferred that two $R^{E7}$'s are a group represented by General Formula (W).

In the compound represented by General Formula (F), it is preferred that at least one of $R^{F2}$, $R^{F3}$, $R^{F8}$, or $R^{F9}$ is a substituent represented by General Formula (W).

In the compound represented by General Formula (G), it is preferred that $R^{G5}$ or $R^{G6}$ is a group represented by General Formula (W), from the viewpoint of increasing carrier mobility and enhancing solubility in an organic solvent.

In the compound represented by General Formula (H), it is preferred that $R^{H4}$ or $R^{H6}$ is a group represented by General Formula (W), and it is more preferred that $R^{H4}$ or $R^{H6}$, and $R^{H3}$ or $R^{H5}$ are a group represented by General Formula (W).

In the compound represented by General Formula (J), it is preferred that $R^{J8}$ is a group represented by General Formula (W), and it is more preferred that both of $R^{J8}$ and $R^{J4}$ are a group represented by General Formula (W).

In the compound represented by General Formula (K), it is preferred that $R^{K7}$ is a group represented by General Formula (W), and it is more preferred that both of $R^{K7}$ and $R^{K3}$ are a group represented by General Formula (W).

In the compound represented by General Formula (L), it is more preferred that at least one of $R^{L2}$, $R^{L3}$, $R^{L6}$, or $R^{L7}$ is a group represented by General Formula (W).

In the compound represented by General Formula (M), it is preferred that $R^{M2}$ is a group represented by General Formula (W), and it is more preferred that both of $R^{M2}$ and $R^{M6}$ are a group represented by General Formula (W).

In the compound represented by General Formula (N), it is preferred that $R^{N3}$ is a group represented by General Formula (W), and it is more preferred that both of $R^{N3}$ and $R^{N9}$ are a group represented by General Formula (W).

In the compound represented by General Formula (P), it is preferred that $R^{P2}$ or $R^{P3}$ is a group represented by General Formula (W), and it is more preferred that both of $R^{P2}$ and $R^{P8}$ or both of $R^{P3}$ and $R^{P9}$ are a group represented by General Formula (W).

In the compound represented by General Formula (Q), it is preferred that $R^{Q3}$ is a group represented by General Formula (W), and it is more preferred that both of $R^{Q3}$ and $R^{Q9}$ are a group represented by General Formula (W).

In the compound represented by General Formula (R), it is preferred that $R^{R2}$ is a group represented by General Formula (W), and it is more preferred that both of $R^{R2}$ and $R^{R7}$ are a group represented by General Formula (W).

In the compound represented by General Formula (S), it is preferred that $R^{S2}$ is a group represented by General Formula (W), and it is more preferred that both of $R^{S2}$ and $R^{S5}$ are a group represented by General Formula (W).

In the compound represented by General Formula (T), it is preferred that $R^{T2}$ is a group represented by General Formula (W), and it is more preferred that both of $R^{T2}$ and $R^{T5}$ are a group represented by General Formula (W).

The number of substituents other than the group represented by General Formula (W), among substituents $R^C$ to $R^T$, is preferably 0 to 4, and more preferably 0 to 2.

Specific examples of each compound represented by General Formula (C) to Formula (T) are shown below, but compounds that can be used in the present invention should not be construed to be limited thereby.

Specific examples of compound C represented by General Formula (C) are shown below.

Compound C1

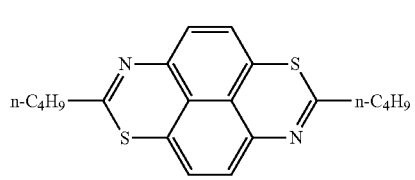

Compound C2

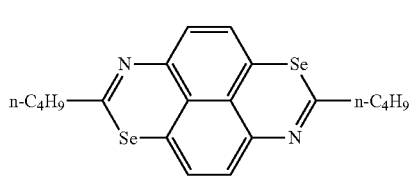

Compound C3

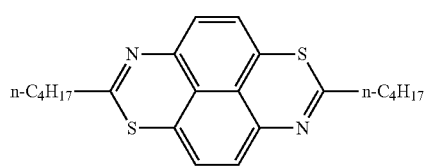

Compound C4

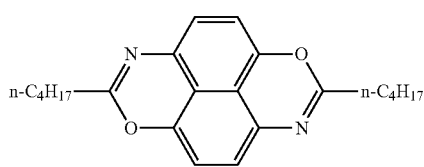

Compound C5

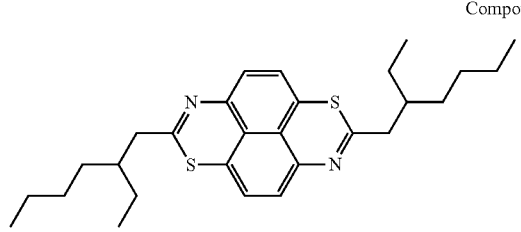

Compound C6

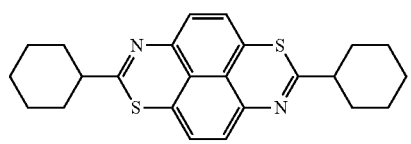

Compound C7

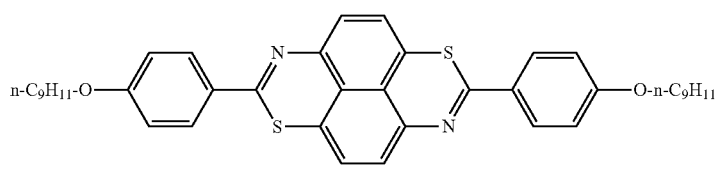

Compound C8

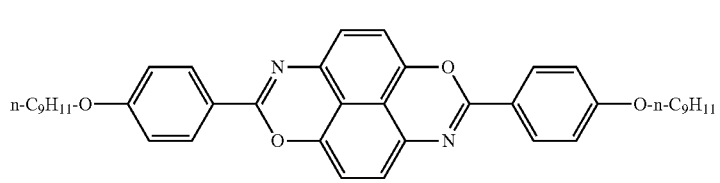

Compound C9

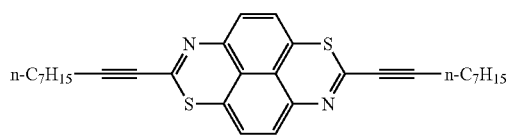

Compound C10

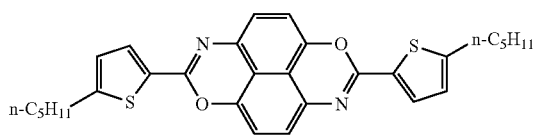

-continued
Compound C11
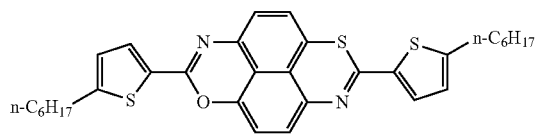
Compound C12
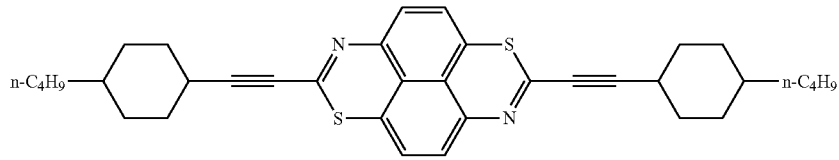
Compound C13
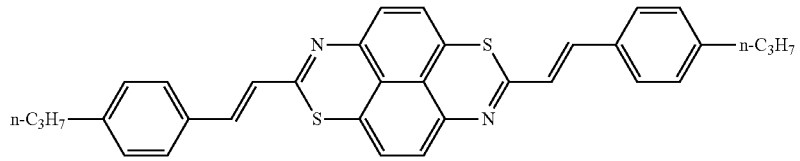
Compound C14
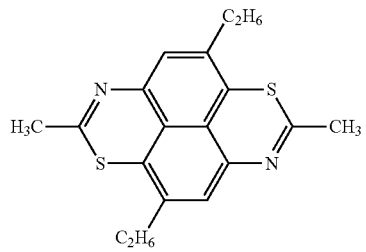
Compound C15
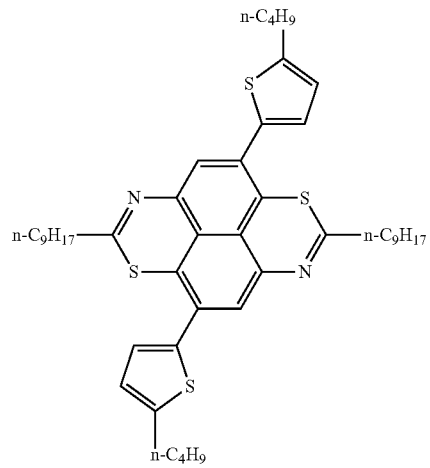
Compound C16
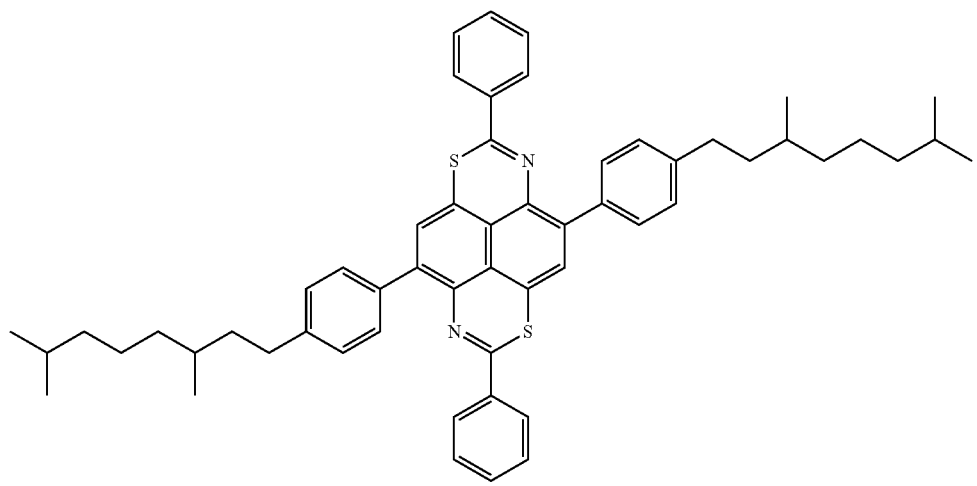

-continued

Compound C17

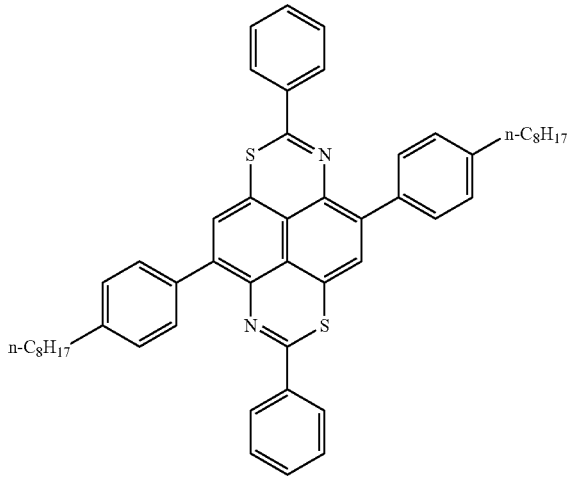

The compound represented by Formula (C) preferably has a molecular weight of 3,000 or less, more preferably 2,000 or less, still more preferably 1,000 or less, and particularly preferably 850 or less. If the molecular weight is within the above-specified range, it is possible to increase solubility in a solvent.

On the other hand, the molecular weight is preferably 300 or more, more preferably 350 or more, and still more preferably 400 or more, from the viewpoint of film quality stability of a thin film.

Specific examples of compound D represented by General Formula (D) are shown below.

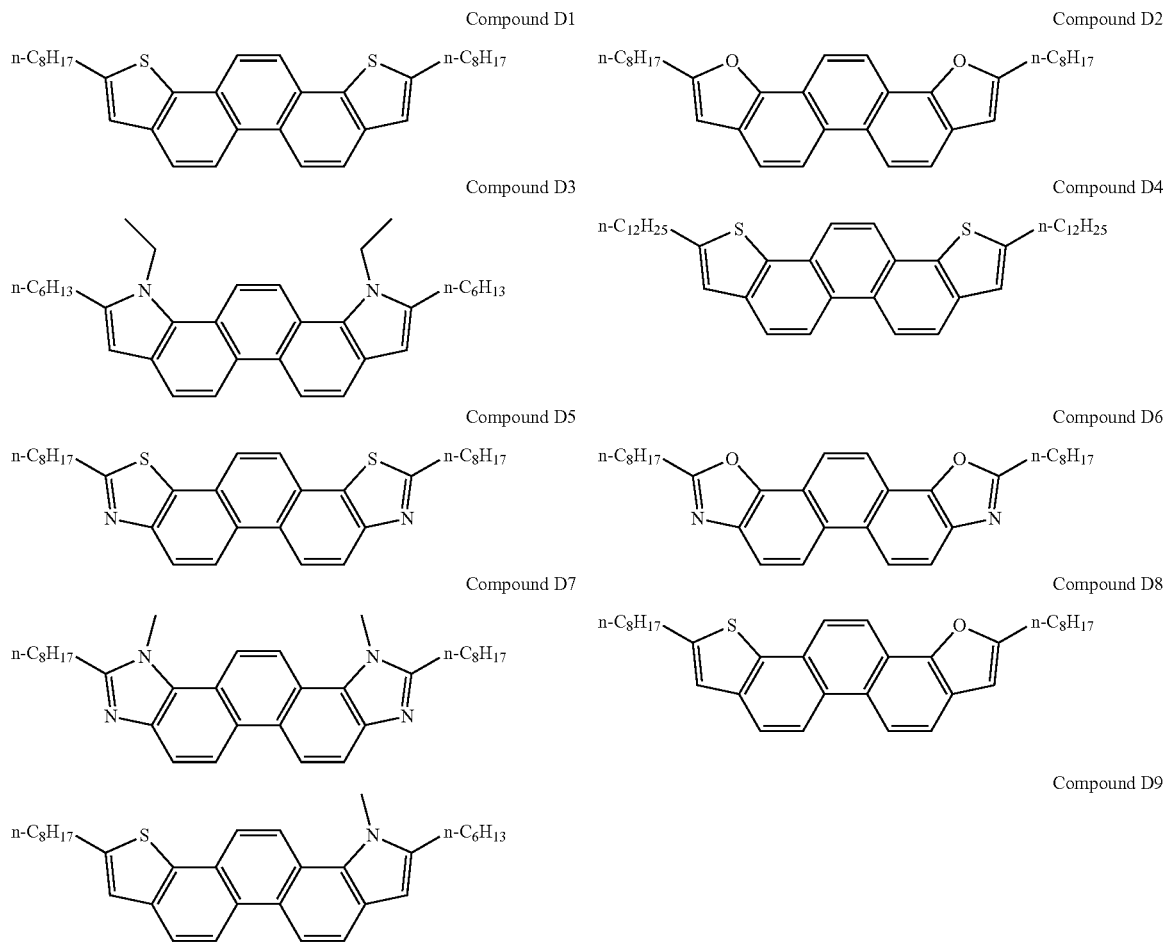

Compound D1

Compound D2

Compound D3

Compound D4

Compound D5

Compound D6

Compound D7

Compound D8

Compound D9

Compound D10

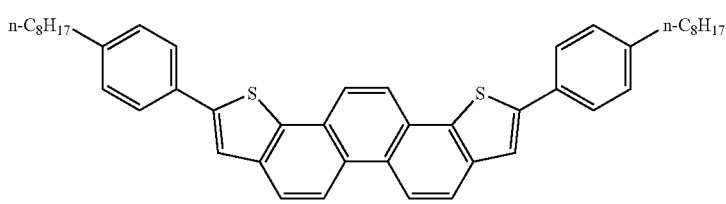

Compound D11

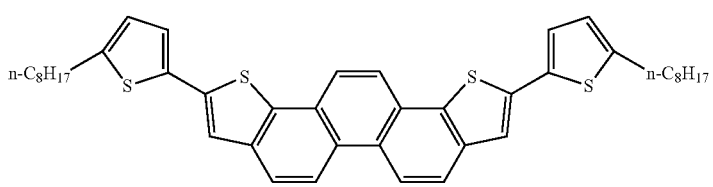

Compound D12

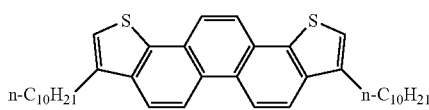

Compound D13

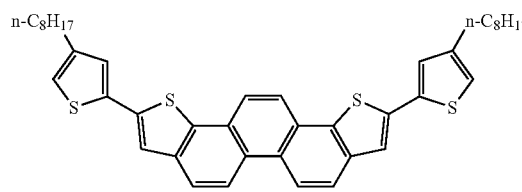

Compound D14

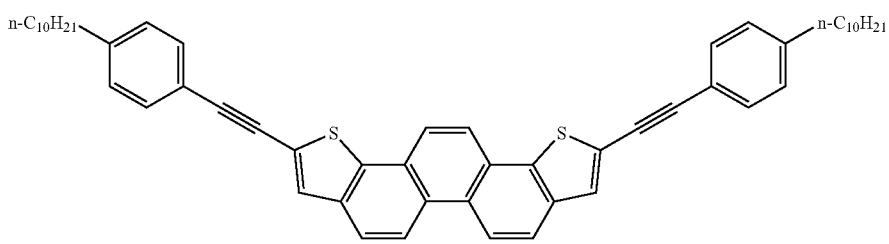

Compound D15

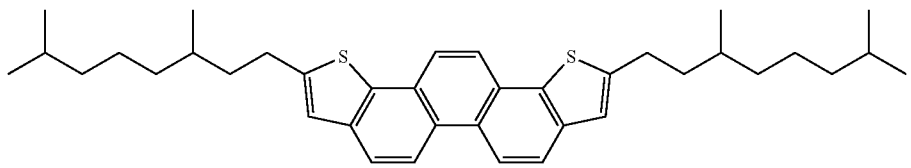

Compound D16

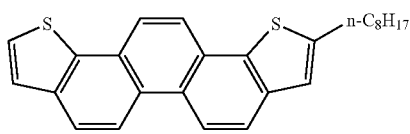

With regard to the molecular weight of the compound represented by General Formula (D), the upper limit thereof is preferably the same as that of the compound represented by General Formula (C), whereby solubility in a solvent can be increased. On the other hand, the molecular weight is preferably 400 or more, more preferably 450 or more, and still more preferably 500 or more, from the viewpoint of film quality stability of a thin film.

Specific examples of each of compound E represented by General Formula (E), compound F represented by General Formula (F), compound G represented by General Formula (G), and compound H represented by General Formula (H) are shown in order.

Compound E1

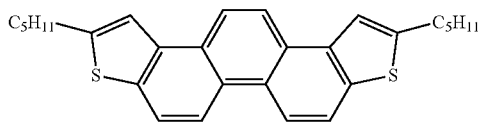

Comound E2

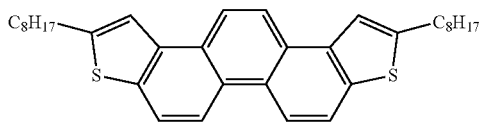

-continued
Compound E3
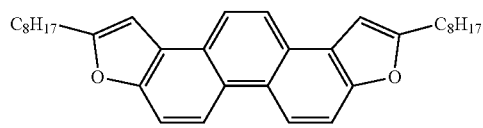
Compound E4
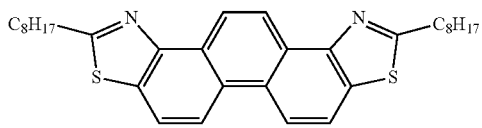
Compound E5
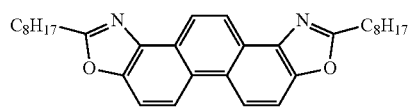
Compound E6
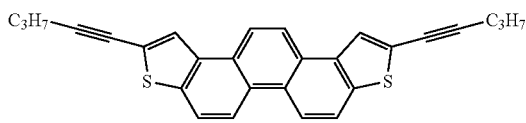
Compound E7
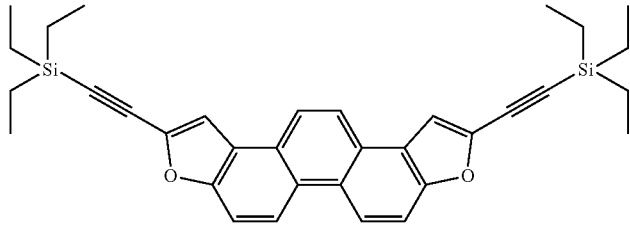
Compound E8
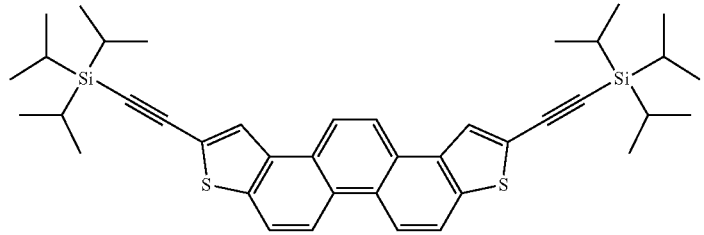
Compound E9
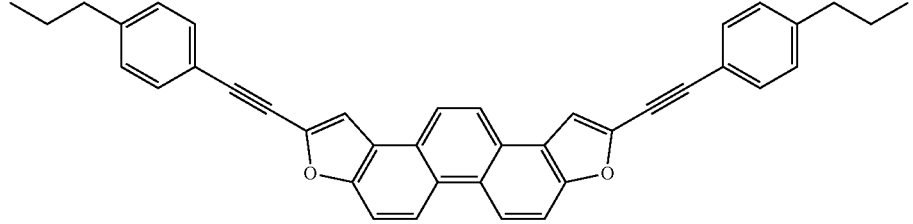
Compound E10
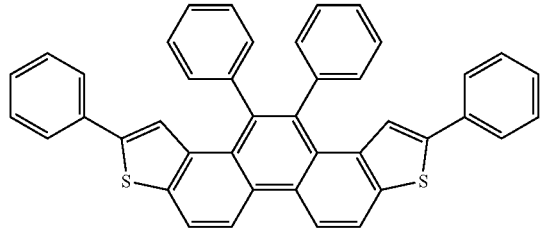
Compound E11
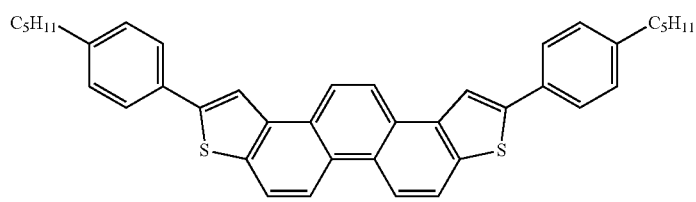

-continued
Compound E12
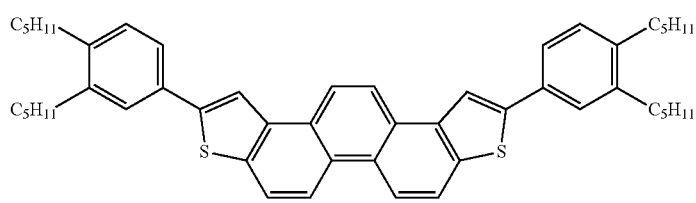
Compound E13
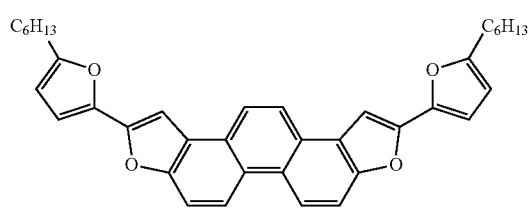
Compound E14
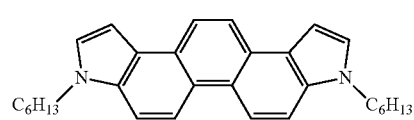
Compound F1
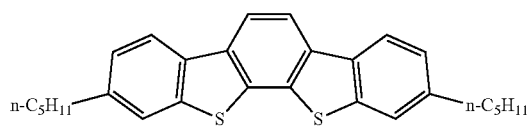
Compound F2
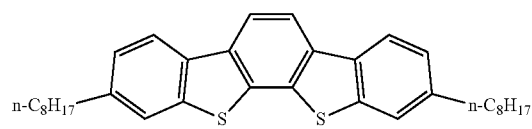
Compound F3
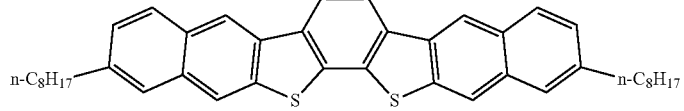
Compound F4
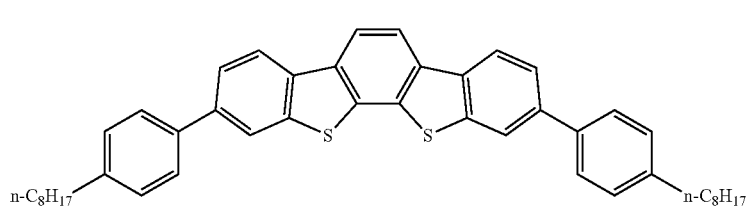
Compound F5
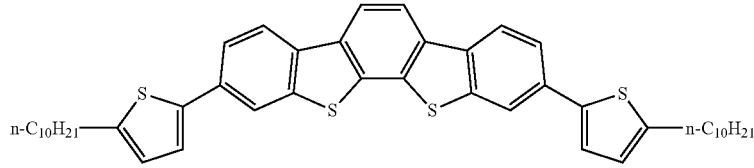
Compound F6
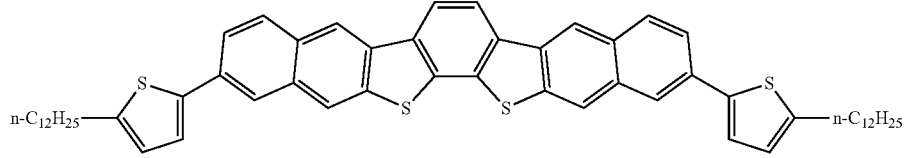
Compound F7
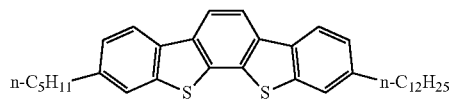
Compound F8
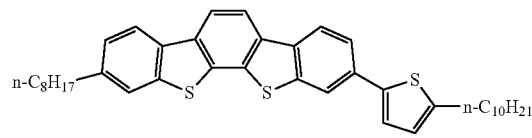
Compound F9
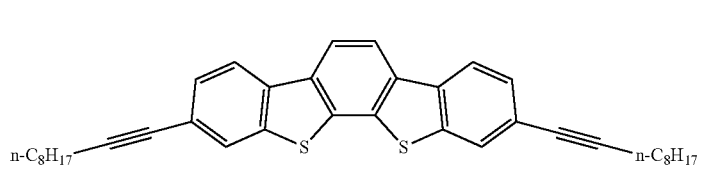

Compound F10
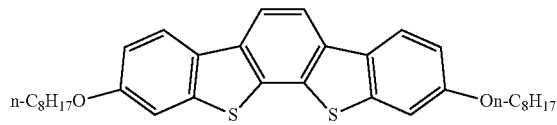
Compound F11
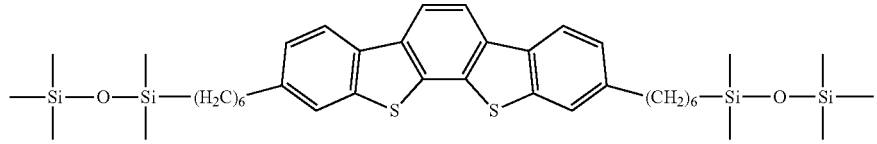
Compound F12
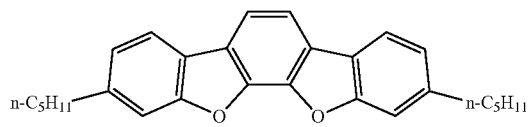
Compound G1
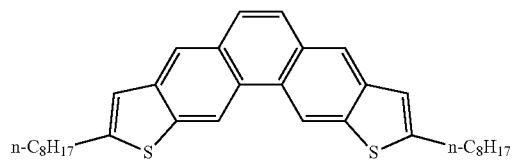
Compound G2
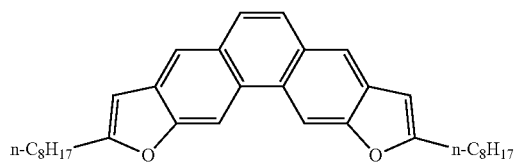
Compound G3
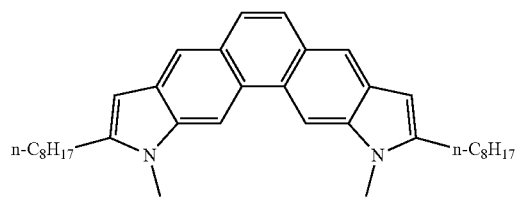
Compound G4
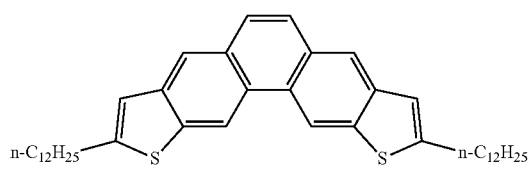
Compound G5
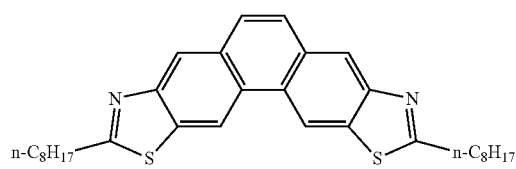
Compound G6
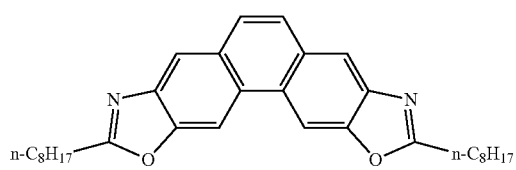
Compound G7
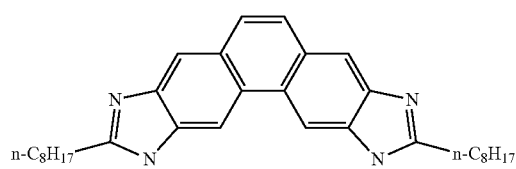
Compound G8
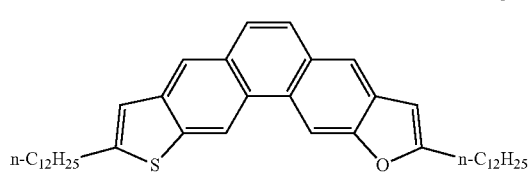
Compound G9
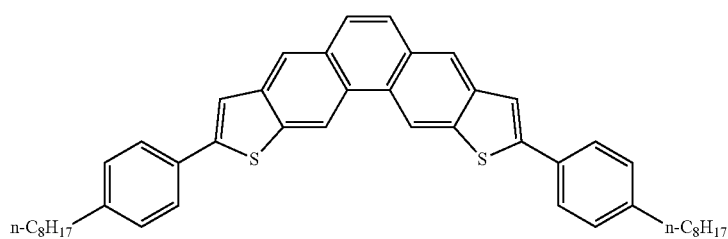
Compound G10

-continued
Compound G11
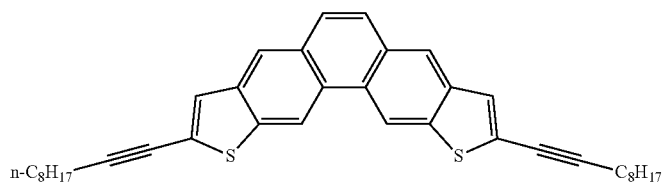
Compound G12
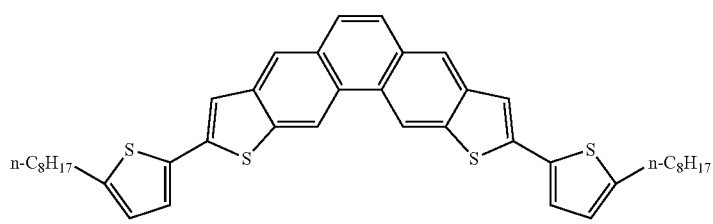
Compound G13
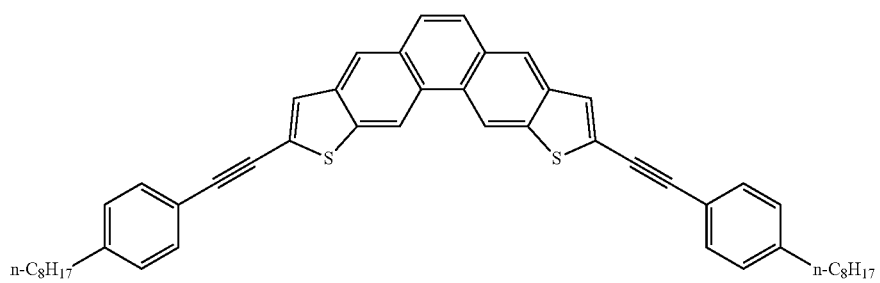
Compound G14
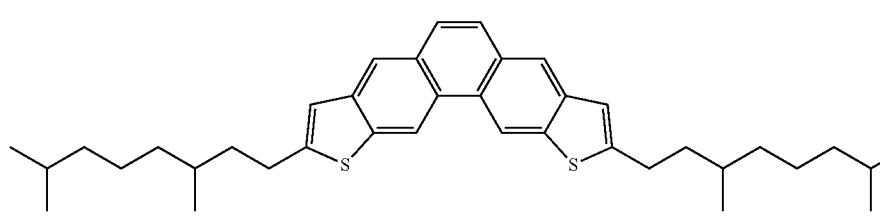
Compound G15
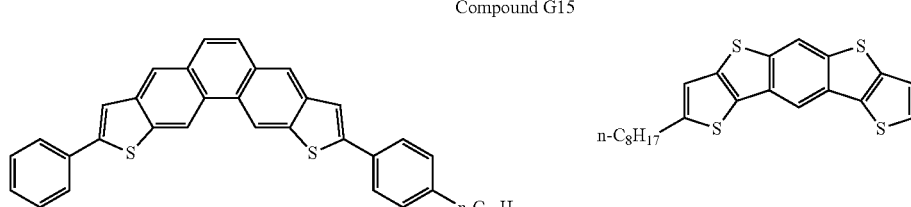
Compound H1
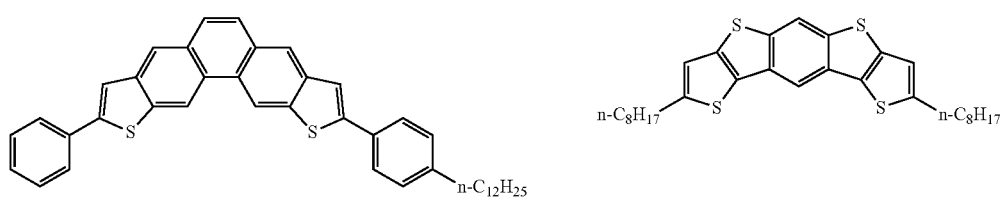
Comound H2
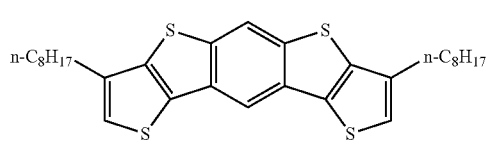
Compound H3
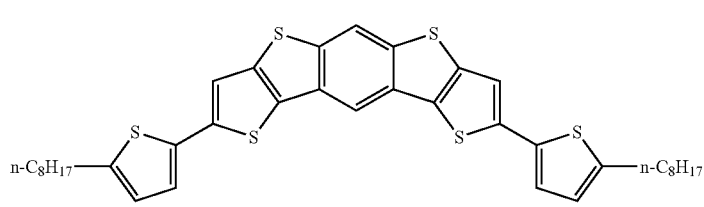

-continued
Compound H4
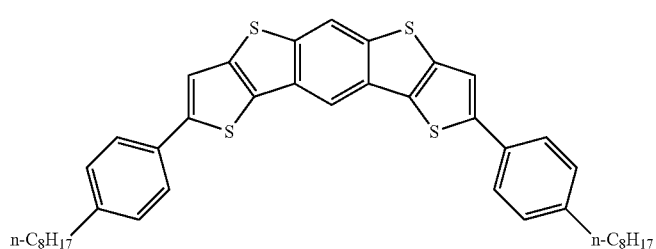
Compound H5
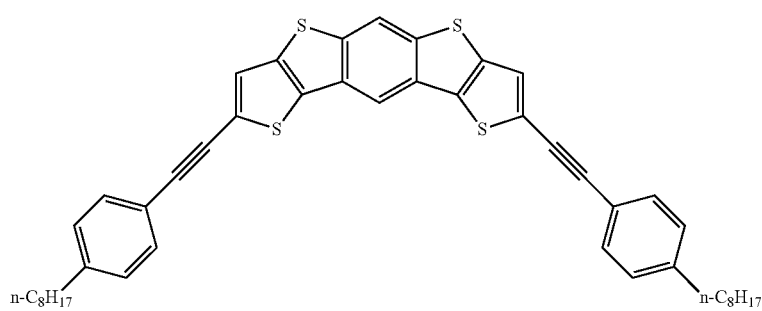
Comound H6 Compound H7
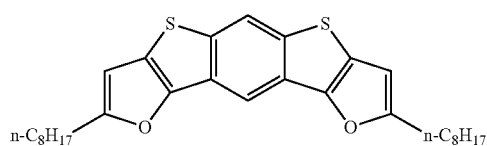 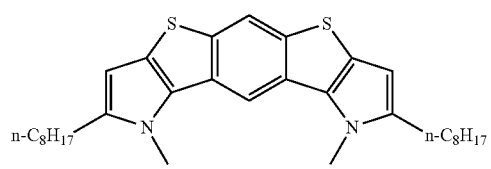
Compound H8 Compound H9
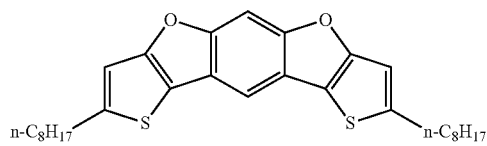 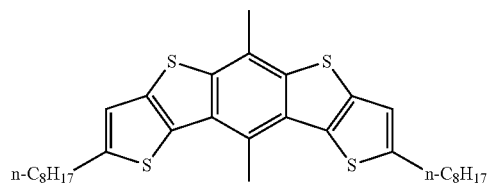
Compound H10
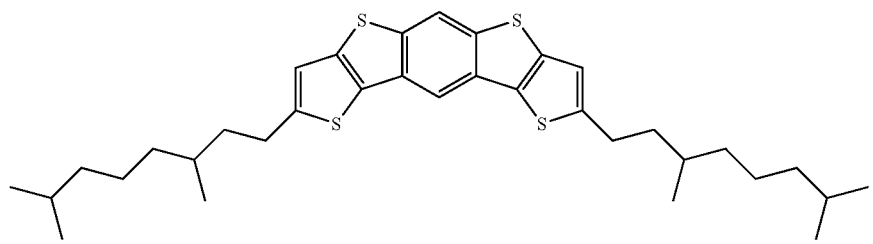
Compound H11
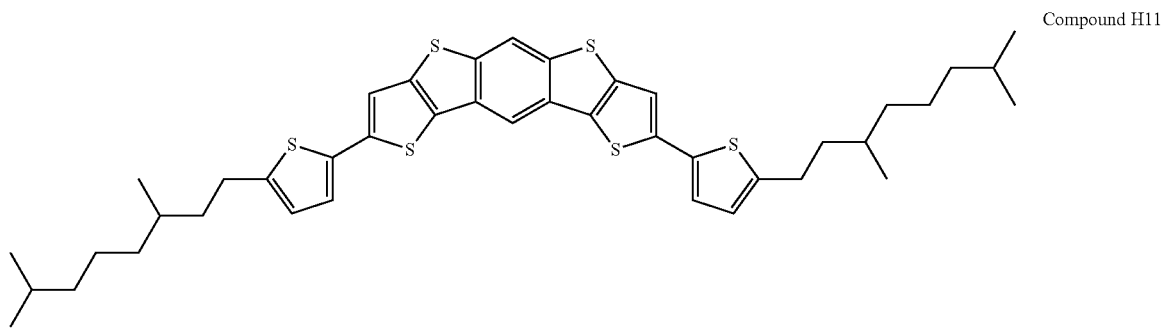

Compound H12

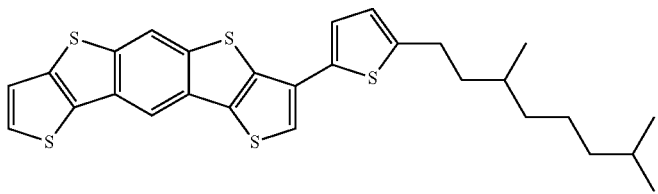

With regard to the molecular weight of compound E, compound F, compound G, and compound H, the upper limit of the molecular weight for each compound is preferably the same as that of the compound represented by General Formula (C), whereby solubility in a solvent can be increased. On the other hand, the lower limit of the molecular weight is the same as that of the compound represented by General Formula (D), from the viewpoint of film quality stability of a thin film.

Specific examples of compound J and compound K represented by General Formula (J) and General Formula (K) are shown below.

Compound J1

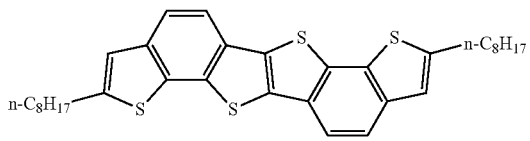

Compound K1

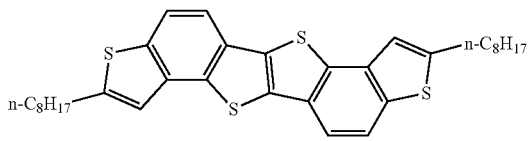

Compound J2

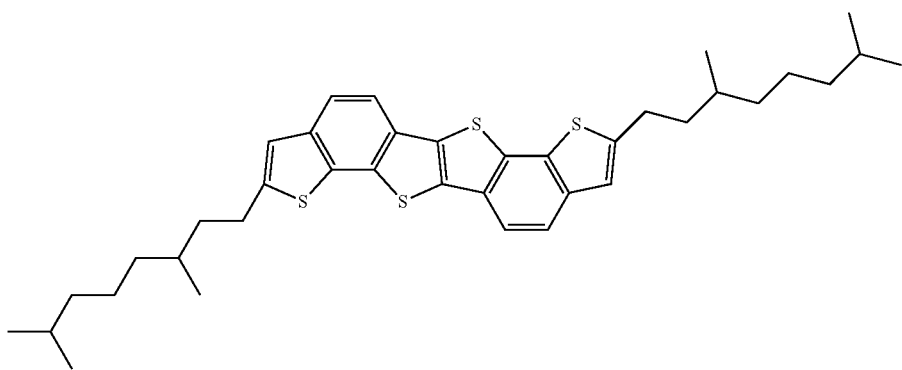

Compound K2

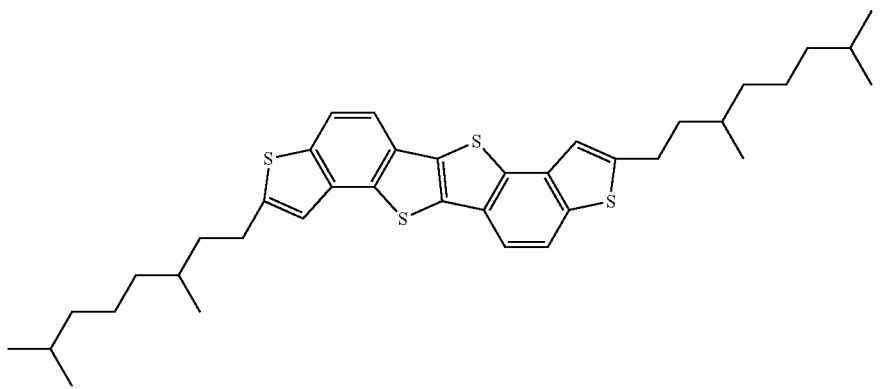

Compound J3

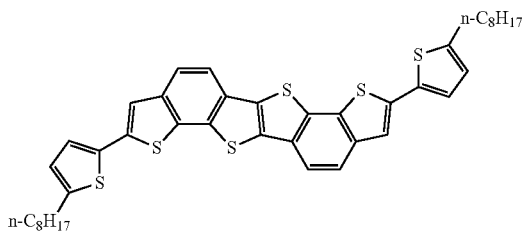

Compound K3

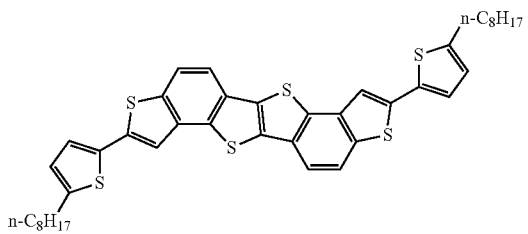

Compound J4

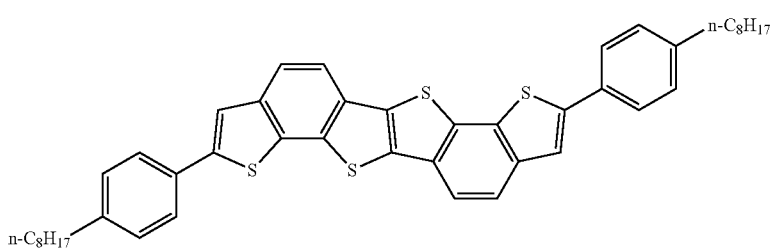

Compound K4

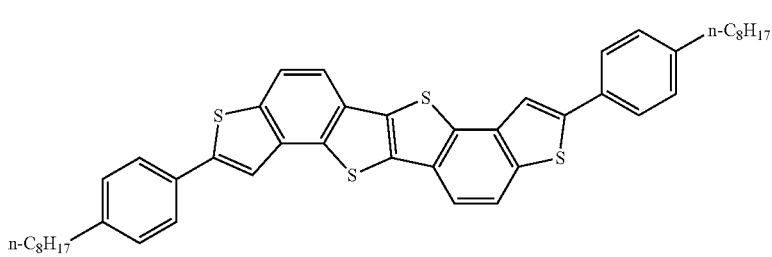

Comound J5

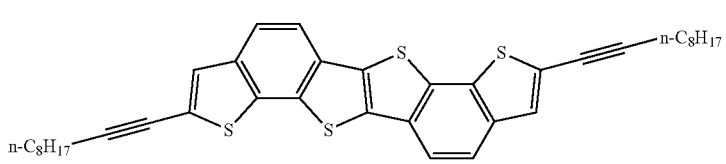

Compound K5

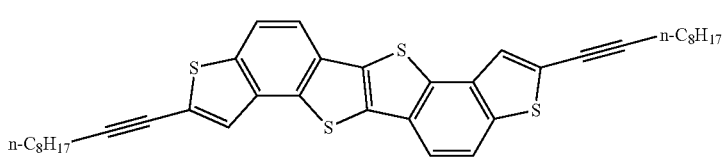

Comound J6

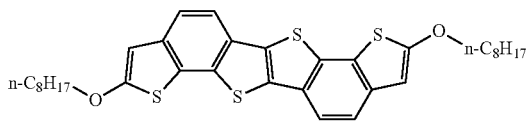

Compound K6

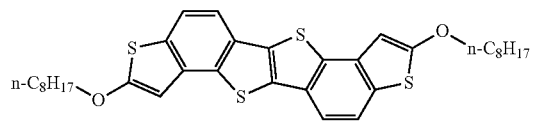

Compound J7

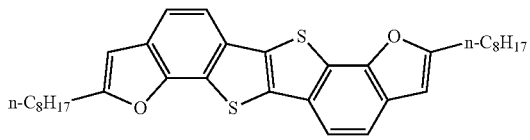

Compound K7

Compound J8

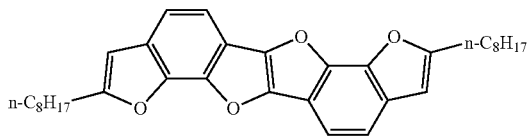

Compound K8

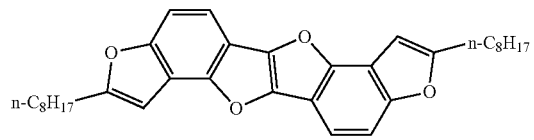

With regard to the molecular weight of compound J and compound K, the upper limit of the molecular weight for each compound is preferably the same as that of compound C represented by General Formula (C), whereby solubility in a solvent can be increased. On the other hand, the lower limit of the molecular weight is the same as that of the compound represented by General Formula (D), from the viewpoint of film quality stability of a thin film.

Specific examples of each of compound L represented by General Formula (L), compound M represented by General Formula (M), compound N represented by General Formula (N), compound P represented by General Formula (P), and compound Q represented by General Formula (Q) are shown in order.

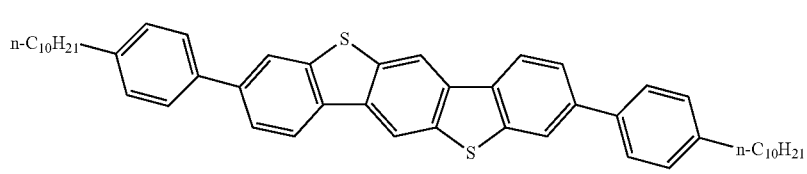
Compound L1
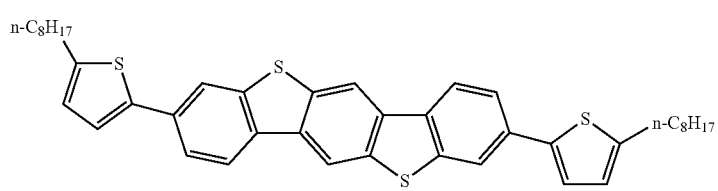
Compound L2
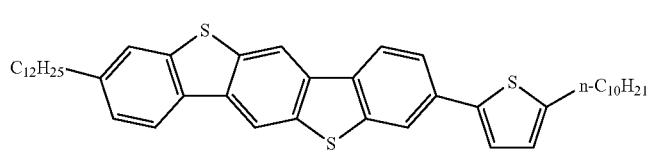
Compound L3
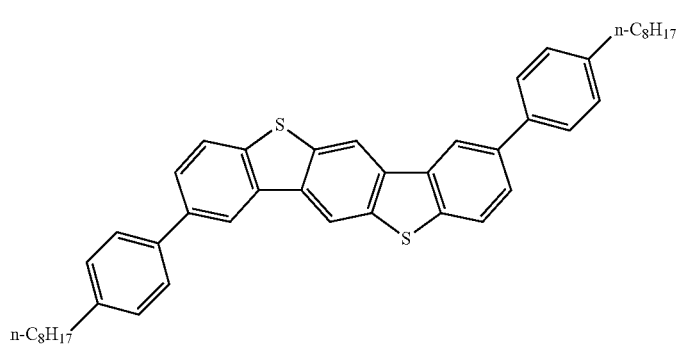
Compound L4
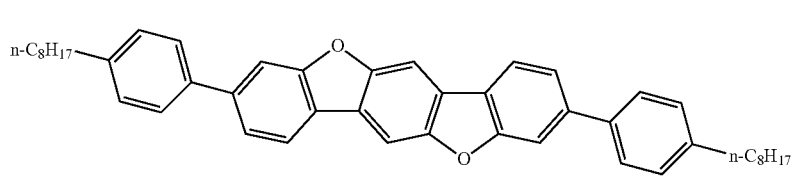
Compound L5
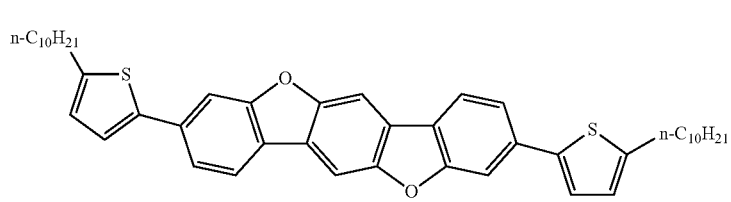
Compound L6
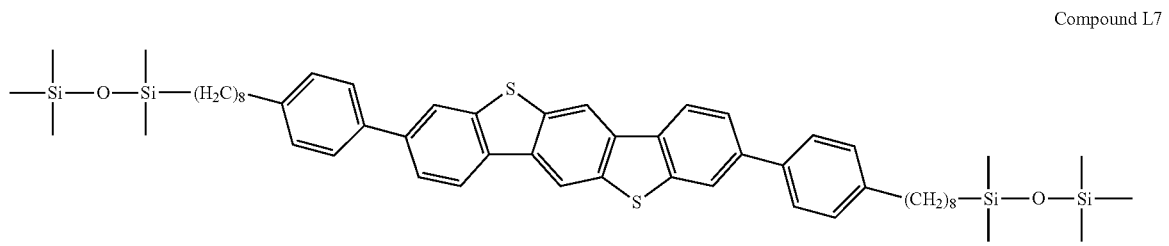
Compound L7

-continued
Compound L8
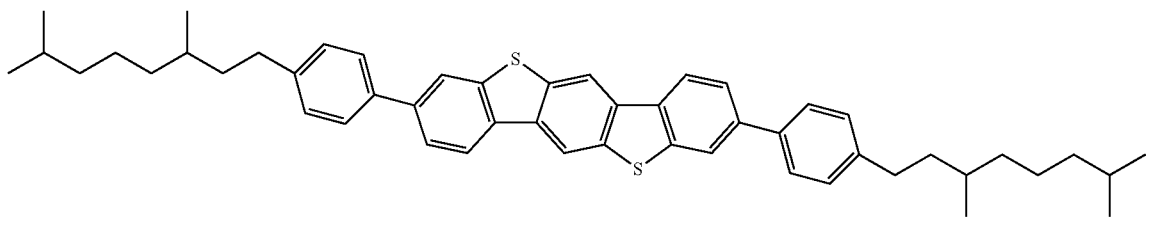
Compound L9
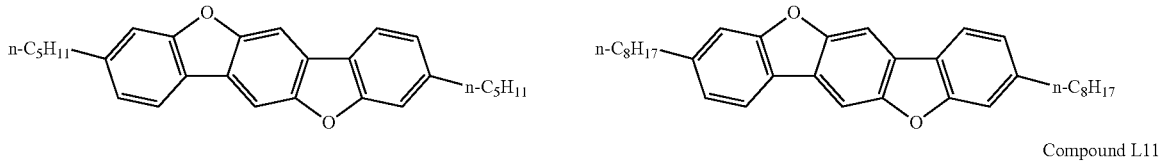
Compound L10
Compound L11
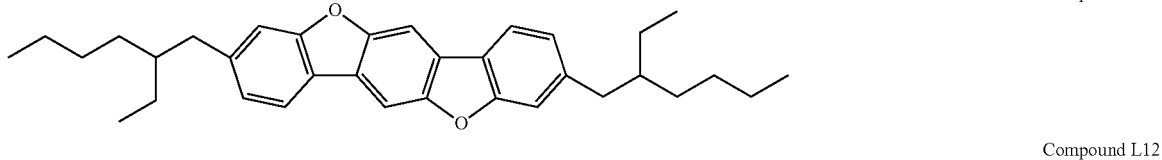
Compound L12
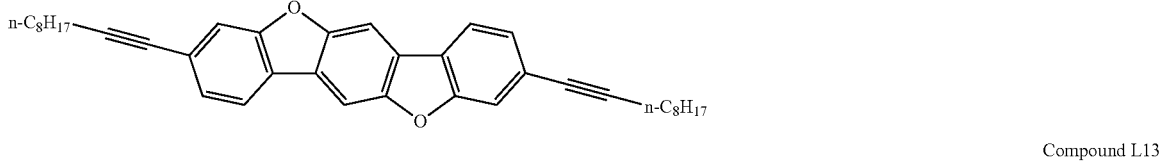
Compound L13
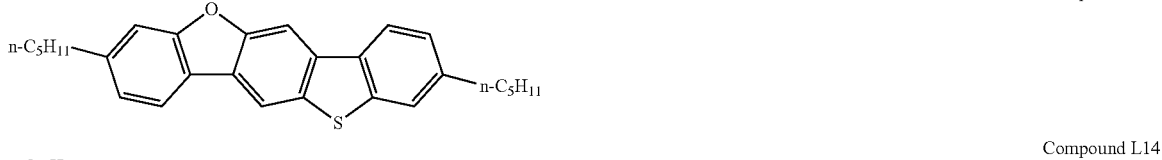
Compound L14
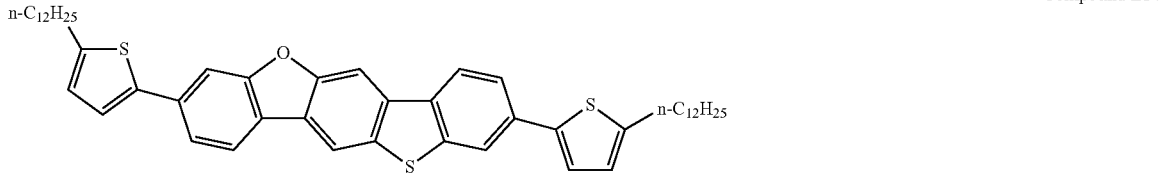
Compound L15
Compound M1
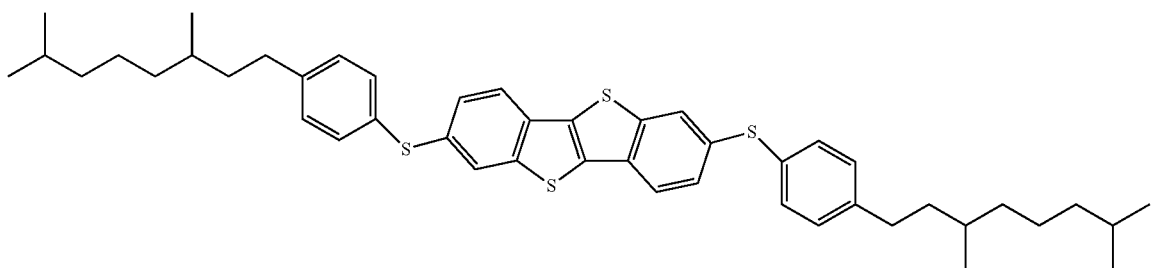
Compound M2
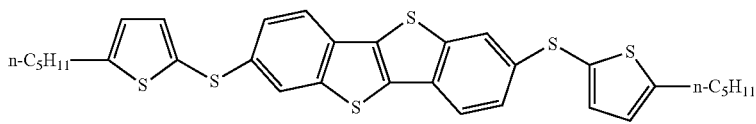

Compound M3
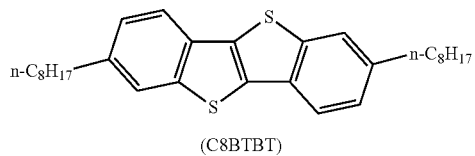
(C8BTBT)
Compound M4
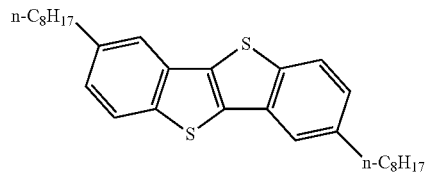
Compound M5
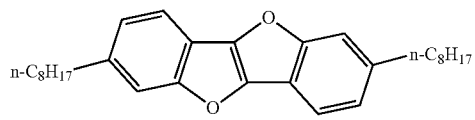
Compound M6
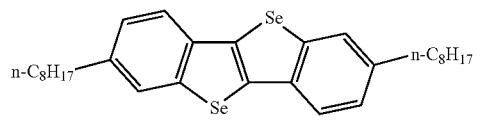
Compound M7
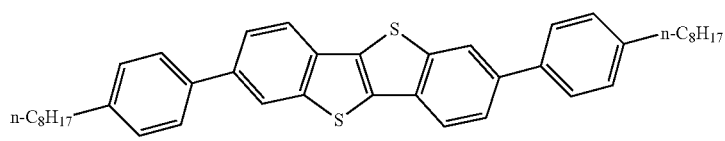
Compound M8
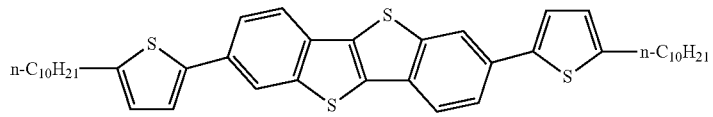
Compound N1
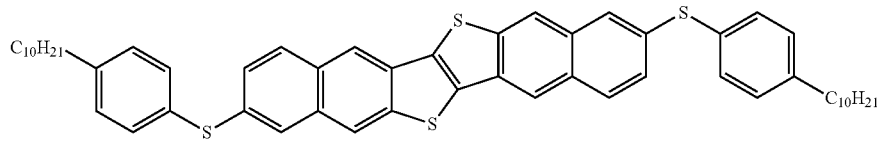
Compound N2
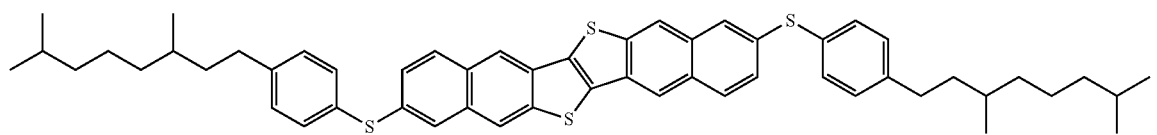
Compound N3
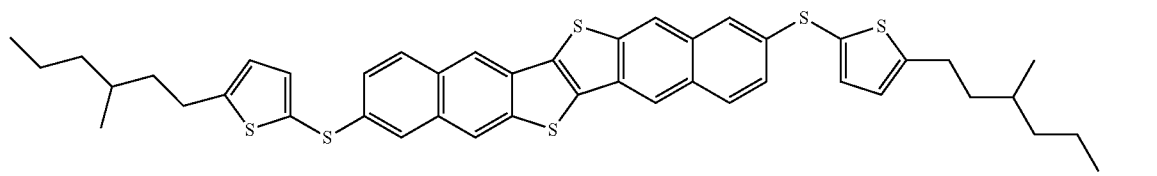
Compound N4
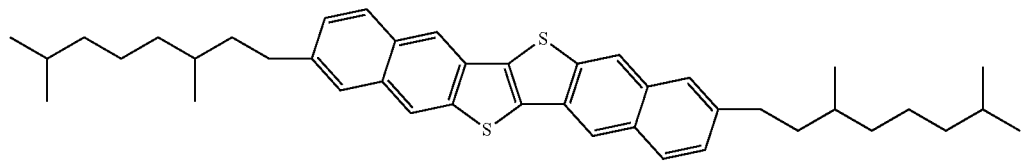
Compound N5
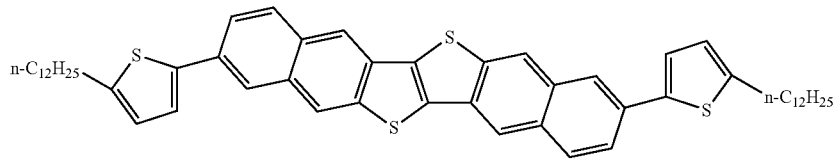

-continued
Compound N6
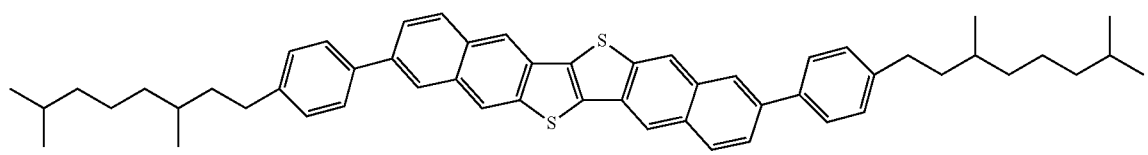
Compound N7
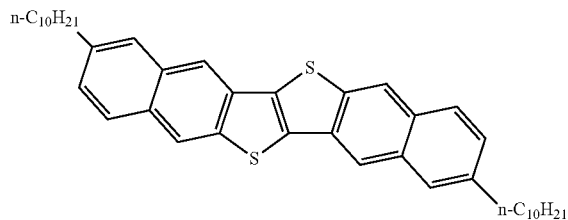
Compound P1
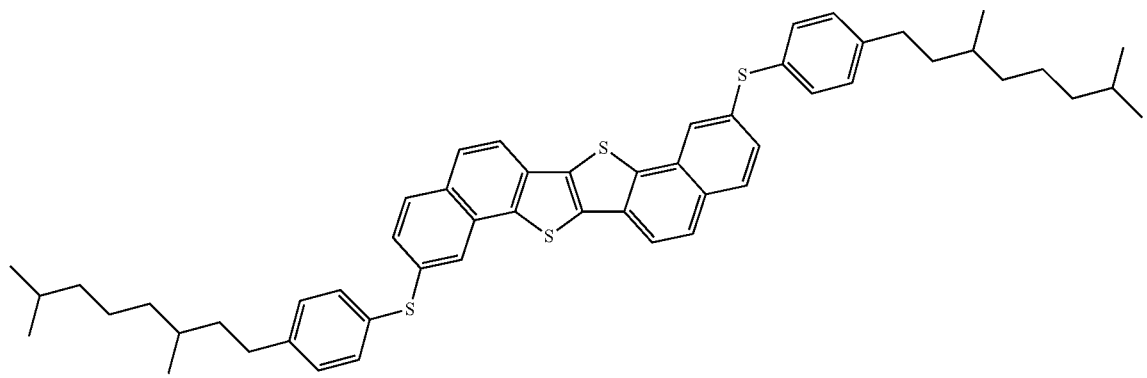
Compound P2
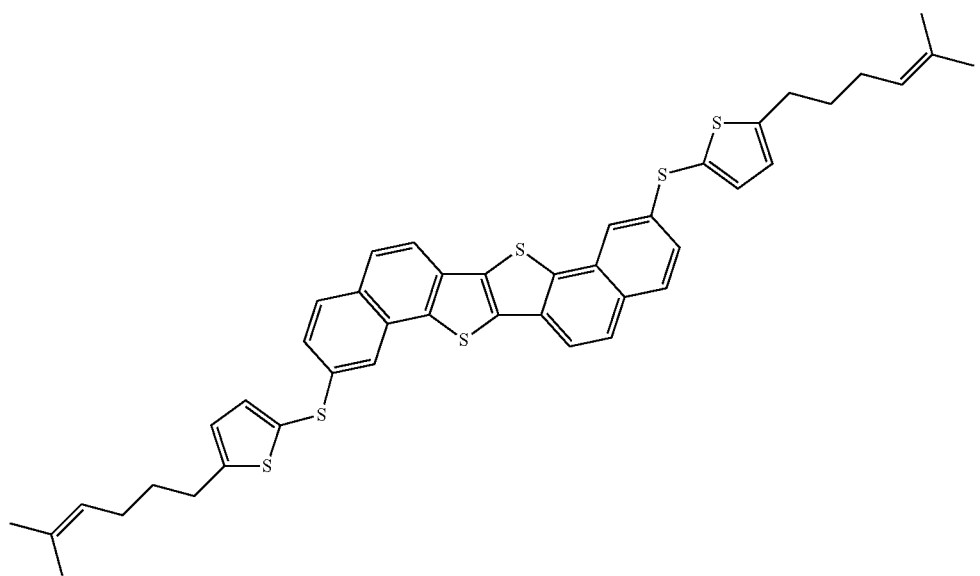

Compound P3
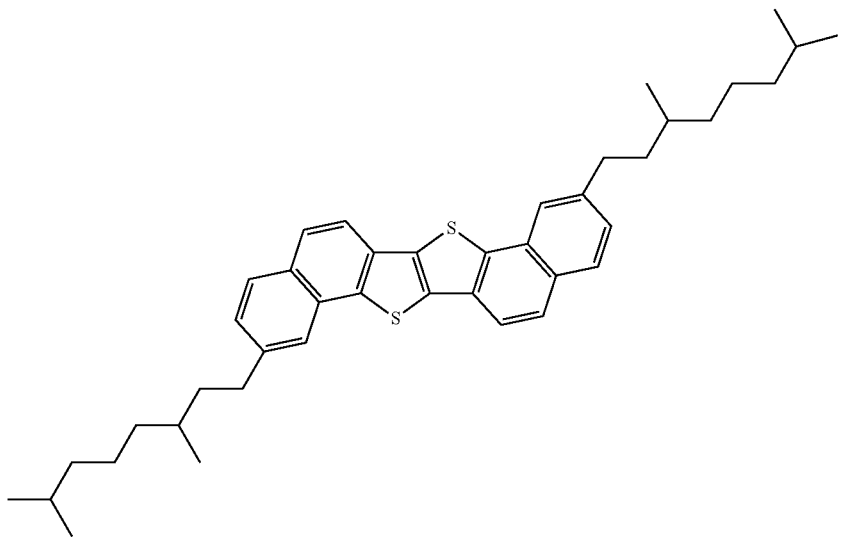
Compound P4
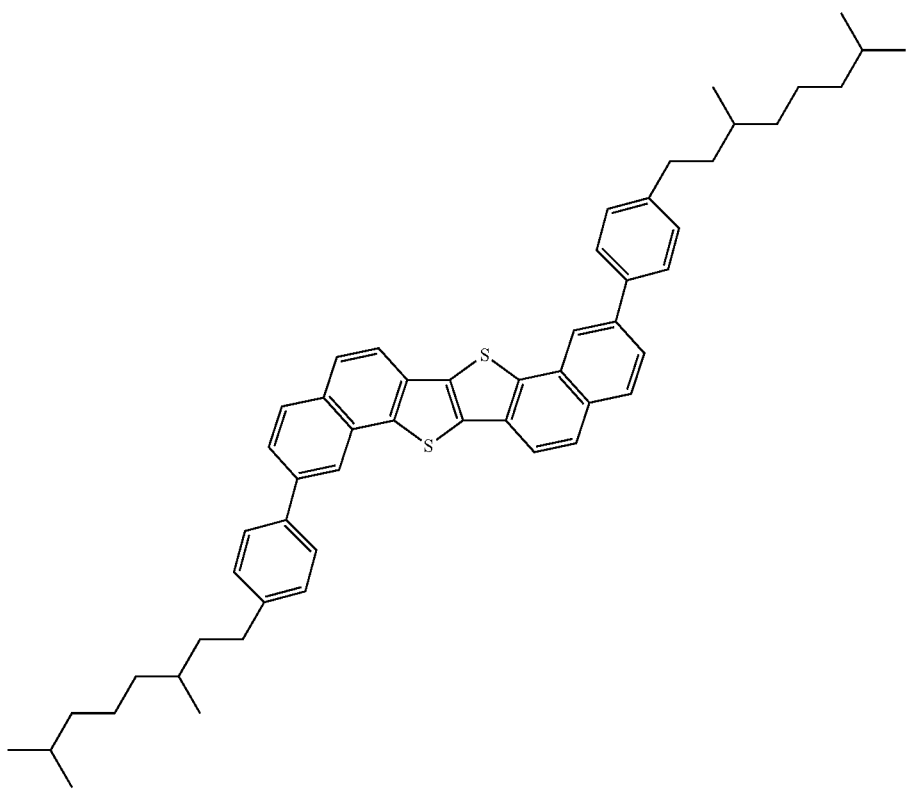

-continued
Compound P5
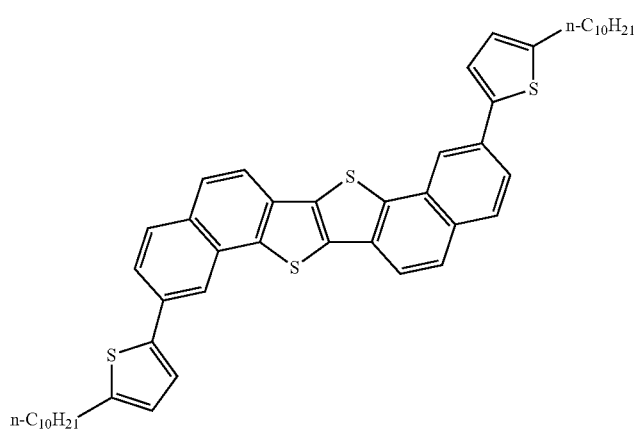
Compound P6
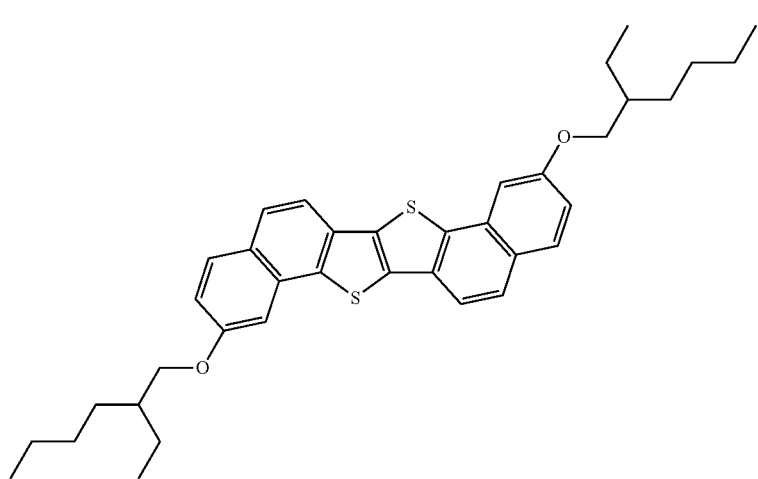
Compound Q1
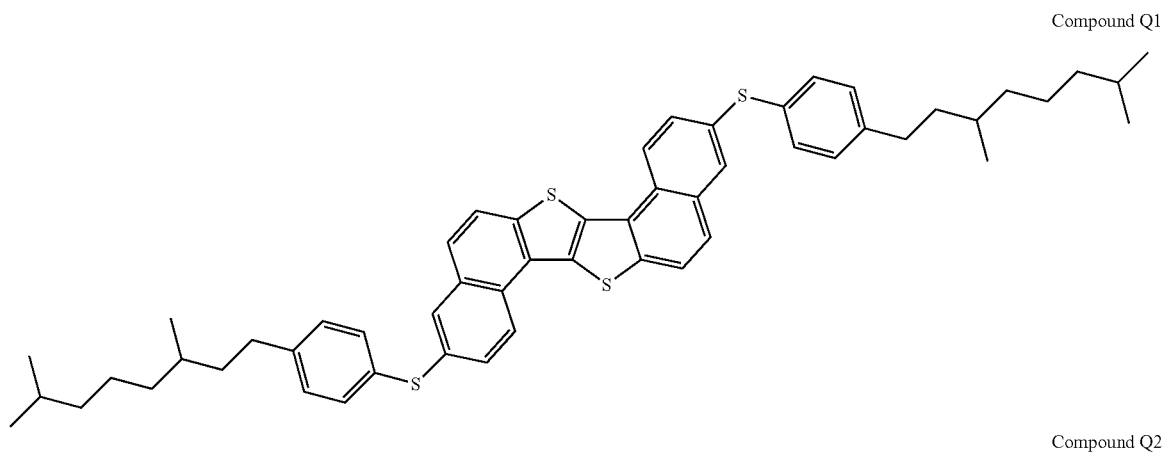
Compound Q2
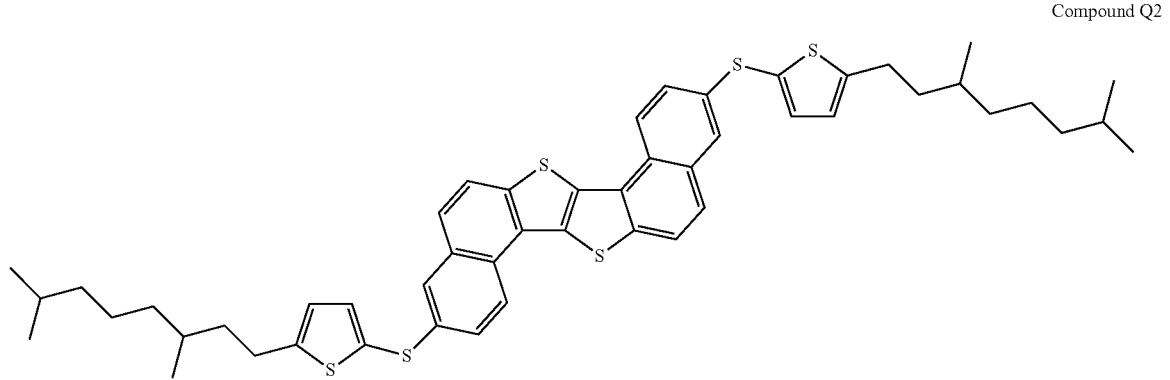

Compound Q3
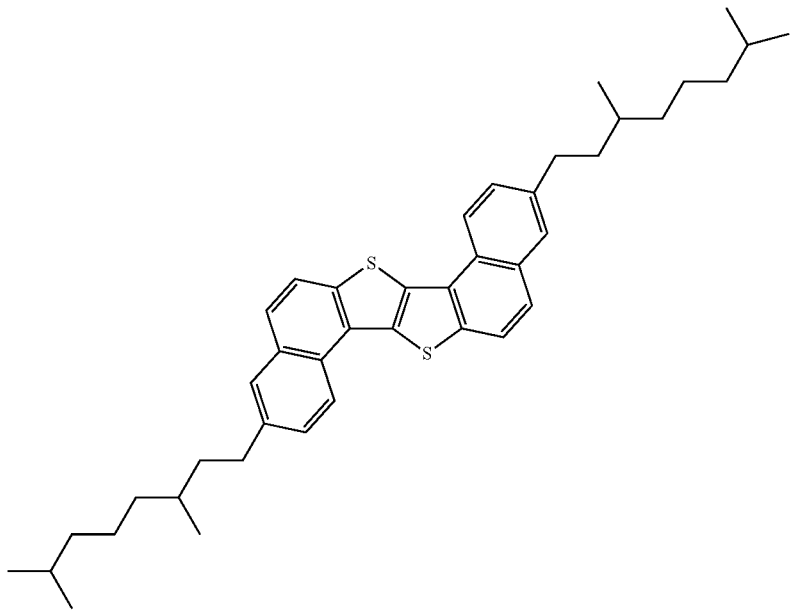
Compound Q4
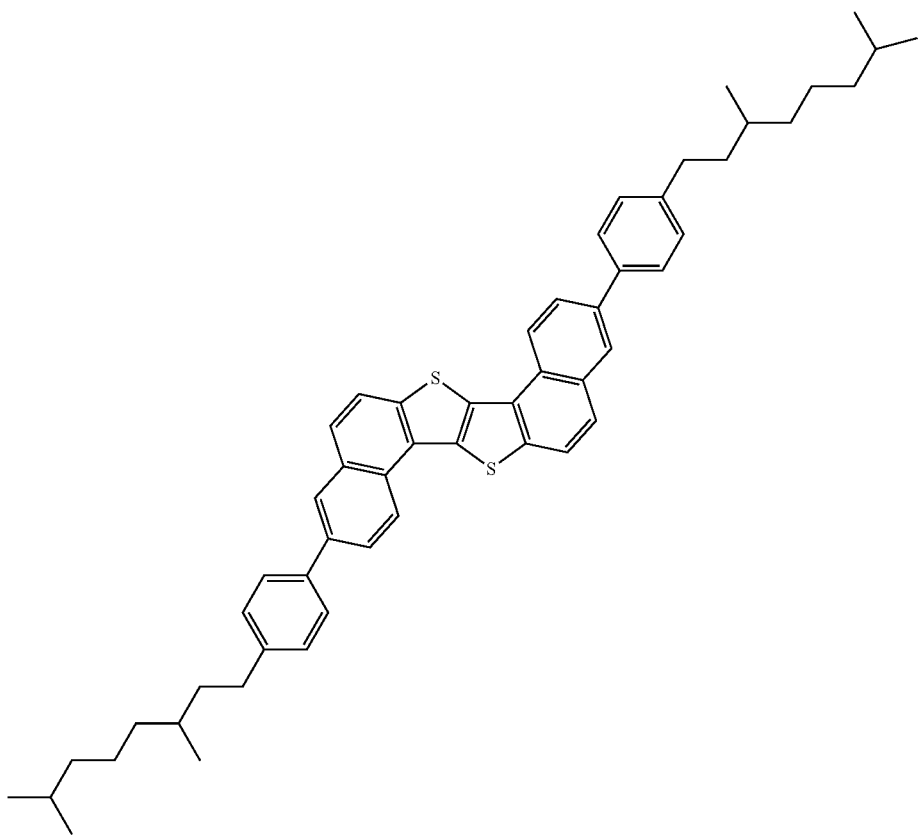

Compound Q5

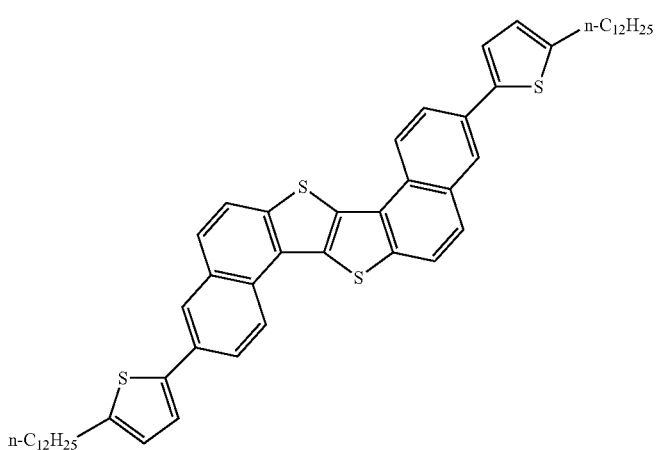

Compound Q6

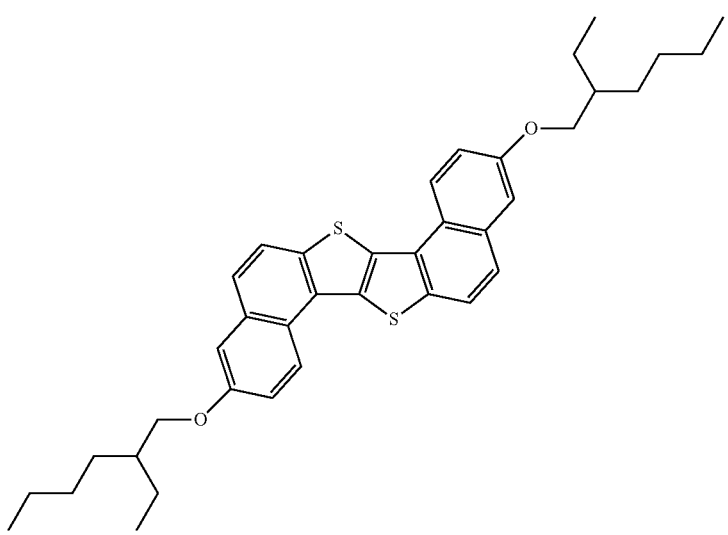

With regard to the molecular weight of compound L, compound M, compound N, compound P, and compound Q, the upper limit of the molecular weight for each compound is preferably the same as that of compound C represented by General Formula (C), whereby solubility in a solvent can be increased. On the other hand, the lower limit of the molecular weight is the same as that of the compound represented by General Formula (D), from the viewpoint of film quality stability of a thin film.

Specific examples of each of compound R represented by General Formula (R), compound S represented by General Formula (S), and compound T represented by General Formula (T) are shown in order.

Compound R1

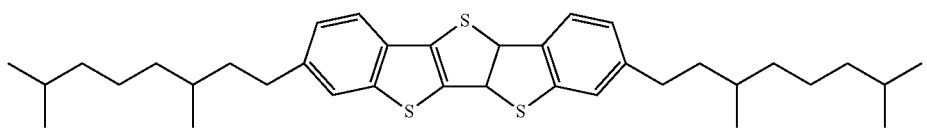

Compound R2

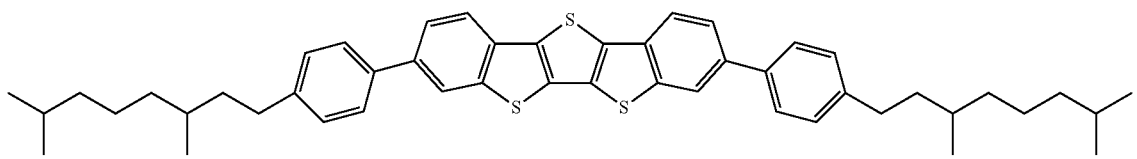

-continued
Compound R3
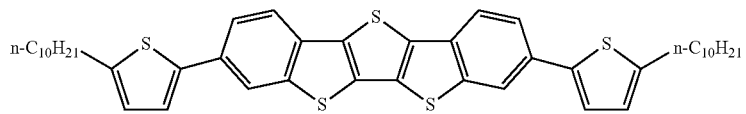
Compound R4
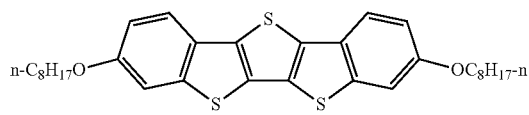
Compound S1
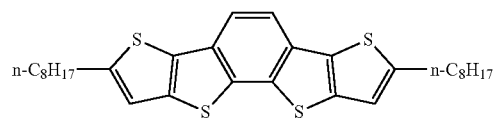
Compound S2
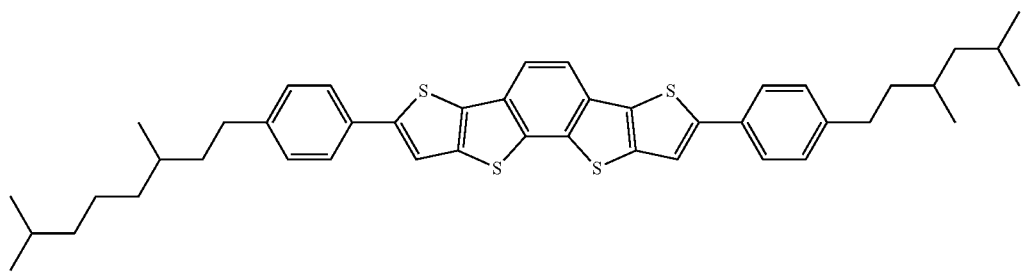
Compound S3
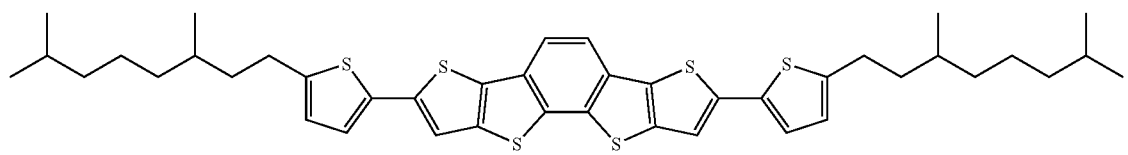
Compound S4
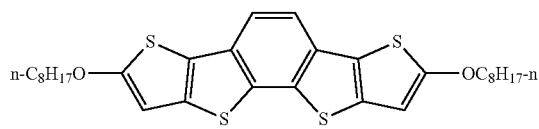
Compound T1
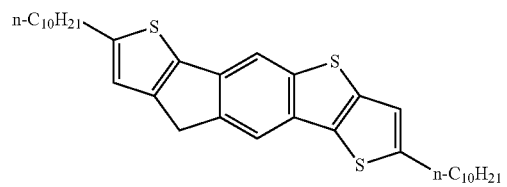
Compound T2
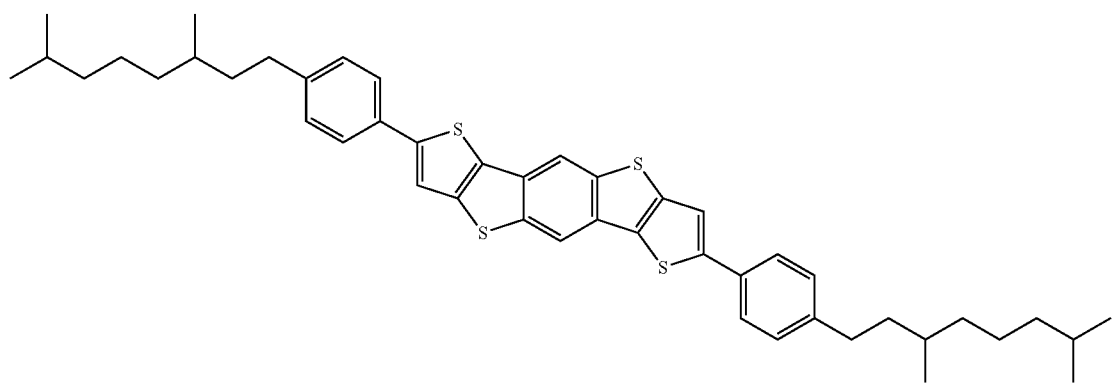

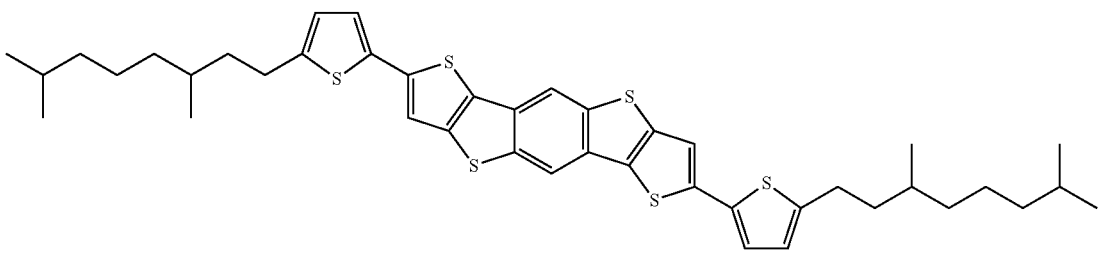

Compound T3

Compound T4

With regard to the molecular weight of compound R, compound S, and compound T, the upper limit of the molecular weight for each compound is preferably the same as that of compound C represented by General Formula (C), whereby solubility in a solvent can be increased. On the other hand, the lower limit of the molecular weight is the same as that of the compound represented by General Formula (D), from the viewpoint of film quality stability of a thin film.

Examples of the organic polymer and derivatives thereof include polymers such as polypyrrole and derivatives thereof, polydiketopyrrole and derivatives thereof, polythiophene and derivatives thereof, isothianaphthene such as polyisothianaphthene, thienylenevinylene such as polythienylenevinylene, poly(p-phenylenevinylene), polyaniline and derivatives thereof, polyacetylene, polydiacetylene, polyazulene, polypyrene, polycarbazole, polyselenophene, polyfuran, poly(p-phenylene), polyindole, polypyridazine, polytellurophene, polynaphthalene, polyvinylcarbazole, polyphenylene sulfide, and polyvinylene sulfide; and polymers of fused polycyclic aromatic compounds.

The polythiophene and derivatives thereof are not particularly limited, but examples thereof include poly-3-hexylthiophene (P3HT), polyethylenedioxythiophene, and poly (3,4-ethylenedioxythiophene)/polystyrenesulfonic acid (PEDOT/PSS), each of where hexyl groups are introduced into polythiophene.

Further examples thereof include oligomers (for example, oligothiophene) having the same repeating units as in those polymers.

Further, the organic polymer includes, for example, a polymer compound where the compound represented by the following General Formulae (C) to (T) has a repeating structure.

Examples of such a polymer compound include pendant polymers where the compound represented by General Formulae (C) to (T) is bonded to a n conjugated polymer representing a repeating structure via at least one or more arylene groups or heteroarylene groups (thiophene, bithiophene, or the like), or the compound represented by General Formulae (C) to (T) is bonded to a polymer main chain via a side chain. The polymer main chain is preferably polyacrylate, polyvinyl, polysiloxane, or the like, and the side chain is preferably an alkylene group, a polyethylene oxide group, or the like. In the case of a pendant polymer, the polymer main chain may be one where at least one of substituents $R^C, R^D, R^E, R^F, R^G, R^H, R^I, R^J, R^K, R^L, R^M, R^N, R^O, R^P, R^Q, R^R, R^S$, or $R^T$ has a group derived from a polymerizable group, and which is formed by polymerization of such a group.

These organic polymers preferably have a weight-average molecular weight of 30,000 or more, more preferably 50,000 or more, and still more preferably 100,000 or more. When the weight-average molecular weight is higher than or equal to the above-specified lower limit, an intermolecular interaction can be enhanced, and thus high mobility can be obtained.

<Inorganic Semiconductor Layer>

The inorganic semiconductor material for forming a semiconductor layer is not particularly limited, but a coating-type semiconductor is preferred, a preferred example of which includes an oxide semiconductor.

The oxide semiconductor is not particularly limited as long as it is constituted of a metal oxide. A semiconductor layer constituted of the oxide semiconductor is preferably formed using an oxide semiconductor precursor, that is, a material which is converted into a semiconductor material constituted of a metal oxide by conversion treatment such as thermal oxidation.

The oxide semiconductor is not particularly limited, but examples thereof include indium gallium zinc oxide, indium gallium oxide, indium tin zinc oxide, gallium zinc oxide, indium tin oxide, indium zinc oxide, tin zinc oxide, zinc oxide, and tin oxide, for example $InGaZnO_x$, $InGaO_x$, $InSnZnO_x$, $GaZnO_x$, $InSnO_x$, $InZnO_x$, $SnZnO_x$ (all of which have x>0), ZnO, and $SnO_2$.

Examples of the oxide semiconductor precursor include metal nitrates, metal halides, and alkoxides. The metal contained in the above-described oxide semiconductor precursor may be, for example, at least one selected from the group consisting of Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb, and Lu.

Specific examples of the oxide semiconductor precursor include indium nitrate, zinc nitrate, gallium nitrate, tin nitrate, aluminum nitrate, indium chloride, zinc chloride, tin (II) chloride, tin (IV) chloride, gallium chloride, aluminum chloride, tri-i-propoxyindium, diethoxyzinc, bis(dipivaloylmethanato)zinc, tetraethoxytin, tetra-i-propoxytin, tri-i-propoxygallium, and tri-i-propoxyaluminum.

[Source Electrode and Drain Electrode]

In the TFT of the present invention, the source electrode is an electrode into which an electric current flows through the wiring from the outside. In addition, the drain electrode is an electrode which transmits an electric current to the outside through the wiring, and is typically provided in contact with the semiconductor layer.

As a material for the source electrode and the drain electrode, it is possible to use a conductive material used in a conventional thin film transistor, examples of which include the conductive materials illustrated in the above-described gate electrode, and the like materials.

The source electrode and the drain electrode can be respectively formed by the same method as the above-described method of forming a gate electrode.

A lift-off method or an etching method may be employed as the above-described photolithographic method.

In particular, since the gate insulating layer exhibits excellent resistance to an etching solution and a stripping solution, the source electrode and the drain electrode can be suitably formed also by an etching method. The etching method is a method of removing an unnecessary portion by etching after the formation of a conductive material into a film. If patterning is carried out by the etching method, the conductive material remaining on the underlayer during the removal of a resist is stripped and re-deposition of the resist residues and removed conductive materials into the underlayer can be prevented, resulting in an excellent shape of an electrode edge part. In this regard, the etching method is preferred over a lift-off method.

The lift-off method is a method of forming a film of a conductive material only in the portion onto which a resist is not applied, by applying the resist onto a portion of the underlayer, forming a film of the conductive material thereon, and eluting or stripping the resist or the like using a solvent to thereby remove conductive materials on the resist.

The thickness of each of the source electrode and the drain electrode is arbitrary, but it is preferably 1 nm or more, and particularly preferably 10 nm or more. In addition, the thickness of each of the source electrode and the drain electrode is preferably 500 nm or less, and particularly preferably 300 nm or less.

The spacing (channel length) between the source electrode and the drain electrode is arbitrary, but it is preferably 100 µm or less, and particularly preferably 50 µm or less. The channel width is preferably 5,000 µm or less, and particularly preferably 1,000 µm or less.

[Overcoat Layer]

The TFT of the present invention may have an overcoat layer. The overcoat layer is a layer which is usually formed as a protective layer on the surface of a TFT. The overcoat layer may be of a single-layer structure or a multilayer structure.

The overcoat layer may be an organic overcoat layer or an inorganic overcoat layer.

The material for forming the organic overcoat layer is not particularly limited, but examples thereof include organic polymers such as polystyrene, an acrylic resin, polyvinyl alcohol, polyolefin, polyimide, polyurethane, polyacetylene, and an epoxy resin, and derivatives obtained by introducing a crosslinkable group, a water-repellent group, or the like into these organic polymers. These organic polymers and derivatives thereof may also be used in combination with a crosslinking component, a fluorine compound, a silicon compound, or the like.

The material for forming the inorganic overcoat layer is not particularly limited, but examples thereof include metal oxides such as silicon oxide and aluminum oxide, and metal nitrides such as silicon nitride.

These materials may be used singly or as a combination of two or more kinds in any combination and in any ratio.

There is no limitation on the method for forming an overcoat layer, and the overcoat layer can be formed by various known methods.

For example, the organic overcoat layer can be formed by, for example, a method of applying a solution containing a material for the overcoat layer, followed by drying, exposure, development to perform patterning, and the like, in which the solution containing a material for the overcoat layer is applied onto a layer serving as the underlayer, and then the overcoat layer is dried. In addition, the patterning of the overcoat layer may also be directly formed by a printing method, an inkjet method, or the like. Moreover, the overcoat layer may be crosslinked by exposing or heating after patterning of the overcoat layer.

On the other hand, the inorganic overcoat layer can be formed by a dry method such as a sputtering method or a vapor deposition method, or a wet method such as a sol-gel method.

[Other Layers]

The TFT of the present invention may be provided with layers or members other than the above-described layers.

The other layers or members may include, for example, a bank and the like. The bank can be used for the purpose of damming a discharge liquid at a predetermined position or the like, when forming a semiconductor layer, an overcoat layer, or the like by an inkjet method or the like. Therefore, the bank usually has liquid repellency. The method of forming a bank includes, for example, a method of patterning by a photolithographic method or the like and then performing liquid repellency treatment such as by a fluorine plasma method, a method of curing a photosensitive composition or the like containing a liquid repellent component such as a fluorine compound, and the like methods.

In the case of the thin film transistor of the present invention, since the gate insulating layer is an organic layer, the latter method of curing a photosensitive composition containing a liquid repellent component is preferred because there is no possibility of the gate insulating layer being affected by liquid repellency treatment. It may use a technique allowing the underlayer to have a contrast of liquid repellency without using a bank, thereby rendering it to have the same role as the bank.

[TFT Applications]

The TFT of the present invention is preferably mounted to be used on a display panel. Examples of the display panel include a liquid crystal panel, an organic EL panel, and an electronic paper panel.

EXAMPLES

Hereinafter, the present invention will be described in more detail with reference to Examples, but the present invention is not limited thereto.

Synthesis Example

Compounds as the organic semiconductor used in each Example are shown below.

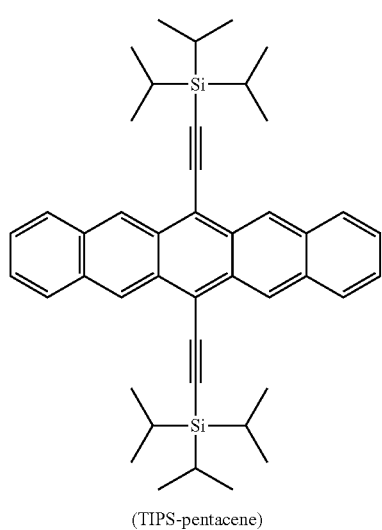
(TIPS-pentacene)
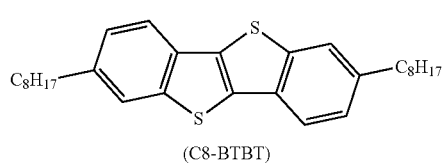
(C8-BTBT)
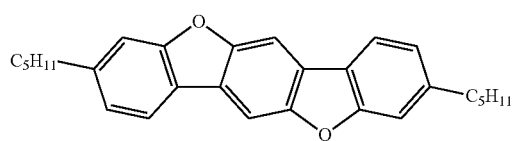
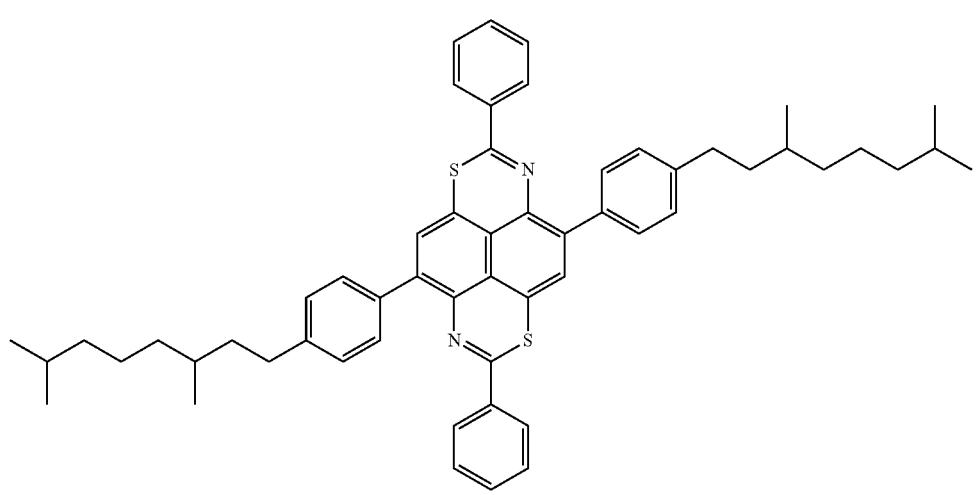
A6
M3
L9
C16

Compound L9 is a compound represented by General Formula (L), and was synthesized according to the method described in Journal of the Organic Molecule & Bioelectronics Subcommittee, Japan Society of Applied Physics, 2011, Vol. 22, pp 9 to 12, WO2009/148016A, or the like.

Compound C16 is a compound represented by General Formula (C), and was synthesized according to the following synthesis method of Compound C1 shown below.

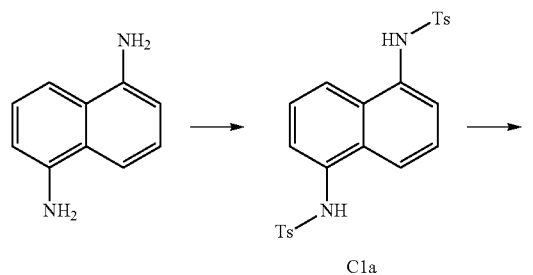
C1a

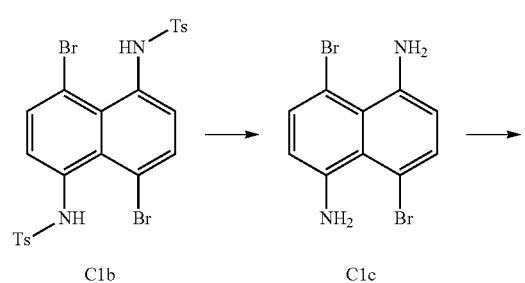
C1b  C1c

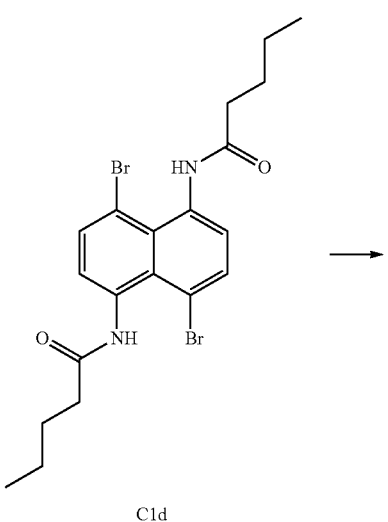
C1d

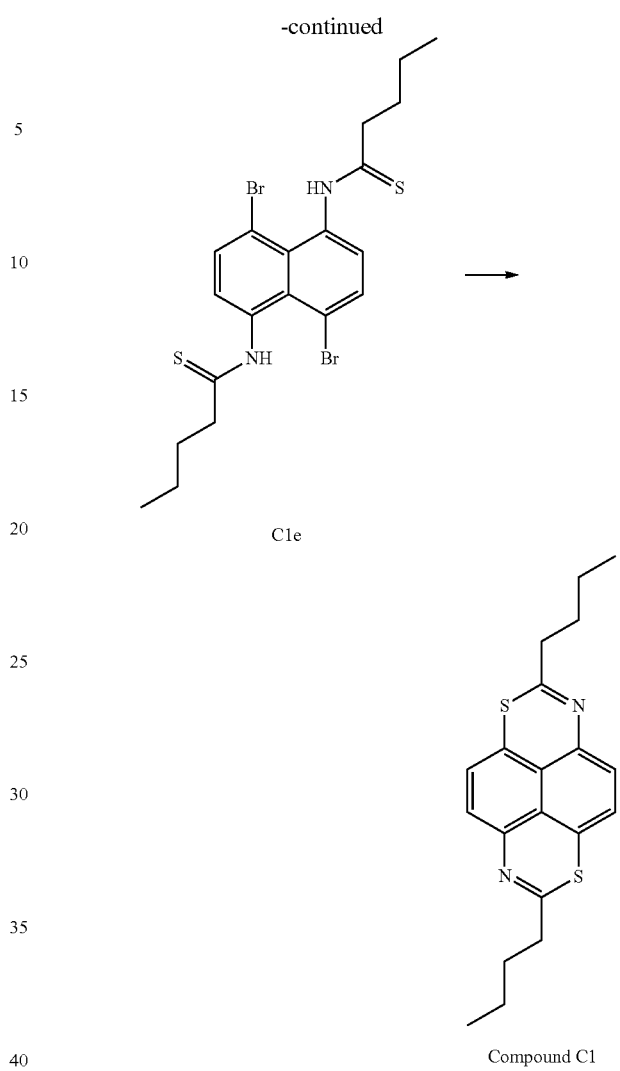
C1e

Compound C1

(Synthesis of Compound C1a)

p-Toluenesulfonyl chloride (34 g) was added slowly to a pyridine solution (125 mL) of 1,5-diaminonaphthalene (10 g) which was then stirred at room temperature for 2 hours. The reaction liquid was poured into ice water, and the precipitate was filtered under reduced pressure. The resulting crude crystal was washed with methanol to give Compound C1a (29 g)

(Synthesis of Compound C1b)

A glacial acetic acid solution of Compound C1a (10 g) was stirred with heating at 95° C., and bromine (2 mL) diluted with 10 mL of glacial acetic acid was slowly added dropwise thereto. The reaction liquid was reacted for 10 minutes, followed by allowing to cool, and filtered to obtain a crude crystal as a gray solid. The crude crystal was re-crystallized in nitrobenzene to give Compound C1b (6.8 g).

(Synthesis of Compound C1c)

A concentrated sulfuric acid solution of Compound C1b (5 g) was stirred at room temperature for 24 hours. The reaction liquid was poured into ice water, and the precipitated solid was recovered by filtration. The solid was dispersed again in ice water, and neutralized with ammonia water to give Compound C1c (0.5 g).

(Synthesis of Compound C1d)

At room temperature, pentanoyl chloride (valeric acid chloride) (2.6 mL) was added dropwise to a pyridine solution of Compound C1c (2 g) which was then stirred for 2 hours. The reaction liquid was poured into ice water, and the solid was filtered under reduced pressure. The solid was dispersed in methanol, stirred for 1 hour, and then filtered to give Compound C1d (1.39 g).

(Synthesis of Compound C1e)

Compound C1d (1.2 g) and Lawesson's reagent (1.48 g) were added to a mixed solution of THF (360 mL) and toluene (72 mL), and stirred for 3 hours while heating under reflux. Only THF was removed by evaporation to make a toluene solution which was then stirred for 1 hour at 60° C. Thereafter, the insoluble matter was filtered to give Compound C1e (0.5 g).

(Synthesis of Compound C1)

Compound C1e (0.4 g) and cesium carbonate (1.33 g) were reacted in dimethyl acetamide at 120° C. for 2 hours. The reaction liquid was poured into water and the precipitate was filtered. The filtered solid was repeatedly recrystallized in THF to synthesize a target compound C1 (0.12 g). Identification of the resulting compound C1 was carried out by $^1$H-NMR and mass spectrum.

Compound A6 (TIPS-pentacene) and Compound M3 (C8-BTBT) were synthesized according to known methods.

Preparation Example 1

Preparation-1 of Bottom Gate Type TFT

A bottom gate-bottom contact type TFT shown in FIG. 1A was prepared. A doped silicon substrate having a thickness of 1 mm (also serving as a gate electrode 5) was used as a substrate 6, and a gate insulating layer 2 was formed thereon.

The gate insulating layer 2 was formed as follows.

6.3 g of commercially available poly(4-vinylphenol) and 2.7 g of 2,2-bis(3,5-dihydroxymethyl-4-hydroxy)propane as a crosslinking agent were completely dissolved in 91 g of a mixed solvent of 1-butanol/ethanol=1/1 at room temperature. This solution was filtered through a PTFE membrane filter of φ0.2 µm. A diphenyliodonium hexafluorophosphate salt as an acid catalyst was added to 0.1 wt % in the resulting filtrate, which was then applied onto the substrate 6 and dried to form a film. Thereafter, the film was heated to 100° C. to form a crosslinked structure, thereby forming a gate insulating layer 2 having a thickness of 0.7 µm.

On the gate insulating layer 2 formed above, comb-like arranged chromium/gold (gate width W=100 mm, and gate length L=100 µm) electrodes as source and drain electrodes were formed using a mask by vacuum deposition, as shown in FIG. 1A.

Subsequently, a solution of 5 mg of an organic semiconductor shown in Table 1 below dissolved in 1 mL of toluene was spin-coated to form a film so as to cover the source electrode and the drain electrode, thereby preparing a TFT in the form shown in FIG. 1A. The thickness of the organic semiconductor layer was set to 150 nm.

Preparation Example 2

Preparation-2 of Bottom Gate Type TFT

A TFT was prepared in the same manner as in Preparation Example 1, except that a crosslinking agent and an acid catalyst were not added when forming a gate insulating layer in Preparation Example 1 above.

Preparation Example 3

Preparation-3 of Bottom Gate Type TFT

A TFT was prepared in the same manner as in Preparation Example 1, except that a commercially available polysilsesquioxane was used in place of poly(4-vinylphenol), tetrahydrofuran was used as a solvent, and a crosslinking agent and an acid catalyst were not added when forming a gate insulating layer in Preparation Example 1 above.

[Adjustment of Specific Metal and Specific Non-Metal Ionic Material Contents in Gate Insulating Layer]

TFTs of Examples 1 to 3 and Comparative Examples 1 to 3 were obtained according to the above-described Preparation Examples 1 to 3. More specifically, with respect to TFTs of the following Examples 1 to 3, a polymer or a mixture of a polymer and a crosslinking agent used to form a gate insulating layer in Preparation Examples 1 to 3 was washed once with pure water and dried, and the resultant was used for the formation of a gate insulating layer. Further, with respect to TFTs of the following Comparative Examples 1 to 3, a polymer or a mixture of a polymer and a crosslinking agent used to form a gate insulating layer in Preparation Examples 1 to 3 was washed three times with pure water, subjected to ultrafiltration treatment, and then purified using an ion exchange resin, and the resultant was used for the formation of a gate insulating layer.

[Measurement of Specific Metal and Specific Non-Metal Ionic Material Contents in Gate Insulating Layer]

The content of specific metals in the gate insulating layer was determined by subjecting a polymer or a mixture of a polymer and a crosslinking agent used for the formation of a gate insulating layer (the above-described one obtained after washing once with pure water and then drying, or the above-described one obtained after subjecting to purification treatment) to ashing, acid dissolution, and then quantification using ICP-MS HP7700 (manufactured by Agilent). In other words, the content of specific metals in the gate insulating layer is a content of specific metals in solids of a polymer or a mixture of a polymer and a crosslinking agent used for the formation of a gate insulating layer.

The content of specific non-metal ionic materials in the gate insulating layer was determined by dissolving a polymer or a mixture of a polymer and a crosslinking agent used for the formation of a gate insulating layer (the above-described one obtained after washing once with pure water and then drying, or the above-described one obtained after subjecting to purification treatment) in an organic solvent, followed by liquid separation with ultrapure water, and analyzing the water phase by a gradient method using an ICS-2000 Model IC device (manufactured by Dionex Corporation). In other words, the content of specific non-metal ionic materials in the gate insulating layer is a content of specific non-metal ionic materials in solids of a polymer or a mixture of a polymer and a crosslinking agent used for the formation of a gate insulating layer.

For the bottom gate type TFTs of Examples 1 to 3 and Comparative Examples 1 to 3, the measurement results of specific metals and specific non-metal ionic materials in the gate insulating layer are shown in Table 1 below. In addition, metals or non-metal ionic materials falling below the detection limit in Table 1 are not considered in the calculation of the total amount.

TABLE 1

| | Example 1 | Comparative Example 1 | Example 2 | Comparative Example 2 | Example 3 | Comparative Example 3 |
|---|---|---|---|---|---|---|
| | Polyvinylphenol (crosslinked) | | Polyvinylphenol (non-crosslinked) | | Polysilsesquioxane | |
| | Pure water washing, once ↓ Drying | Pure water washing, three times ↓ Ultrafiltration ↓ Ion exchange | Pure water washing, once ↓ Drying | Pure water washing, three times ↓ Ultrafiltration ↓ Ion exchange | Pure water washing, once ↓ Drying | Pure water washing, three times ↓ Ultrafiltration ↓ Ion exchange |
| Mg | 3 ppb | 1 ppb | 2 ppb | 1 ppb | 4 ppb | 1 ppb |
| Ca | 10 ppb | 1 ppb | 2 ppb | 2 ppb | 13 ppb | 2 ppb |
| Ba | 1 ppb | Below detection limit | 1 ppb | Below detection limit | 1 ppb | Below detection limit |
| Al | 2 ppb | Below detection limit | Below detection limit | 1 ppb | 3 ppb | Below detection limit |
| Sn | Below detection limit | Below detection limit | Below detection limit | Below detection limit | Below detection limit | Below detection limit |
| Pb | Below detection limit | Below detection limit | Below detection limit | Below detection limit | Below detection limit | Below detection limit |
| Cr | 10 ppb | 2 ppb | 3 ppb | 2 ppb | 11 ppb | 1 ppb |
| Mn | Below detection limit | Below detection limit | Below detection limit | Below detection limit | Below detection limit | Below detection limit |
| Fe | 12 ppb | 3 ppb | 5 ppb | 2 ppb | 12 ppb | 3 ppb |
| Ni | Below detection limit | Below detection limit | Below detection limit | Below detection limit | Below detection limit | Below detection limit |
| Cu | Below detection limit | Below detection limit | Below detection limit | Below detection limit | Below detection limit | Below detection limit |
| Zn | 3 ppb | 2 ppb | 2 ppb | 1 ppb | 10 ppb | 2 ppb |
| Ag | Below detection limit | Below detection limit | Below detection limit | Below detection limit | Below detection limit | Below detection limit |
| Total amount of specific metals | 41 ppb | 9 ppb | 15 ppb | 9 ppb | 54 ppb | 9 ppb |
| Chlorine ions | 20 ppm | Below detection limit | 4 ppb | Below detection limit | 6 ppm | Below detection limit |
| Bromine ions | 1 ppm | Below detection limit | Below detection limit | Below detection limit | 1 ppm | Below detection limit |
| Sulfate ions | 10 ppm | Below detection limit | 3 ppm | Below detection limit | 2 ppm | Below detection limit |
| Nitrate ions | 1 ppm | Below detection limit | Below detection limit | Below detection limit | 1 ppm | Below detection limit |
| Phosphate ions | 2 ppm | Below detection limit | Below detection limit | Below detection limit | 1 ppm | Below detection limit |
| Total amount of specific non-metallic ions | 34 ppm | Below detection limit | 7 ppm | Below detection limit | 11 ppm | Below detection limit |

Test Example 1

Evaluation of Insulating Properties of Gate Insulating Layer (Measurement of Volume Resistivity)
The gate insulating layer was formed in exactly the same manner as Examples 1 to 3 and Comparative Examples 1 to 3 above, and a gold electrode having a thickness of 100 nm was formed thereon by vacuum deposition. Using the resulting structure as a sample, the volume resistivity (Ω·cm) was measured by a SOURCE MEASURE UNIT 237 (manufactured by Keithley Co.).

Test Example 2

Evaluation of Insulating Properties of Gate Insulating Layer (Measurement of Specific Permittivity)
The gate insulating layer was formed in exactly the same manner as Examples 1 to 3 and Comparative Examples 1 to 3 above, and a gold electrode having a thickness of 100 nm was formed thereon by vacuum deposition. Using the resulting structure as a sample, the specific permittivity was measured by a dielectric measurement system Model 126096W (manufactured by Solartron Co., Ltd.).

Test Example 3

Evaluation of TFT Performance

For the bottom-gate TFTs obtained in Examples 1 to 3 and Comparative Examples 1 to 3, the performance of TFTs was examined by evaluating a threshold voltage, a carrier mobility, and an On/Off ratio according to the following method.

(Measurement of Threshold Voltage) A voltage of −40 V was applied between the source electrode and the drain electrode, and a gate voltage was varied within the range of 40 V to −40 V to measure a threshold voltage.

(Evaluation of Carrier Mobility)
A voltage of −40 V was applied between the source electrode and the drain electrode, and a gate voltage was varied within the range of 40 V to −40 V to calculate carrier mobility μ using the following equation expressing drain current Id.

$$Id = (w/2L)\mu Ci(Vg-Vth)^2$$

(in which L is a gate length, w is a gate width, Ci is capacitance per unit area of an insulating layer. Vg is a gate voltage, and Vth is a threshold voltage)

(Evaluation Standard of On/Off Ratio)

The (maximum value of |Id|)/(minimum value of |Id|) when fixing the voltage applied between the source electrode and the drain electrode to −40 V and sweeping Vg from 40 V to −40 V was taken as the On/Off ratio.

The results are shown in Table 2 below.

form a film so as to cover the substrate 6, source electrode 3, and drain electrode 4. In this manner, an organic semiconductor layer having a thickness of 150 nm was formed.

Subsequently, a gate insulating layer was formed so as to cover the organic semiconductor layer. More specifically, 6.3 g of a commercially available poly(4-vinylphenol) and 2.7 g of 2,2-bis(3,5-dihydroxymethyl-4-hydroxy)propane as a crosslinking agent were completely dissolved in 91 g of a mixed solvent of 1-butanol/ethanol=1/1 at room tempera-

TABLE 2

| | Volume | | Semiconductor: TIPS-peniacene | | | Semiconductor: C8-BTBT | | |
|---|---|---|---|---|---|---|---|---|
| | resistivity ($\Omega \cdot cm$) | Specific permittivity | Threshold voltage (V) | Mobility $\mu$ ($cm^2/Vs$) | On/Off ratio | Threshold voltage (V) | Mobility $\mu$ ($cm^2/Vs$) | On/Off ratio |
| Example 1 | $3 \times 10^{16}$ | 3.9 | 5.3 | 0.10 | $1 \times 10^6$ | 5.5 | 0.12 | $6 \times 10^5$ |
| Comparative Example 1 | $3 \times 10^{16}$ | 3.7 | 5.5 | 0.09 | $8 \times 10^5$ | 5.7 | 0.11 | $4 \times 10^5$ |
| Example 2 | $4 \times 10^{16}$ | 3.6 | 5.8 | 0.10 | $9 \times 10^5$ | 6.0 | 0.11 | $6 \times 10^5$ |
| Comparative Example 2 | $4 \times 10^{16}$ | 3.5 | 6.0 | 0.09 | $7 \times 10^5$ | 6.2 | 0.10 | $4 \times 10^5$ |
| Example 3 | $2 \times 10^{16}$ | 4.0 | 5.1 | 0.12 | $8 \times 10^5$ | 5.2 | 0.13 | $6 \times 10^5$ |
| Comparative Example 3 | $2 \times 10^{16}$ | 3.9 | 5.3 | 0.11 | $6 \times 10^5$ | 5.4 | 0.12 | $5 \times 10^5$ |

| | Semiconductor: L9 | | | Semiconductor: C16 | | |
|---|---|---|---|---|---|---|
| | Threshold voltage (V) | Mobility $\mu$ ($cm^2/Vs$) | On/Off ratio | Threshold voltage (V) | Mobility $\mu$ ($cm^2/Vs$) | On/Off ratio |
| Example 1 | 5.0 | 0.30 | $1 \times 10^6$ | 5.2 | 0.50 | $4 \times 10^6$ |
| Comparative Example 1 | 5.2 | 0.27 | $1 \times 10^6$ | 5.4 | 0.45 | $2 \times 10^6$ |
| Example 2 | 5.4 | 0.27 | $3 \times 10^6$ | 5.5 | 0.50 | $4 \times 10^6$ |
| Comparative Example 2 | 5.6 | 0.25 | $1 \times 10^6$ | 5.7 | 0.45 | $2 \times 10^6$ |
| Example 3 | 5.0 | 0.30 | $2 \times 10^6$ | 5.2 | 0.45 | $3 \times 10^6$ |
| Comparative Example 3 | 5.2 | 0.27 | $1 \times 10^6$ | 5.4 | 0.40 | $2 \times 10^6$ |

TFTs shown in FIG. 1A were each prepared in the same manner as in Example 1, except that the above-described A26, A27, C1, C4, C7, D1, E2, F2, F5, F10, G12, G14, H10, H11, J2, J3, K2, K3, L2, L5, L6, L8, L15, M8, N4, P3, Q3, R1, S1, or T1 was used as an organic semiconductor in Example 1.

For each of TFTs thus prepared, carrier mobility $\mu$, On/Off ratio, and threshold voltage Vth were evaluated in the same manner as in Test Example 3. As a result, similar to Example 1, all of TFTs exhibited superior performance when compared to those whose amounts of specific metals and non-metal ionic materials in the gate insulating layer are outside the range defined in the present invention.

Preparation Example 4

Preparation-1 of Top Gate Type TFT

A top gate-bottom contact type TFT shown in FIG. 1C was prepared. A glass substrate (OA 10, manufactured by NEC Corning Inc.) which had been washed with water and dried was used as a substrate 6. Chromium/gold electrodes as a source electrode and a drain electrode were formed on the glass substrate using a mask by vacuum evaporation. In this manner, the source electrode 3 and the drain electrode 4 each having a thickness of 100 nm were provided. The gate width W was set to 100 mm, and the gate length L was set to 100 μm.

A solution of 5 mg of an organic semiconductor described in Table 2 dissolved in 1 mL of toluene was spin-coated to ture. This solution was filtered through a PTFE membrane filter of (φ0.2 μm. A diphenyliodonium hexafluorophosphate salt as an acid catalyst was added to a 0.1 wt % in the resulting filtrate which was then applied onto the organic semiconductor layer and dried to form a film. Thereafter, the formed film was heated to 100° C. to form a crosslinked structure, thereby forming a gate insulating layer 2 having a thickness of 0.7 μm.

Subsequently, an aqueous dispersion of Ag fine particles was applied onto the gate insulating layer by an ink jet method, and dried to form a gate electrode having a thickness of 200 nm.

Preparation Example 5

Preparation-2 of Top Gate Type TFT

A TFT was prepared in the same manner as in Preparation Example 4, except that a crosslinking agent and an acid catalyst were not added when forming a gate insulating layer in Preparation Example 4 above.

Preparation Example 6

Preparation-3 of Top Gate Type TFT

A TFT was prepared in the same manner as in Preparation Example 4, except that a commercially available polysilsesquioxane was used in place of poly(4-vinylphenol), tetrahydrofuran was used as a solvent, and a crosslinking agent and an acid catalyst were not added when forming a gate insulating layer in Preparation Example 4 above.

[Adjustment of Specific Metal and Specific Non-Metal Ionic Material Contents in Gate Insulating Layer]

TFTs of Examples 4 to 6 and Comparative Examples 4 to 6 were obtained according to the above-described Preparation Examples 4 to 6. More specifically, with respect to TFTs of the following Examples 4 to 6, a polymer or a mixture of a polymer and a crosslinking agent used to form a gate insulating layer in Preparation Examples 4 to 6 was washed once with pure water and dried, and the resultant was used for the formation of a gate insulating layer. Further, with respect to TFTs of the following Comparative Examples 4 to 6, a polymer or a mixture of a polymer and a crosslinking agent used to form a gate insulating layer in Preparation Examples 4 to 6 was washed three times with pure water, subjected to ultrafiltration treatment, and then purified using an ion exchange resin, and the resultant was used for the formation of a gate insulating layer.

[Measurement of Specific Metal and Specific Non-Metal Ionic Material Contents in Gate Insulating Layer]

For top gate type TFTs of Examples 4 to 6 and Comparative Examples 4 to 6, amounts of specific metals and specific non-metal ionic materials in the gate insulating layer were measured in the same manner as in the case of the above-described bottom gate type TFTs. The results are shown in Table 3 below.

TABLE 3

|  | Example 4 | Comparative Example 4 | Example 5 | Comparative Example 5 | Example 6 | Comparative Example 6 |
|---|---|---|---|---|---|---|
|  | Polyvinylphenol (crosslinked) | | Polyvinylphenol (non-crosslinked) | | Polysilsesquioxane | |
|  | Pure water washing, once ↓ Drying | Pure water washing, three times ↓ Ultrafiltration ↓ Ion exchange | Pure water washing, once ↓ Drying | Pure water washing, three times ↓ Ultrafiltration ↓ Ion exchange | Pure water washing, once ↓ Drying | Pure water washing, three times ↓ Ultrafiltration ↓ Ion exchange |
| Mg | 3 ppb | 1 ppb | 2 ppb | 1 ppb | 4 ppb | 1 ppb |
| Ca | 10 ppb | 1 ppb | 2 ppb | 2 ppb | 13 ppb | 2 ppb |
| Ba | 1 ppb | Below detection limit | 1 ppb | Below detection limit | 1 ppb | Below detection limit |
| Al | 2 ppb | Below detection limit | Below detection limit | 1 ppb | 3 ppb | Below detection limit |
| Sn | Below detection limit | Below detection limit | Below detection limit | Below detection limit | Below detection limit | Below detection limit |
| Pb | Below detection limit | Below detection limit | Below detection limit | Below detection limit | Below detection limit | Below detection limit |
| Cr | 10 ppb | 2 ppb | 3 ppb | 2 ppb | 11 ppb | 1 ppb |
| Mn | Below detection limit | Below detection limit | Below detection limit | Below detection limit | Below detection limit | Below detection limit |
| Fe | 12 ppb | 3 ppb | 5 ppb | 2 ppb | 12 ppb | 3 ppb |
| Ni | Below detection limit | Below detection limit | Below detection limit | Below detection limit | Below detection limit | Below detection limit |
| Cu | Below detection limit | Below detection limit | Below detection limit | Below detection limit | Below detection limit | Below detection limit |
| Zn | 3 ppb | 2 ppb | 2 ppb | 1 ppb | 10 ppb | 2 ppb |
| Ag | Below detection limit | Below detection limit | Below detection limit | Below detection limit | Below detection limit | Below detection limit |
| Total amount of specific metals | 41 ppb | 9 ppb | 15 ppb | 9 ppb | 54 ppb | 9 ppb |
| Chlorine ions | 20 ppm | Below detection limit | 4 ppb | Below detection limit | 6 ppm | Below detection limit |
| Bromine ions | 1 ppm | Below detection limit | Below detection limit | Below detection limit | 1 ppm | Below detection limit |
| Sulfate ions | 10 ppm | Below detection limit | 3 ppm | Below detection limit | 2 ppm | Below detection limit |
| Nitrate ions | 1 ppm | Below detection limit | Below detection limit | Below detection limit | 1 ppm | Below detection limit |
| Phosphate ions | 2 ppm | Below detection limit | Below detection limit | Below detection limit | 1 ppm | Below detection limit |
| Total amount of specific non-metallic ions | 34 ppm | Below detection limit | 7 ppm | Below detection limit | 11 ppm | Below detection limit |

For top gate type TFTs of Examples 4 to 6 and Comparative Examples 4 to 6 above, insulating properties of the gate insulating layer and performance of TFTs were evaluated in the same manner as in Test Examples 1 to 3 above. The results are shown in Table 4 below.

TABLE 4

| | Volume resistivity (Ω·cm) | Specific permittivity | Semiconductor: TIPS-pentacene | | | Semiconductor: C8-BTBT | | |
|---|---|---|---|---|---|---|---|---|
| | | | Threshold voltage (V) | Mobility μ (cm$^2$/Vs) | On/Off ratio | Threshold voltage (V) | Mobility μ (cm$^2$/Vs) | On/Off ratio |
| Example 4 | $3 \times 10^{16}$ | 3.9 | 5.5 | 0.09 | $9 \times 10^5$ | 5.8 | 0.11 | $6 \times 10^5$ |
| Comparative Example 4 | $3 \times 10^{16}$ | 3.7 | 5.7 | 0.08 | $7 \times 10^5$ | 6.0 | 0.10 | $4 \times 10^5$ |
| Example 5 | $4 \times 10^{16}$ | 3.6 | 6.0 | 0.09 | $8 \times 10^5$ | 6.2 | 0.10 | $5 \times 10^5$ |
| Comparative Example 5 | $4 \times 10^{16}$ | 3.5 | 6.2 | 0.08 | $6 \times 10^5$ | 6.4 | 0.09 | $3 \times 10^5$ |
| Example 6 | $2 \times 10^{16}$ | 4.0 | 5.3 | 0.10 | $7 \times 10^5$ | 5.6 | 0.11 | $5 \times 10^5$ |
| Comparative Example 6 | $2 \times 10^{16}$ | 3.9 | 5.5 | 0.09 | $5 \times 10^5$ | 5.8 | 0.10 | $3 \times 10^5$ |

| | Semiconductor: L9 | | | Semiconductor: C16 | | |
|---|---|---|---|---|---|---|
| | Threshold voltage (V) | Mobility μ (cm$^2$/Vs) | On/Off ratio | Threshold voltage (V) | Mobility μ (cm$^2$/Vs) | On/Off ratio |
| Example 4 | 5.2 | 0.27 | $1 \times 10^5$ | 5.4 | 0.45 | $3 \times 10^6$ |
| Comparative Example 4 | 5.4 | 0.25 | $8 \times 10^6$ | 5.6 | 0.40 | $1 \times 10^6$ |
| Example 5 | 5.6 | 0.25 | $1 \times 10^6$ | 5.6 | 0.45 | $3 \times 10^6$ |
| Comparative Example 5 | 5.8 | 0.23 | $8 \times 10^5$ | 5.8 | 0.40 | $1 \times 10^6$ |
| Example 6 | 5.3 | 0.27 | $9 \times 10^5$ | 5.4 | 0.45 | $2 \times 10^6$ |
| Comparative Example 6 | 5.5 | 0.25 | $7 \times 10^6$ | 5.6 | 0.40 | $9 \times 10^5$ |

TFTs shown in FIG. 1C were each prepared in the same manner as in Example 4, except that the above-described A26, A27, C1, C4, C7, D1, E2, F2, F5, F10, G12, G14, H10, H11, J2, J3, K2, K3, L2, L5, L6, L8, L15, M8, N4, P3, Q3, R1, S1, or T1 was used as an organic semiconductor in Example 4.

For each of TFTs thus prepared, carrier mobility μ, On/Off ratio, and threshold voltage Vth were evaluated in the same manner as in Test Example 3. As a result, similar to Example 4, all of TFTs exhibited superior performance when compared to those whose amounts of specific metals and non-metal ionic materials in the gate insulating layer are outside the range defined in the present invention.

From the above-described results, the gate insulating layer whose content of specific metals and specific non-metal ionic materials is within the range defined in the present invention exhibited increased specific permittivity while maintaining insulating properties (volume resistivity). Thus, the threshold voltage of TFTs could be lowered. Furthermore, it could be seen that TFTs having the gate insulating layer defined in the present invention exhibit higher values of both carrier mobility and On/Off ratio, when compared with TFTs of Comparative Examples where the content of specific metals and specific non-metal ionic materials in the gate insulating layer is lower than the content defined in the present invention. That is, the TFT of the present invention was shown to be a TFT which achieves both of excellent carrier mobility and having an excellent current amplification factor and also has a low threshold voltage to thereby reduce power consumption of the TFT.

While the invention has been described in conjunction with embodiments thereof, the inventors have no intention of limiting any detail of the explanation of the invention unless specifically defined and consider that the invention should be construed broadly without going against the spirit and scope of the invention indicated by the scope of the appended Claims.

EXPLANATION OF REFERENCES

1 Semiconductor layer
2 Gate insulating layer
3 Source electrode
4 Drain electrode
5 Gate electrode
6 Substrate

What is claimed is:

1. A thin film transistor, comprising:
a gate electrode:
a semiconductor layer;
a gate insulating layer provided between the gate electrode and the semiconductor layer and formed of an organic polymer compound; and
a source electrode and a drain electrode provided in contact with the semiconductor layer and connected via the semiconductor layer, on a substrate, wherein
in the gate insulating layer, the content of metals selected from Mg, Ca, Ba, Al, Sn, Pb, Cr, Mn, Fe, Ni, Cu, Zn, and Ag is 12 ppb to 100 ppb in terms of total amount, and the content of non-metal ionic materials selected from halogen ions, sulfate ions, nitrate ions, and phosphate ions is 3 ppm to 50 ppm in terms of total amount.

2. The thin film transistor according to claim 1, wherein the content of metals selected from Mg, Ca, Al, Cr, Fe, and Zn in the gate insulating layer is 13 ppb to 70 ppb in terms of total amount.

3. The thin film transistor according to claim 1, wherein the content of non-metal ionic materials selected from chlorine ions, sulfate ions, nitrate ions, and phosphate ions in the gate insulating layer is 5 ppm to 40 ppm in terms of total amount.

4. The thin film transistor according to claim 1, wherein the content of non-metal ionic materials selected from chlorine ions and sulfate ions in the gate insulating layer is 5 ppm to 40 ppm in terms of total amount.

5. The thin film transistor according to claim 1, wherein the organic polymer compound is an organic polymer compound selected from polyvinylphenol, a novolak resin, polystyrene, poly(meth)acrylate, an epoxy resin, an epoxy(meth)acrylate resin, polyvinyl alcohol, a fluororesin, polycycloolefin, polysilsesquioxane, polysiloxane, polyester, polyether sulfone, polyether ketone, and polyimide.

6. The thin film transistor according to claim 1, wherein the semiconductor layer includes an organic semiconductor.

7. The thin film transistor according to claim 6, wherein the organic semiconductor is represented by any one of the following General Formulae (C) to (T), General Formula (C)

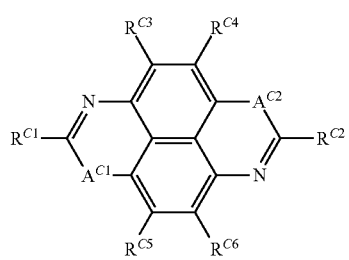

General Formula (D)

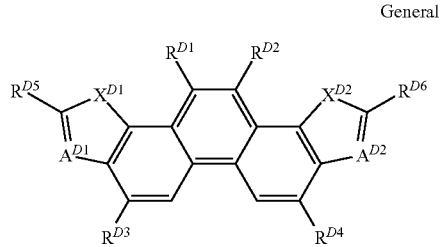

General Formula (E)

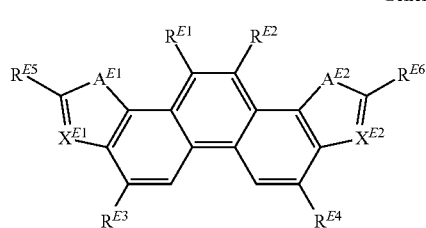

General Formula (F)

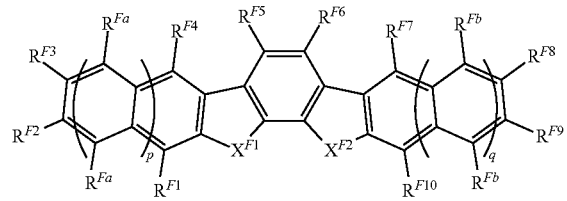

General Formula (G)

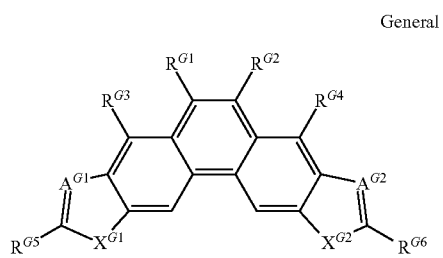

General Formula (H)

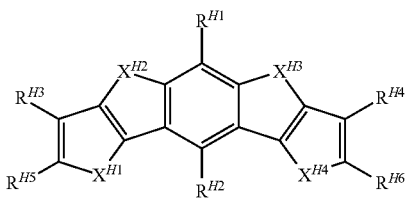

General Formula (J)

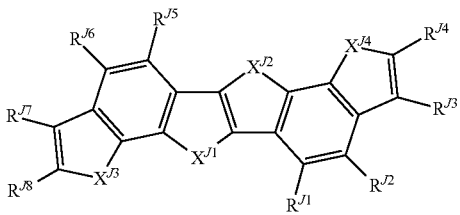

General Formula (K)

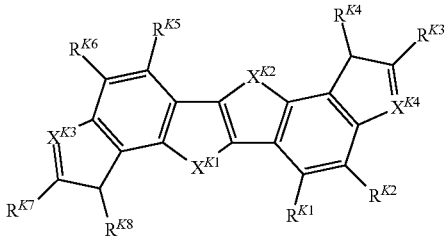

General Formula (L)

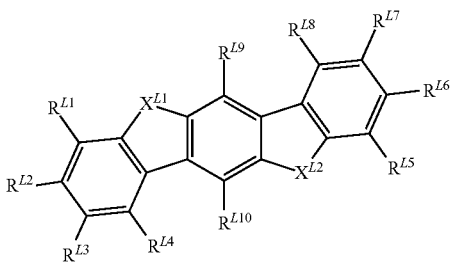

General Formula (M)

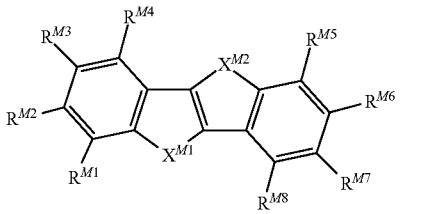

General Formula (N)

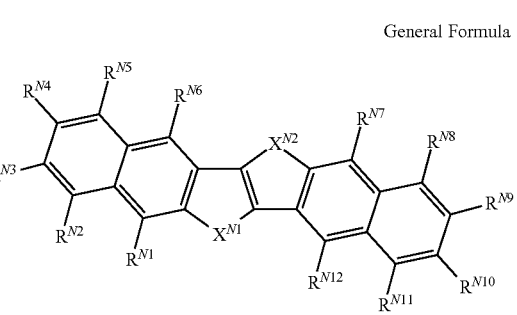

-continued

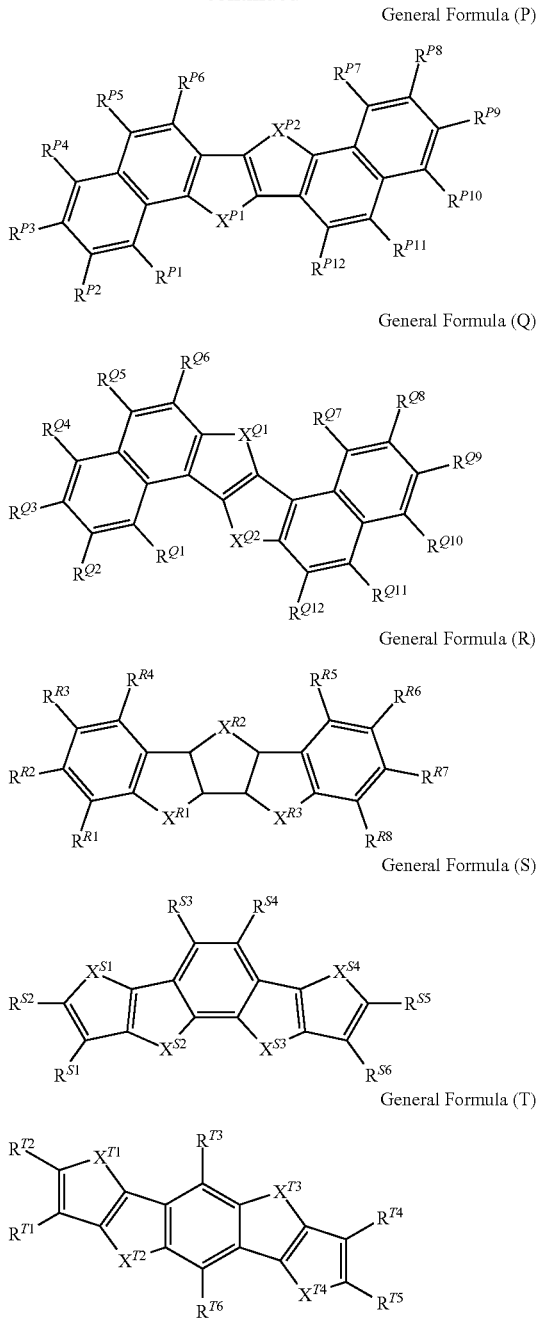

General Formula (P)

General Formula (Q)

General Formula (R)

General Formula (S)

General Formula (T)

wherein in General Formula (C), $A^{C1}$ and $A^{C2}$ represent an oxygen atom, a sulfur atom, or a selenium atom, $R^{C1}$ to $R^{C6}$ represent a hydrogen atom or a substituent, and at least one of $R^{C1}$, $R^{C2}$, $R^{C3}$, $R^{C4}$, $R^{C5}$, or $R^{C6}$ is substituent represented by the following General Formula (W), in General Formula (D), $X^{D1}$ and $X^{D2}$ represent $NR^{D9}$, an oxygen atom, or a sulfur atom, $A^{D1}$ represents $CR^{D7}$ or a nitrogen atom, $A^{D2}$ represents $CR^{D8}$ or a nitrogen atom, and $R^{D9}$ represents a hydrogen atom, an alkyl group, an alkenyl group, an alkynyl group, or an acyl group, $R^{D1}$ to $R^{D8}$ represents a hydrogen atom or a substituent, and at least one of $R^{D1}$, $R^{D2}$, $R^{D3}$, $R^{D4}$, $R^{D5}$, $R^{D6}$, $R^{D7}$, or $R^{D8}$ is a substituent represented by the following General Formula (W), in General Formula (E), $X^{E1}$ and $X^{E2}$ represent an oxygen atom, a sulfur atom, or $NR^{E7}$, $A^{E1}$ and $A^{E2}$ represent $CR^{E8}$ or a nitrogen atom, $R^{E1}$ to $R^{E8}$ represent a hydrogen atom or a substituent, and at least on of $R^{E1}$, $R^{E2}$, $R^{E3}$, $R^{E4}$, $R^{E5}$, $R^{E6}$, $R^{E7}$, or $R^{E8}$ is a substituent represented by the following General Formula (W), in General Formula (F), $X^{F1}$ and $X^{F2}$ represent an oxygen atom, a sulfur atom, or a selenium atom, $R^{F1}$ to $R^{F10}$, $R^{Fa}$, and $R^{Fb}$ represent a hydrogen atom or a substituent, at least one of $R^{F1}$ to $R^{F10}$, $R^{Fa}$, or $R^{Fb}$ is a substituent represented by General Formula (W), and p and q represent an integer of 0 to 2, in General Formula (G), $X^{G1}$ and $X^{G2}$ represent $NR^{G9}$, an oxygen atom, or a sulfur atom, $A^{G1}$ represents $CR^{G7}$ or a nitrogen atom, $A^{G2}$ represents $CR^{G8}$ or a nitrogen atom, $R^{G9}$ represents a hydrogen atom, an alkyl group, an alkenyl group, an alkynyl group, an acyl group, an aryl group, or a heteroaryl group, $R^{G1}$ to $R^{G8}$ represent a hydrogen atom or a substituent, and at least one of $R^{G1}$, $R^{G2}$, $R^{G3}$, $R^{G4}$, $R^{G5}$, $R^{G6}$, $R^{G7}$, or $R^{G8}$ is a substituent represented by the following General Formula (W), in General Formula (H), $X^{H1}$ to $X^{H4}$ represent $NR^{H7}$, an oxygen atom, or a sulfur atom, $R^{H7}$ represents a hydrogen atom, an alkyl group, an alkenyl group, an alkynyl group, an acyl group, an aryl group, or a heteroaryl group, $R^{H1}$ to $R^{H6}$ represent a hydrogen atom or a substituent, and at least one of $R^{H1}$, $R^{H2}$, $R^{H3}$, $R^{H4}$, $R^{H5}$, or $R^{H6}$ is a substituent represented by the following General Formula (W), in General Formula (J), $X^{J1}$ and $X^{J2}$ represent an oxygen atom, a sulfur atom, a selenium atom, or $NR^{J9}$, $X^{J3}$ and $X^{J4}$ represent an oxygen atom, a sulfur atom, or a selenium atom, $R^{J1}$ to $R^{J9}$ represent a hydrogen atom or a substituent, and at least one of $R^{J1}$, $R^{J2}$, $R^{J3}$, $R^{J4}$, $R^{J5}$, $R^{J6}$, $R^{J7}$, $R^{J8}$, or $R^{J9}$ is a substituent represented by the following General Formula (W), in General Formula (K), $X^{K1}$ and $X^{K2}$ represent an oxygen atom, a sulfur atom, a selenium atom, or $NR^{K9}$, $X^{K3}$ and $X^{K4}$ represent an oxygen atom, a sulfur atom, or a selenium atom, $R^{K1}$ to $R^{K9}$ represent a hydrogen atom or a substituent, and at least one of $R^{K1}$, $R^{K2}$, $R^{K3}$, $R^{K4}$, $R^{K5}$, $R^{K6}$, $R^{K7}$, $R^{K8}$, or $R^{K9}$ is a substituent represented by the following General Formula (W), in General Formula (L), $X^{L1}$ and $X^{L2}$ represent an oxygen atom, a sulfur atom, or $NR^{L1}$, $R^{L1}$ to $R^{L11}$ represent a hydrogen atom or a substituent, and at least one of $R^{L1}$, $R^{L2}$, $R^{L3}$, $R^{L4}$, $R^{L5}$, $R^{L6}$, $R^{L7}$, $R^{L8}$, $R^{L9}$, $R^{L10}$, or $R^{L11}$ is a substituent represented by the following General Formula (W), in General Formula (M), $X^{M1}$ and $X^{M2}$ represent an oxygen atom, a sulfur atom, a selenium atom, or $NR^{M9}$, $R^{M1}$ to $R^{M9}$ represent a hydrogen atom or a substituent, and at least one of $R^{M1}$, $R^{M2}$, $R^{M3}$, $R^{M4}$, $R^{M5}$, $R^{M6}$, $R^{M7}$, $R^{M8}$, or $R^{M9}$ is a substituent represented by the following General Formula (W), in General Formula (N), $X^{N1}$ and $X^{N2}$ represent an oxygen atom, a sulfur atom, a selenium atom, or $NR^{N13}$, $R^{N1}$ to $R^{N13}$ represent a hydrogen atom or a substituent, and at least one of $R^{N1}$, $R^{N2}$, $R^{N3}$, $R^{N4}$, $R^{N5}$, $R^{N6}$, $R^{N7}$, $R^{N8}$, $R^{N9}$, $R^{N10}$, $R^{N11}$, $R^{N12}$, or $R^{N13}$ is a substituent represented by the following General Formula (W), in General Formula (P), $X^{P1}$ and $X^{P2}$ represent an oxygen atom, a sulfur atom, a selenium atom, or $NR^{P13}$, $R^{P1}$ to $R^{P13}$ represent a hydrogen atom or a substituent, and at least one of $R^{P1}$, $R^{P2}$, $R^{P3}$, $R^{P4}$, $R^{P5}$, $R^{P6}$, $R^{P7}$, $R^{P8}$, $R^{P9}$, $R^{P10}$, $R^{P11}$, $R^{P12}$, or $R^{P13}$ is a substituent represented by the following General Formula (W), in General Formula (Q), $X^{Q1}$ and $X^{Q2}$ represent an oxygen atom, a sulfur atom, a selenium atom, or $NR^{Q13}$, $R^{Q1}$ to $R^{Q13}$ represent a hydrogen atom or a substituent, and at least one of $R^{Q1}$, $R^{Q2}$, $R^{Q3}$, $R^{Q4}$, $R^{Q5}$, $R^{Q6}$, $R^{Q7}$, $R^{Q8}$, $R^{Q9}$, $R^{Q10}$, $R^{Q11}$, $R^{Q12}$, or $R^{Q13}$ is a substituent represented by the following General Formula (W), in General Formula (R), $X^{R1}$, $X^{R2}$, and $X^{R3}$ represent an oxygen atom, a sulfur atom, a selenium atom, or $NR^{R9}$, $R^{R1}$ to $R^{R9}$ represent a hydrogen atom or a substituent, and at least one of $R^{R1}$, $R^{R2}$, $R^{R3}$, $R^{R4}$, $R^{R5}$, $R^{R6}$, $R^{R7}$, $R^{R8}$, or $R^{R9}$ is a substituent represented by the following General Formula (W), in General Formula (S), $X^{S1}$, $X^{S2}$, $X^{S3}$, and $X^{S4}$ represent an oxygen atom, a sulfur atom, a selenium atom, or $NR^{S7}$, $R^{S1}$ to $R^{S7}$ represent a hydrogen atom or a substituent, and at least one of $R^{S1}$, $R^{S2}$, $R^{S3}$, $R^{S4}$, $R^{S5}$, $R^{S6}$, or $R^{S7}$ is a substituent represented by the following General Formula (W), and in General Formula (T), $X^{T1}$, $X^{T2}$, $X^{T3}$, and $X^{T4}$ represent an oxygen atom, a sulfur atom, a selenium atom, or $NR^{T7}$, $R^{T1}$ to $R^{T7}$ represent a hydrogen atom or a substituent, and at least one of $R^{T1}$, $R^{T2}$, $R^{T3}$, $R^{T4}$, $R^{T5}$, $R^{T6}$, or $R^{T77}$ is a substituent represented by the following General Formula (W), -L-R$^w$                                         General Formula (W):

wherein in General Formula (W), L represents a divalent linking group represented by any one of the following General Formulae (L-1) to (L-25) or a divalent linking group in which two or more divalent linking groups represented by any one of the following General Formulae (L-1) to (L-25) are bonded to each other, and R$^w$ represents a substituted or unsubstituted alkyl group, a cyano group, a vinyl group, an ethynyl group, an oxyethylene group, an oligooxyethylene group in which the number v of repeats of oxyethylene units is 2 or more, a siloxane group, an oligosiloxane group in which the number of silicon atoms is 2 or more, or a substituted or unsubstituted trialkylsilyl group, and

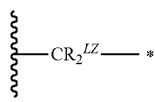
(L-1)

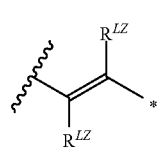
(L-2)

(L-3)

(L-4)

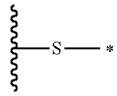
(L-5)

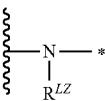
(L-6)

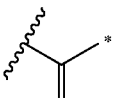
(L-7)

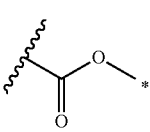
(L-8)

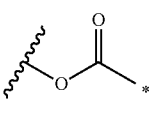
(L-9)

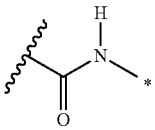
(L-10)

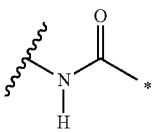
(L-11)

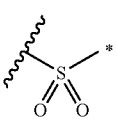
(L-12)

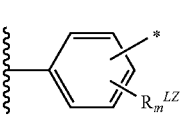
(L-13)

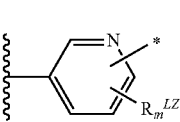
(L-14)

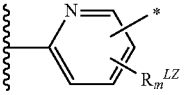
(L-15)

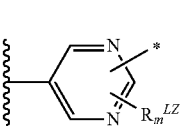
(L-16)

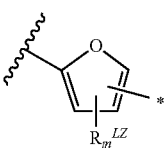
(L-17)

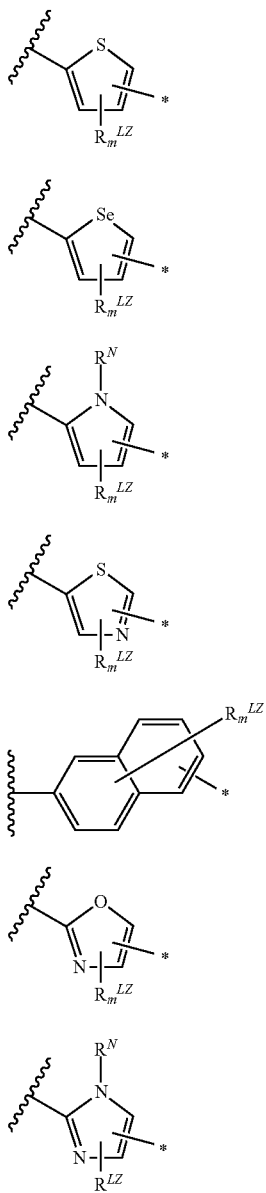

(L-18)

(L-19)

(L-20)

(L-21)

(L-22)

(L-23)

(L-24)

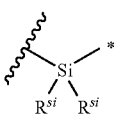

(L-25)

wherein in General Formulae (L-1) to (L-25), the wavy line portion indicates a position of bonding to any one of the rings forming each skeleton represented by the above-described General Formulae (C) to (T), and * indicates a position of connecting with $R^w$ or a position of bonding to the wavy line portion of General Formulae (L-1) to (L-25), m in General Formula (L-13) represents 4, m in General Formulae (L-14) and (L-15) represents 3, m in General Formulae (L-16) to (L-20) represents 2, and m in General Formula (L-22) represents 6, $R^{LZ}$'s in General Formulae (L-1), (L-2), (L-6), (L-13) to (L-19), and (L-21) to (L-24) each independently represent a hydrogen atom or a substituent, and $R^N$ represents a hydrogen atom or a substituent, and $R^{si}$'s each independently represent a hydrogen atom, an alkyl group, an alkenyl group, or an alkynyl group.

8. The thin film transistor according to claim 7, wherein the organic semiconductor is represented by any one of General Formulae (C), (F), (J), and (L).

9. A thin film transistor, comprising:
a gate electrode;
a semiconductor layer;
a gate insulating layer provided between the gate electrode and the semiconductor layer and formed of an organic polymer compound; and
a source electrode and a drain electrode provided in contact with the semiconductor layer and connected via the semiconductor layer, on a substrate,
wherein, in the gate insulating layer, the content of metals selected from Mg, Ca, Ba, Al, Sn, Pb, Cr, Mn, Fe, Ni, Cu, Zn, and Ag is 12 ppb to 100 ppb in terms of total amount, and the content of non-metal ionic materials selected from halogen ions, sulfate ions, nitrate ions, and phosphate ions is 3 ppm to 50 ppm in terms of total amount, and
the organic polymer compound is an organic polymer compound selected from polyvinylphenol and polysilsesquioxane.

\* \* \* \* \*